US012676107B2

(12) United States Patent
Wang et al.

(10) Patent No.:  US 12,676,107 B2
(45) Date of Patent:  Jul. 7, 2026

(54) DISPLAY PANEL AND DISPLAY DEVICE

(71) Applicants:CHENGDU BOE OPTOELECTRONICS TECHNOLOGY CO., LTD., Chengdu (CN); BOE TECHNOLOGY GROUP CO., LTD., Beijing (CN)

(72) Inventors: Qiwei Wang, Beijing (CN); Bangqing Xiao, Beijing (CN); Yue Long, Beijing (CN); Benlian Wang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 460 days.

(21) Appl. No.: 18/025,962

(22) PCT Filed: Jan. 11, 2022

(86) PCT No.: PCT/CN2022/071427
§ 371 (c)(1),
(2) Date: Mar. 13, 2023

(87) PCT Pub. No.: WO2022/188542
PCT Pub. Date: Sep. 15, 2022

(65) Prior Publication Data
US 2023/0371324 A1     Nov. 16, 2023

(30) Foreign Application Priority Data

Mar. 12, 2021    (WO) ................ PCT/CN2021/080494

(51) Int. Cl.
*G09G 3/3233*       (2016.01)
*G09G 3/3225*       (2016.01)
(Continued)

(52) U.S. Cl.
CPC ......... *G09G 3/3233* (2013.01); *G09G 3/3225* (2013.01); *G09G 3/3275* (2013.01);
(Continued)

(58) Field of Classification Search
CPC ... G09G 2300/0413; G09G 2300/0426; G09G 3/3233; G09G 2310/0272; H10K 59/1213;
(Continued)

(56) References Cited

U.S. PATENT DOCUMENTS 10,733,931 B2    8/2020  Jung et al.
10,756,136 B1    8/2020  Ma et al.
(Continued)

FOREIGN PATENT DOCUMENTS

CN       107610635 A     1/2018
CN       107610645 A     1/2018
(Continued)

OTHER PUBLICATIONS

Nikolay Ryzhenko, "Pin Access-Driven Design Rule Clean and DFM Optimized Routing of Standard Cells under Boolean Constraints", Apr. 17, 2019, International Symposium on Physical Design, San Francisco (Year: 2019).*
(Continued)

*Primary Examiner* — Toan Ton
(74) *Attorney, Agent, or Firm* — Scully, Scott, Murphy & Presser, P.C.

(57) ABSTRACT

Provided are a display panel and a display device. The display panel includes: light-emitting elements and pixel circuits. The pixel circuits include a plurality of groups of pixel circuits; at least one group of pixel circuits includes a plurality of first-type pixel circuits and a plurality of second-type pixel circuits; at least one second-type pixel circuit is connected to at least one second region light-emitting ele-
(Continued)

ment through one conductive line; the conductive lines include a plurality of first conductive wires and a plurality of second conductive wires; and in at least one group of light-emitting elements and at least one group of pixel circuits, a plurality of first pixel circuits connected to a plurality of first light-emitting elements are closer to a second display region than each of a plurality of second pixel circuits connected to a plurality of second light-emitting elements.

20 Claims, 36 Drawing Sheets

(51) Int. Cl.

| | |
|---|---|
| *G09G 3/3275* | (2016.01) |
| *H10K 59/12* | (2023.01) |
| *H10K 59/121* | (2023.01) |
| *H10K 59/131* | (2023.01) |
| *H10K 59/35* | (2023.01) |
| *H10K 59/65* | (2023.01) |
| *H10K 59/88* | (2023.01) |
| *H10K 71/00* | (2023.01) |

(52) U.S. Cl.
CPC ....... *H10K 59/121* (2023.02); *H10K 59/1213* (2023.02); *H10K 59/1216* (2023.02); *H10K 59/131* (2023.02); *H10K 59/351* (2023.02); *H10K 71/621* (2023.02); *G09G 2300/0413* (2013.01); *G09G 2300/0426* (2013.01); *G09G 2300/0819* (2013.01); *G09G 2300/0842* (2013.01); *G09G 2310/0272* (2013.01); *G09G 2310/08* (2013.01); *H10K 59/1201* (2023.02); *H10K 59/353* (2023.02); *H10K 59/65* (2023.02); *H10K 59/88* (2023.02)

(58) Field of Classification Search
CPC .. H10K 59/121; H10K 59/123; H10K 59/131; H10K 59/35
USPC .......................................................... 257/40
See application file for complete search history.

(56) References Cited

U.S. PATENT DOCUMENTS

| | | |
|---|---|---|
| 10,854,124 B2 | 12/2020 | Yang et al. |
| 11,074,856 B2 | 7/2021 | Zhao et al. |
| 11,114,032 B2 | 9/2021 | Bian |
| 11,183,544 B2 | 11/2021 | Zhang |
| 11,227,538 B2 | 1/2022 | Yang et al. |
| 11,847,964 B2 | 12/2023 | Huang et al. |
| 11,862,081 B2 | 1/2024 | Cheng et al. |
| 2009/0179838 A1 | 7/2009 | Yamashita et al. |
| 2019/0004354 A1 | 1/2019 | Hsiao |
| 2020/0052048 A1 | 2/2020 | Kuo et al. |
| 2020/0194532 A1 | 6/2020 | Lee et al. |
| 2021/0012706 A1 | 1/2021 | Yang et al. |
| 2021/0090501 A1 | 3/2021 | Wu et al. |
| 2021/0351255 A1 | 11/2021 | Chang et al. |
| 2021/0408191 A1* | 12/2021 | Zhao .................. H10K 59/1213 |
| 2022/0069047 A1* | 3/2022 | Yang .................... H10K 59/131 |
| 2022/0093682 A1 | 3/2022 | Chang et al. |
| 2022/0102421 A1* | 3/2022 | Yang ................... H10H 20/857 |
| 2022/0123094 A1 | 4/2022 | Qiu et al. |
| 2022/0189394 A1 | 6/2022 | Yang |
| 2022/0199710 A1 | 6/2022 | Xu et al. |
| 2022/0285470 A1 | 9/2022 | Qiu et al. |
| 2022/0293692 A1 | 9/2022 | Xu et al. |

FOREIGN PATENT DOCUMENTS

| | | | | |
|---|---|---|---|---|
| CN | 108365123 A | 8/2018 | | |
| CN | 109904214 A | 6/2019 | | |
| CN | 109950288 A | 6/2019 | | |
| CN | 110061014 A | 7/2019 | | |
| CN | 110232892 A | 9/2019 | | |
| CN | 110265455 A | 9/2019 | | |
| CN | 110459175 A | 11/2019 | | |
| CN | 110767681 A | 2/2020 | | |
| CN | 110874990 A | 3/2020 | | |
| CN | 110890026 A | 3/2020 | | |
| CN | 110969982 A | 4/2020 | | |
| CN | 210245501 U | 4/2020 | | |
| CN | 111180494 A | 5/2020 | | |
| CN | 210515985 U | 5/2020 | | |
| CN | 111261677 A | 6/2020 | | |
| CN | 111261684 A | 6/2020 | | |
| CN | 111402743 A | 7/2020 | | |
| CN | 111446282 A | 7/2020 | | |
| CN | 111508377 A | 8/2020 | | |
| CN | 111710276 A | 9/2020 | | |
| CN | 111725287 A | 9/2020 | | |
| CN | 111785761 A | 10/2020 | | |
| CN | 111916486 A | 11/2020 | | |
| CN | 112186021 A | * | 1/2021 | .......... G09G 3/3225 |
| CN | 112542121 A | 3/2021 | | |
| CN | 111048005 B | 6/2021 | | |
| CN | 113053981 A | 6/2021 | | |
| CN | 113517324 A | 10/2021 | | |
| CN | 111326560 B | 8/2023 | | |
| CN | 114586169 B | 3/2025 | | |
| EP | 3176772 A1 | 6/2017 | | |
| EP | 4075512 A1 | 10/2022 | | |
| JP | 2016001303 A | 1/2016 | | |
| JP | 2018180110 A | 11/2018 | | |
| JP | 2020038758 A | 3/2020 | | |
| WO | 2021147987 A1 | 7/2021 | | |

OTHER PUBLICATIONS

English Translation of Chinese Patent Publication: CN_112186021_A (Year: 2021).*

Office Action dated Feb. 17, 2023 received in U.S. Appl. No. 17/433,292.

Office Action dated Apr. 11, 2023 received in U.S. Appl. No. 17/609,878.

Office Action dated Jun. 4, 2024 received in U.S. Appl. No. 18/385,071.

Office Action dated Aug. 6, 2024 received in U.S. Appl. No. 18/489,382.

* cited by examiner

100

R1　　　　　　R2

30    40

Y

X

DISPLAY PANEL AND DISPLAY DEVICE

CROSS-REFERENCE TO RELATED APPLICATIONS

This patent application is a U.S. National Phase of PCT International Patent Application No. PCT/CN2022/071427, filed on Jan. 11, 2022, which claims priority to PCT International Patent Application No. PCT/CN2021/080494, filed on Mar. 12, 2021, the disclosure of each of which is incorporated herein by reference in its entirety as part of the embodiment of the present disclosure.

TECHNICAL FIELD

At least one embodiment of the present disclosure relates to a display panel and a display device.

BACKGROUND

With the continuous development of display technology, active-matrix organic light-emitting diode (AMOLED) display technology has been more and more used in mobile phones, tablet computers, digital cameras and other display devices due to its advantages such as self-luminescence, wide viewing angle, high contrast, low power consumption, and high response speed.

An under-screen camera technology is a brand-new technology proposed to increase the screen-to-body ratio of a display device.

SUMMARY

At least one embodiment of the present disclosure relates to a display panel and a display device.

At least one embodiment of the present disclosure provides a display panel, including: a base substrate, a plurality of light-emitting elements, a plurality of pixel circuits, and a plurality of conductive lines, the base substrate has a first display region and a second display region, the first display region is located on at least one side of the second display region; the plurality of light-emitting elements are located in the first display region and the second display region, the plurality of light-emitting elements include a plurality of groups of light-emitting elements, light-emitting elements in each group of the plurality of groups of light-emitting elements are arranged in a first direction, the plurality of groups of light-emitting elements are arranged in a second direction, at least one group of the plurality of groups of light-emitting elements includes a plurality of first-region light-emitting elements and a plurality of second-region light-emitting elements, the plurality of first-region light-emitting elements are located in the first display region, and the plurality of second-region light-emitting elements are located in the second display region; the plurality of pixel circuits are located in the first display region, the plurality of pixel circuits include a plurality of groups of pixel circuits, pixel circuits in each group of the plurality of groups of pixel circuits are arranged in the first direction, the plurality of groups of pixel circuits are arranged in the second direction, at least one group of the plurality of groups of pixel circuits includes a plurality of first-type pixel circuits and a plurality of second-type pixel circuits, and the plurality of second-type pixel circuits are distributed at intervals among the plurality of first-type pixel circuits; at least one first-type pixel circuit among the plurality of first-type pixel circuits is connected to at least one first-region light-emitting element among the plurality of first-region light-emitting elements, an orthographic projection of the at least one first-type pixel circuit on the base substrate at least partially overlaps with an orthographic projection of the at least one first-region light-emitting element on the base substrate, and at least one second-type pixel circuit among the plurality of second-type pixel circuits is connected to at least one second-region light-emitting element among the plurality of second-region light-emitting elements through at least one conductive line of the plurality of conductive lines; the plurality of second-region light-emitting elements include a plurality of first light-emitting elements and a plurality of second light-emitting elements, each of the plurality of first light-emitting elements is configured to emit light of a first color, and each of the plurality of second light-emitting elements is configured to emit light of a second color, the plurality of second-type pixel circuits include a plurality of first pixel circuits and a plurality of second pixel circuits, the plurality of conductive lines include a plurality of first conductive lines and a plurality of second conductive lines, the plurality of first light-emitting elements are connected to the plurality of first pixel circuits through the plurality of first conductive lines, and the plurality of second light-emitting elements are connected to the plurality of second pixel circuits through the plurality of second conductive lines, in the at least one group of light-emitting elements and the at least one group of pixel circuits, the plurality of first pixel circuits connected to the plurality of first light-emitting elements are closer to the second display region than each of the plurality of second pixel circuits connected to the plurality of second light-emitting elements, the display panel includes a first transparent conductive pattern layer and a second transparent conductive pattern layer, at least one first conductive line among the plurality of first conductive lines is located in the second transparent conductive pattern layer, and at least one second conductive line among the plurality of second conductive lines is located in the first transparent conductive pattern layer.

According to the display panel provided by an embodiment of the present disclosure, the plurality of conductive lines are located between the plurality of light-emitting elements and the plurality of pixel circuits in a direction perpendicular to a main surface of the base substrate.

According to the display panel provided by an embodiment of the present disclosure, at least one second conductive line close to a center of the second display region spans at least two groups of light-emitting elements in the second direction.

According to the display panel provided by an embodiment of the present disclosure, the at least one second conductive line close to the center of the second display region extends from the second display region to the first display region in the second direction.

According to the display panel provided by an embodiment of the present disclosure, each of the plurality of first conductive lines is a conductive line with an integral structure, and each of the plurality of second conductive lines is a conductive line with an integral structure.

According to the display panel provided by an embodiment of the present disclosure, the plurality of second-region light-emitting elements further include a plurality of third light-emitting elements, each of the plurality of third light-emitting elements is configured to emit light of a third color, the plurality of second-type pixel circuits further include a plurality of third pixel circuits, the plurality of conductive lines further include a plurality of third conductive lines, and the plurality of third light-emitting elements are connected to the plurality of third pixel circuits through the plurality of third conductive lines, in the at least one group of light-emitting elements and the at least one group of pixel circuits, the plurality of first pixel circuits connected to the plurality of first conductive lines are closer to the second display region than each of the plurality of third pixel circuits connected to the plurality of third conductive lines, a part of the plurality of third conductive lines is located in the first transparent conductive pattern layer, and the other part of the plurality of third conductive lines is located in the second transparent conductive pattern layer.

According to the display panel provided by an embodiment of the present disclosure, at least one third conductive line close to a center of the second display region spans at least two groups of light-emitting elements in the second direction.

According to the display panel provided by an embodiment of the present disclosure, the at least one third conductive line close to the center of the second display region extends from the second display region to the first display region in the second direction.

According to the display panel provided by an embodiment of the present disclosure, in the at least one group of light-emitting elements and the at least one group of pixel circuits, the plurality of first conductive lines connected to the at least one group of light-emitting elements are located on a first side of the at least one group of light-emitting elements, the plurality of second conductive lines and the plurality of third conductive lines connected to the at least one group of light-emitting elements are located on a second side of the at least one group of light-emitting elements, and the first side and the second side are opposite sides of the at least one group of light-emitting elements.

According to the display panel provided by an embodiment of the present disclosure, at least one group of the plurality of groups of pixel circuits includes a dummy pixel circuit, the dummy pixel circuit is located between two second-type pixel circuits in the first direction, an orthographic projection of at least one of one second conductive line among the plurality of second conductive lines close to the center of the second display region and one third conductive line among the plurality of third conductive lines close to the center of the second display region on the base substrate overlaps with an orthographic projection of the dummy pixel circuit on the base substrate.

According to the display panel provided by an embodiment of the present disclosure, each of the plurality of third conductive lines is a conductive line with an integral structure.

According to the display panel provided by an embodiment of the present disclosure, the display panel further includes a planarization layer, each of the plurality of light-emitting elements includes a first electrode, a second electrode, and a light-emitting functional layer between the first electrode and the second electrode, the first electrode is closer to the base substrate than the second electrode, the planarization layer is located between first electrodes of the plurality of light-emitting elements and the plurality of pixel circuits, and an orthographic projection of a via hole in the planarization layer on the base substrate does not overlap with the orthographic projection of the dummy pixel circuit on the base substrate.

According to the display panel provided by an embodiment of the present disclosure, each of the second conductive line close to the center of the second display region and the third conductive line close to the center of the second display region includes a first part, a second part, a third part, and a fourth part that are connected in sequence, the second part and the fourth part extend in the first direction, and the first part and the third part extend in the second direction.

According to the display panel provided by an embodiment of the present disclosure, an orthographic projection of the third part on the base substrate overlaps with an orthographic projection of the dummy pixel circuit on the base substrate.

According to the display panel provided by an embodiment of the present disclosure, the fourth part and the second part are located on a same side of the third part.

According to the display panel provided by an embodiment of the present disclosure, the fourth part and the second part are located on two sides of the third part, respectively.

According to the display panel provided by an embodiment of the present disclosure, the plurality of second-region light-emitting elements further include a plurality of fourth light-emitting elements, each of the plurality of fourth light-emitting elements is configured to emit light of a fourth color, the plurality of second-type pixel circuits further include a plurality of fourth pixel circuits, the plurality of conductive lines further include a plurality of fourth conductive lines, and the plurality of fourth light-emitting elements are connected to the plurality of fourth pixel circuits through the plurality of fourth conductive lines, in the at least one group of light-emitting elements and the at least one group of pixel circuits, the plurality of fourth pixel circuits connected to the plurality of fourth conductive lines are closer to the second display region than each of the plurality of second pixel circuits connected to the plurality of second conductive lines.

According to the display panel provided by an embodiment of the present disclosure, at least one group of the plurality of groups of light-emitting elements includes a first sub-group of light-emitting elements and a second sub-group of light-emitting elements, the first sub-group of light-emitting elements is closer to an edge of the second display region than the second sub-group of light-emitting elements, or the second sub-group of light-emitting elements is closer to a center of the second display region than the first sub-group of light-emitting elements; the at least one group of light-emitting elements includes a first group of light-emitting elements, in the first group of light-emitting elements, the conductive lines connected to the second light-emitting element and the third light-emitting element in the first sub-group of light-emitting elements are located in the first transparent conductive pattern layer, the conductive lines connected to the first light-emitting element and the fourth light-emitting element in the first sub-group of light-emitting elements are all located in the second transparent conductive pattern layer; the conductive lines connected to the second light-emitting element and the third light-emitting element in the second sub-group of light-emitting elements are all located in the first transparent conductive pattern layer, and the conductive lines connected to the first light-emitting element and the fourth light-emitting element in the second sub-group of light-emitting elements are all located in the second transparent conductive pattern layer.

According to the display panel provided by an embodiment of the present disclosure, the at least one group of light-emitting elements includes a second group of light-emitting elements, the second group of light-emitting elements is closer to the center of the second display region than the first group of light-emitting elements, in the second group of light-emitting elements, the conductive lines connected to the light-emitting elements in the first sub-group of light-emitting elements are located in the first transparent conductive pattern layer, the conductive lines connected to the light-emitting elements in the second sub-group of light-emitting elements are located in the second transparent conductive pattern layer.

According to the display panel provided by an embodiment of the present disclosure, each of the plurality of fourth conductive lines is a conductive line with an integral structure.

According to the display panel provided by an embodiment of the present disclosure, the first transparent conductive pattern layer is closer to the base substrate than the second transparent conductive pattern layer.

According to the display panel provided by an embodiment of the present disclosure, the second transparent conductive pattern layer is closer to the base substrate than the first transparent conductive pattern layer.

According to the display panel provided by an embodiment of the present disclosure, the second display region has a first symmetry axis extending in the first direction and a second symmetry axis extending in the second direction, and the plurality of conductive lines are symmetrical with respect to the first symmetry axis and are symmetrical with respect to the second symmetry axis.

According to the display panel provided by an embodiment of the present disclosure, in the first direction, two first-type pixel circuits are arranged between two adjacent second-type pixel circuits.

According to the display panel provided by an embodiment of the present disclosure, an orthographic projection of a part of each of the plurality of first conductive lines extending in the first direction on the base substrate does not overlap with an orthographic projection of a part of each of the plurality of second conductive lines extending in the first direction on the base substrate.

According to the display panel provided by an embodiment of the present disclosure, the fourth light-emitting element and the first light-emitting element are configured to emit green light, one of the second light-emitting element and the third light-emitting element is configured to emit red light, and the other one of the second light-emitting element and the third light-emitting element is configured to emit blue light.

According to the display panel provided by an embodiment of the present disclosure, a part of the plurality of first conductive lines is located in the second transparent conductive pattern layer, the other part of the plurality of first conductive lines is located in the first transparent conductive pattern layer.

At least one embodiment of the present disclosure further provides a display device, including any one of the display panels as described above.

For example, the display device further includes a photosensitive sensor, the photosensitive sensor is located on one side of the display device.

BRIEF DESCRIPTION OF THE DRAWINGS

In order to clearly illustrate the technical solution of the embodiments of the present disclosure, the drawings of the embodiments will be briefly described. It is obvious that the described drawings in the following are only related to some embodiments of the present disclosure and thus are not construed as any limitation to the present disclosure.

DETAILED DESCRIPTION

Figure 1A:
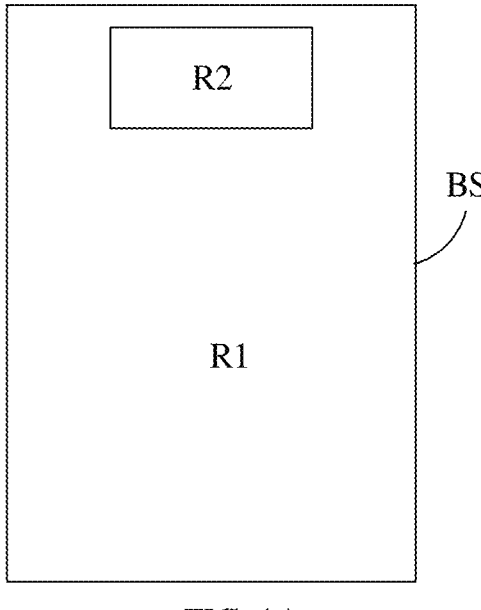
FIG. 1A is a schematic structural diagram of a display panel provided by an embodiment of the present disclosure.

In order to make objectives, technical details, and advantages of the embodiments of the present disclosure more clear, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first", "second", etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the described object is changed, the relative position relationship may be changed accordingly.

With development of display technology, the existing design of notch screen or waterdrop screen gradually cannot meet users' demand for a high screen-to-body ratio of a display panel, and a series of display panels having a light-transmitting display region have emerged as times require. In such type of display panel, a device such as a photosensitive sensor (e.g., a camera) may be provided in the light-transmitting display region; because there is no need to punch a hole, it is possible to realize a true full screen under the premise of ensuring practicability of the display panel.

In a related art, a display panel with an under-screen camera generally includes a first display region for normal display and a second display region for providing a camera. The second display region generally includes: a plurality of light-emitting elements and a plurality of pixel circuits. Each pixel circuit is connected to a light-emitting element and used to drive the light-emitting element to emit light, and the pixel circuit and the light-emitting element that are connected to each other overlap with each other in a direction perpendicular to the display panel.

Because the second display region in the related art is also provided with pixel circuits, light transmittance of the second display region is poor, and accordingly, a display effect of the display panel is poor.

Figure 1B:
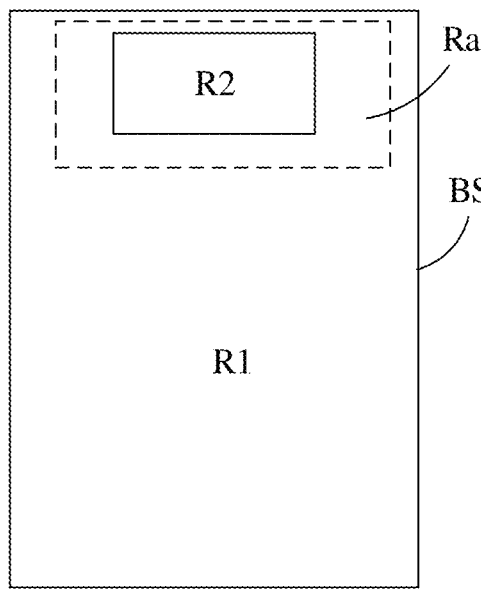
FIG. 1B is a schematic structural diagram of a display panel provided by an embodiment of the present disclosure.

FIG. 1A is a schematic structural diagram of a display panel provided by an embodiment of the present disclosure. FIG. 1B is a schematic structural diagram of a display panel provided by an embodiment of the present disclosure. As illustrated in FIG. 1A and FIG. 1B, the display panel may include: a base substrate BS. The display panel includes a first display region R1 and a second display region R2; and the first display region R1 may be located on at least one side of the second display region R2. For example, in some embodiments, the first display region R1 surrounds the second display region R2. That is, the second display region R2 may be surrounded by the first display region R1. The second display region R2 may also be arranged in other positions; and the arrangement position of the second display region R2 may be determined as needed. For example, the second display region R2 may be located in a top middle position of the base substrate BS, or may also be located in an upper left corner position or an upper right corner position of the base substrate BS. For example, a device such as a photosensitive sensor (e.g., a camera) is provided in the second display region R2 of the display panel. For example, the second display region R2 is a light-transmitting display region; and the first display region R1 is a display region. For example, the first display region R1 is opaque and only used for display. FIG. 1B illustrates that the first display region R1 includes an auxiliary region Ra.

Figure 2:
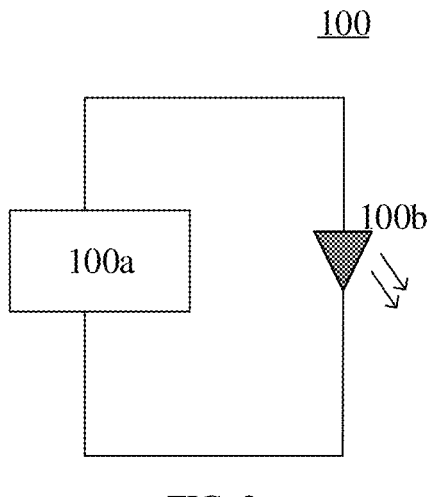
FIG. 2 is a schematic diagram of a pixel unit of a display panel provided by an embodiment of the present disclosure.

FIG. 2 is a schematic diagram of a pixel unit of a display panel provided by an embodiment of the present disclosure. The display panel includes a pixel unit 100; and the pixel unit 100 is located on a base substrate. As illustrated in FIG. 2, the pixel unit 100 includes a pixel circuit 100a and a light-emitting element 100b; and the pixel circuit 100a is configured to drive the light-emitting element 100b. For example, the pixel circuit 100a is configured to supply a driving current to drive the light-emitting element 100b to emit light. For example, the light-emitting element 100b is an organic light-emitting diode (OLED); and the light-emitting element 100b emits red light, green light, blue light, or white light, etc., under the driving of a pixel circuit 100a corresponding thereto. A color of light emitted from the light-emitting element 100b may be determined as needed.

In order to increase light transmittance of the second display region R2, the second display region R2 may be provided with only light-emitting elements, while the pixel circuits for driving the light-emitting elements of the second display region R2 may be provided in the first display region RE That is, the light transmittance of the second display region R2 is increased by separately arranging the light-emitting element and the pixel circuit. That is, the second display region R2 is not provided with the pixel circuit 100a.

Figure 3:
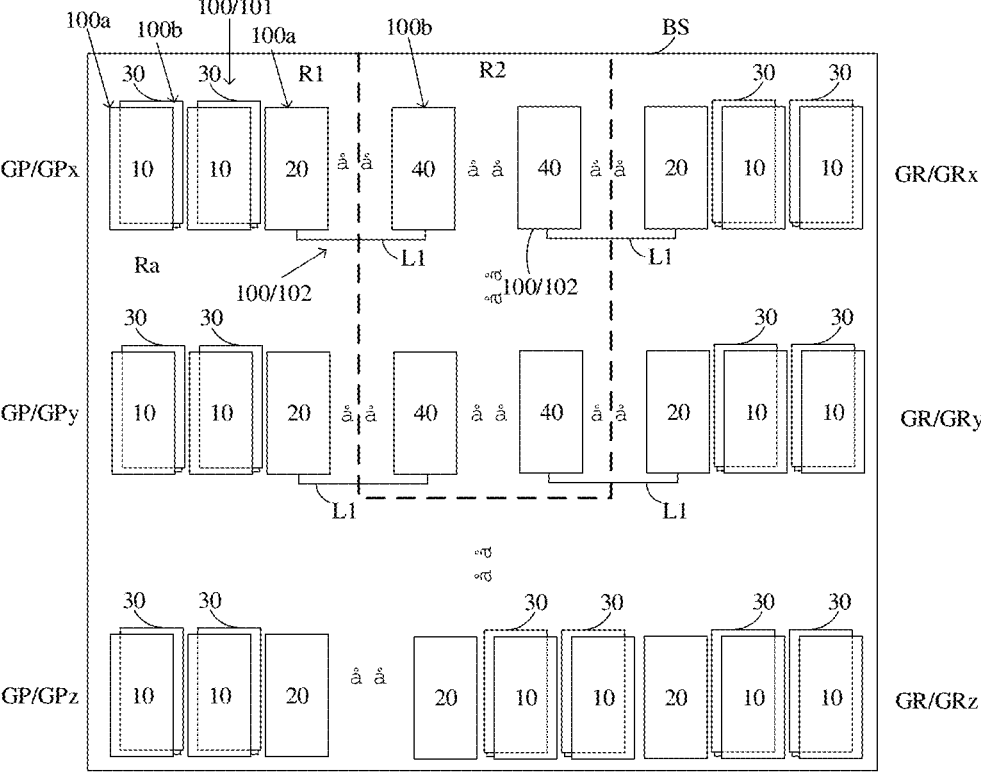
FIG. 3 is a schematic diagram of a display panel provided by an embodiment of the present disclosure.

FIG. 3 is a schematic diagram of a display panel provided by an embodiment of the present disclosure. As illustrated in FIG. 3, the display panel includes: a plurality of first-type pixel circuits 10, a plurality of second-type pixel circuits 20, and a plurality of first-region light-emitting elements 30 that are located in a first display region R1; as well as a plurality of second-region light-emitting elements 40 located in a second display region R2. For example, the plurality of second-type pixel circuits 20 may be distributed at intervals among the plurality of first-type pixel circuits 10.

For example, as illustrated in FIG. 3, at least one first-type pixel circuit 10 among the plurality of first-type pixel circuits 10 may be connected to at least one first-region light-emitting element 30 among the plurality of first-region light-emitting elements 30; and an orthographic projection of the at least one first-type pixel circuit 10 on the base substrate BS may at least partially overlap with an orthographic projection of the at least one first-region light-emitting element 30 on the base substrate BS. The at least one first-type pixel circuit 10 may be used to supply a drive signal to the first-region light-emitting element 30 connected thereto, to drive the first-region light-emitting element 30 to emit light.

For example, as illustrated in FIG. 3, at least one second-type pixel circuit 20 among the plurality of second-type pixel circuits 20 may be connected to at least one second-region light-emitting element 40 among the plurality of second-region light-emitting elements 40 through a conductive line L1; and the at least one second-type pixel circuit 20 may be used to supply a drive signal to the second-region light-emitting element 40 connected thereto, to drive the second-region light-emitting element 40 to emit light. As illustrated in FIG. 3, because the second-region light-emitting element 40 and the second-type pixel circuit 20 are located in different regions, there is no overlapping portion between an orthographic projection of at least one second-type pixel circuit 20 on the base substrate BS and an orthographic projection of at least one second-region light-emitting element 40 on the base substrate BS. That is, the orthographic projection of the second-type pixel circuit 20 on the base substrate BS does not overlap with the orthographic projection of the second-region light-emitting element 40 on the base substrate BS.

For example, in the embodiment of the present disclosure, the first display region R1 may be set as a non-transmitting display region; and the second display region R2 may be set as a transmitting display region. For example, the first display region R1 cannot transmit light; and the second display region R2 can transmit light. In this way, the display panel provided by the embodiment of the present disclosure may have the required device structure such as the photosensitive sensor directly arranged in a position corresponding to the second display region R2 on a side of the display panel, without performing digging process on the display panel to form a hole, which lays a solid foundation for implementing a true full screen. In addition, because the second display region R2 only includes light-emitting elements and does not include pixel circuits, it is favorable for increasing light transmittance of the second display region R2, so that the display panel has a better display effect.

As illustrated in FIG. 3, the pixel unit 100 includes a first pixel unit 101 and a second pixel unit 102; the pixel circuit 100a and the light-emitting element 100b of the first pixel unit 101 are both located in the first display region R1; the pixel circuit 100a of the second pixel unit 101 is located in the first display region R1; and the light-emitting element 100b of the second pixel unit 102 is located in the second display region R2. In the embodiment of the present disclosure, the pixel circuit 100a of the first pixel unit 101 is the first-type pixel circuit 10; the light-emitting element 100b of the first pixel unit 101 is the first-region light-emitting element 30; the pixel circuit 100a of the second pixel unit 101 is the second-type pixel circuit 20; and the light-emitting element 100b of the second pixel unit 102 is the second-region light-emitting element 40. For example, the first-region light-emitting element 30 may be referred to as an in-situ light-emitting element. For example, the first-type pixel circuit 10 may be referred to as an in-situ pixel circuit; and the second-type pixel circuit 20 may be referred to as an ex-situ pixel circuit.

For example, as illustrated in FIG. 3, the second-region light-emitting element 40 and the second-type pixel circuit 20 connected to the second-region light-emitting element 40 are located in the same row. That is, light-emitting signals of the second-region light-emitting elements 40 come from the second-type pixel circuit in the same row. For example, pixel circuits of pixel units in the same row are connected to the same gate line.

As illustrated in FIG. 3, the pixel circuit (the second-type pixel circuit 20) of the second pixel unit 102 is connected to the light-emitting element (the second-region light-emitting element 40) of the second pixel unit 102 through a conductive line L1. For example, the conductive line L1 is made of a transparent conductive material. For example, the conductive line L1 is made of a conductive oxide material. For example, the conductive oxide material includes, but is not limited to, indium tin oxide (ITO).

As illustrated in FIG. 3, one end of the conductive line L1 is connected to the second-type pixel circuit 20; and the other end of the conductive line L1 is connected to the second-region light-emitting element 40. As illustrated in FIG. 3, the conductive line L1 extends from the first display region R1 to the second display region R2.

As illustrated in FIG. 1B and FIG. 3, in some embodiments, the first display region R1 may include an auxiliary region Ra; and the auxiliary region Ra may be provided with the second-type pixel circuit 20 connected to the second-region light-emitting element 40. For example, in the auxiliary region Ra of the first display region R1 or a region of the first display region R1 excluding the auxiliary region Ra, a plurality of dummy pixel circuits may be provided. The dummy pixel circuit is not connected to any light-emitting element. Providing the dummy pixel circuit is favorable for improving uniformity of components of respective film layers in an etching process. For example, the dummy pixel circuit has the same structure as the second-type pixel circuit 20 in a row or a column where the dummy pixel circuit is located, except that the dummy pixel circuit is not connected to any light-emitting element. For example, in the first display region R1, the auxiliary region Ra and the region of the first display region R1 excluding the auxiliary region Ra (non-auxiliary region) have same pixel density, or same resolution, but are not limited thereto.

FIG. 3 illustrates three rows of light-emitting elements 100b. A first row of light-emitting elements 100b illustrated in FIG. 3 passes through the first display region R1 and the second display region R2, and is a row of light-emitting elements 100b passing through two regions. A second row of light-emitting elements 100b illustrated in FIG. 3 passes through the first display region R1 and the second display region R2, and is a row of light-emitting elements 100b passing through two regions. A third row of light-emitting elements 100b illustrated in FIG. 3 only passes through the first display region R1 but does not pass through the second display region R2, and is a row of light-emitting elements 100b passing through one region. For example, in some embodiments, the light-emitting elements 100b are divided into two types of row light-emitting elements, that is, a row of light-emitting elements passing through two regions and a row of light-emitting elements passing through one region.

Figure 4:
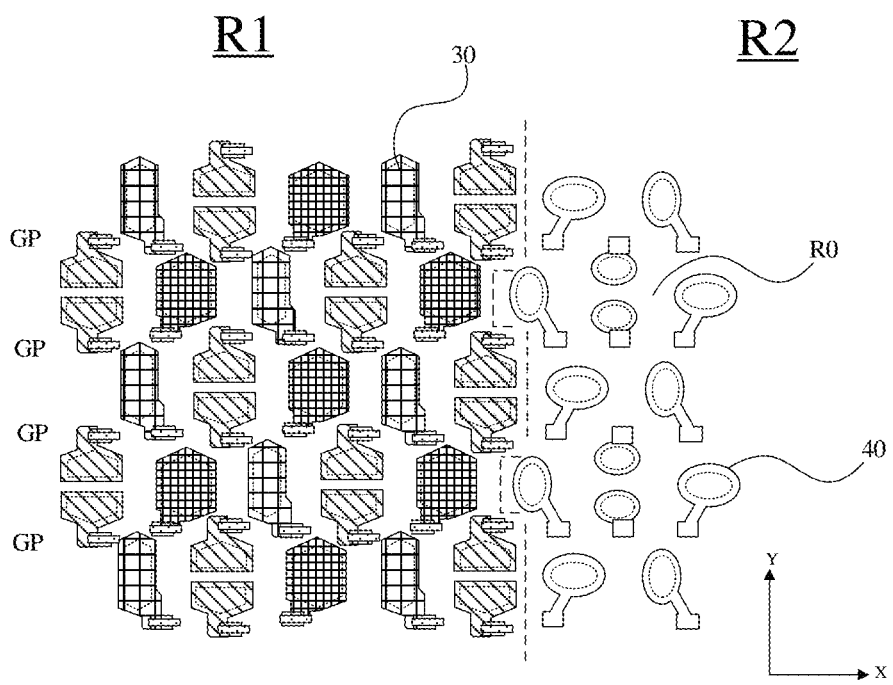
FIG. 4 is a schematic diagram of a first display region and a second display region in a display panel provided by an embodiment of the present disclosure.

FIG. 4 is a schematic diagram of a first display region and a second display region in a display panel provided by an embodiment of the present disclosure. As illustrated in FIG. 4, in the second display region R2, a light-transmitting region R0 is provided between adjacent second-region light-emitting elements 40. For example, as illustrated in FIG. 4, a plurality of light-transmitting regions R0 are connected to each other, to form a continuous light-transmitting region separated by a plurality of second-region light-emitting elements 40. The conductive line L1 is made of a transparent conductive material to increase light transmittance of the light-transmitting region R0 as much as possible. As illustrated in FIG. 4, a region of the second display region R2 except that provided with the second-region light-emitting element 40 may be a light-transmitting region.

Figure 5A:
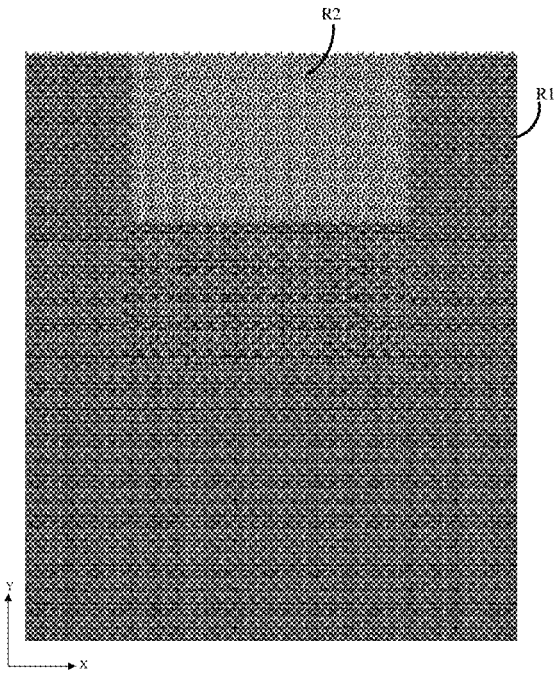
FIG. 5A to FIG. 5C are partial plan views of display panels provided by embodiments of the present disclosure.
Figure 5B:
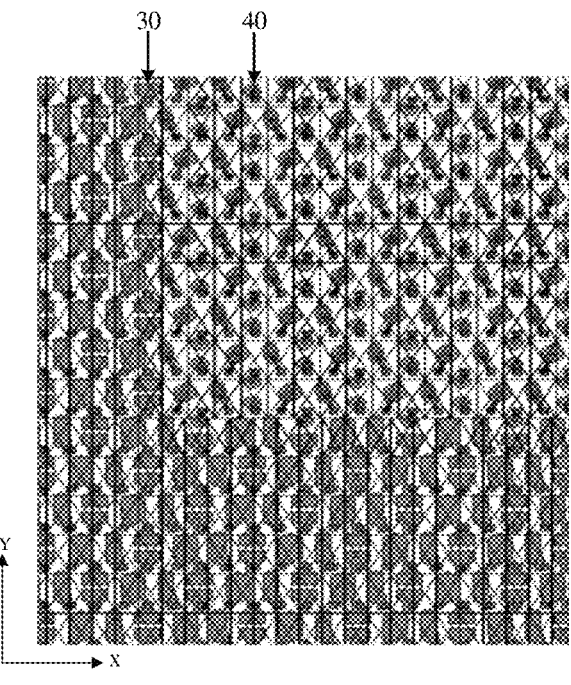
Figure 5C:
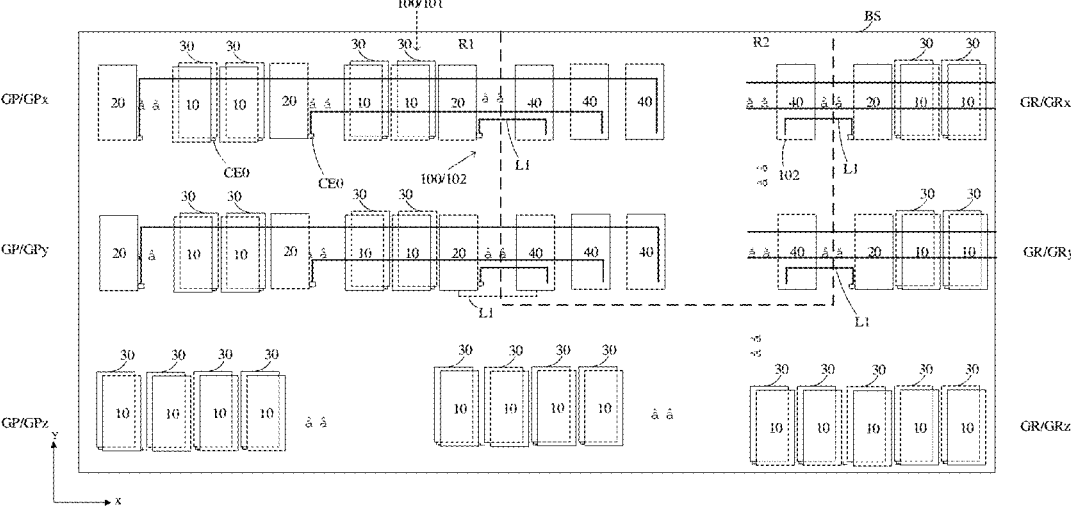

FIG. 5A to FIG. 5C are partial plan views of a display panel provided by an embodiment of the present disclosure. FIG. 5A to FIG. 5C are described below.

FIG. 5A is a schematic diagram of a first display region and a second display region of a display panel provided by an embodiment of the present disclosure. As illustrated in FIG. 5A, the second display region R2 is a light-transmitting display region; and the first display region R1 is a display region.

FIG. 5B is a schematic diagram of a first-region light-emitting element in a first display region and a second-region light-emitting element in a second display region of a display panel provided by an embodiment of the present disclosure. FIG. 5B illustrates the first-region light-emitting element 30 and the second-region light-emitting element 40.

Referring to FIG. 5A, FIG. 5B, and FIG. 3, in order to improve display effect, a density of the second-region light-emitting elements 40 may be equal to a density of the first-region light-emitting elements 30. That is, a resolution of the second display region R2 is the same as a resolution of the first display region RE Of course, in other embodiments, the density of the second-region light-emitting elements 40 may be greater or less than the density of the first-region light-emitting elements 30. That is, the resolution of the second display region R2 may be greater or less than the resolution of the first display region RE For example, as illustrated in FIG. 5B and FIG. 4, a light-emitting area of the second-region light-emitting element 40 is less than a light-emitting area of the first-region light-emitting element 30. That is, the light-emitting area of the first-region light-emitting element 30 is greater than the light-emitting area of the second-region light-emitting element 40. FIG. 4 illustrates the light-emitting area of the second-region light-emitting element 40 and the light-emitting area of the first-region light-emitting element 30 with dotted lines. For example, the light-emitting area of the light-emitting element may correspond to an area of an opening of a pixel definition layer.

FIG. 5C illustrates the first-region light-emitting element 30, the second-region light-emitting element 40, the first-type pixel circuit 10, the second-type pixel circuit 20, the connecting element CE0, and the conductive line L1. Each pixel circuit is connected to a light-emitting element through a connecting element CE0. That is, each pixel unit has one connecting element CE0. That is, the first-type pixel circuit 10 is connected to the first-region light-emitting element 30 through a connecting element CE0; and the second-type pixel circuit 20 is connected to the second-region light-emitting element 40 through a connecting element CE0.

For example, as illustrated in FIG. 5C, one end of the conductive line L1 is connected to the second-region light-emitting element 40; and the other end of the conductive line L1 is connected to the second-type pixel circuit 20 through the connecting element CE0. For example, the connecting element CE0 is connected to the pixel circuit 100a and the light-emitting element 100b, respectively. For example, the connecting element CE0 is connected to a light-emitting control transistor in the pixel circuit 100a and a first electrode of the light-emitting element 100b, respectively. For example, the connecting element CE0 may be formed by a single conductive member, or may include two different conductive members located in different layers. For example, the connecting element CE0 may include one conductive member located in one conductive layer and another conductive member located in another conductive layer.

As illustrated in FIG. 5C, a conductive line L1 passes through a region where the pixel circuit of the pixel unit is located to connect the second-type pixel circuit 20 and the second-region light-emitting element 40 that are located on both sides of the pixel unit, respectively. For example, the region where the pixel circuit of the pixel unit is located overlaps with a plurality of conductive lines L1 passing through the region. A region in the first display region R1 where the second-type pixel circuit 20 is arranged may be referred to as an auxiliary region Ra (as illustrated in FIG. 1B and FIG. 3); and the auxiliary region Ra may also be referred to as a transition region. FIG. 5C is described by taking that one first-type pixel circuit 10 overlaps with two conductive lines L1 at most as an example; in other embodiments, one first-type pixel circuit 10 may also overlap with more conductive lines L1. For example, in some embodiments, one first-type pixel circuit 10 may overlap with 5 to 15 conductive lines L1. The number of conductive lines L1 overlapping with one first-type pixel circuit 10 may be determined as needed. As illustrated in FIG. 5C, the second-type pixel circuit 20 may also overlap with the conductive line L1 that is not connected to it.

In some embodiments, a pitch of the first-type pixel circuit 10 may be compressed in a first direction X to obtain a region where the second-type pixel circuit 20 is provided. For example, as illustrated in FIG. 5C, in the auxiliary region, a column of second-type pixel circuits 20 is arranged every other predetermined column of first-type pixel circuits 10. For example, the number of columns of first-type pixel circuits 10 between two adjacent columns of second-type pixel circuits 20 may be determined as needed.

For example, in some embodiments, a pitch of the first-type pixel circuit 10 may be compressed in a first direction X to obtain a region where the second-type pixel circuit 20 is provided. For example, the pitch of the first-type pixel circuit 10 in the first direction X is less than a pitch of the first-region light-emitting element 30 in the first direction X. The first direction X is, for example, but is not limited to, a row direction. In other embodiments, the first direction X may also be a column direction. The embodiment of the present disclosure is described by taking the first direction X as a row direction.

Some figures illustrate a third direction Z, which is a direction perpendicular to a main surface of the base substrate. The main surface of the base substrate is a surface on which various components are formed. An upper surface of the base substrate in the cross-sectional view is the main surface of the base substrate. Both the first direction X and the second direction Y are directions parallel to the main surface of the base substrate. For example, the first direction X and the second direction Y are intersected with each other. For another example, the first direction X is perpendicular to the second direction Y.

Figure 5D:
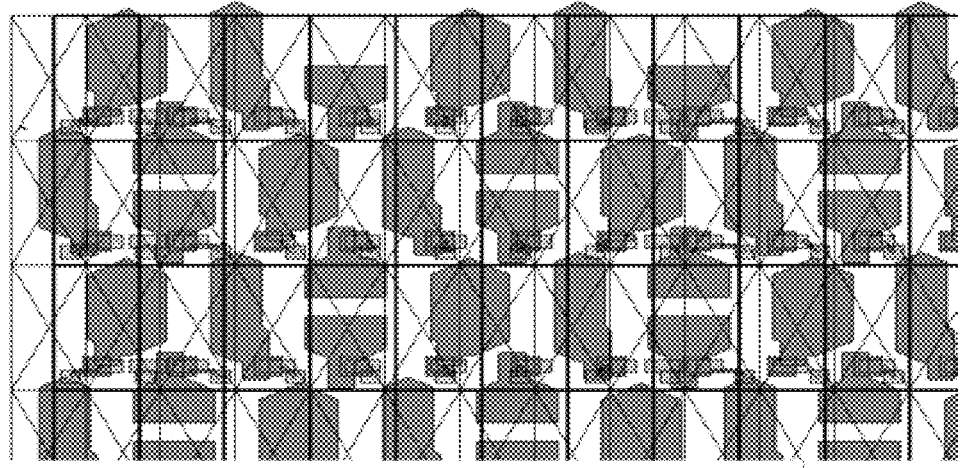
FIG. 5D to FIG. 5F are schematic structural diagrams of display panels provided by some embodiments of the present disclosure.
Figure 5E:
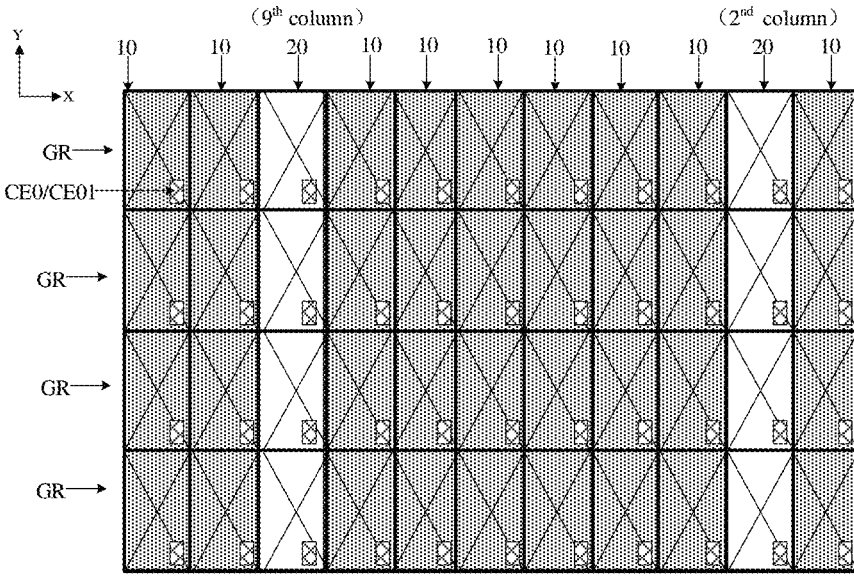
Figure 5F:
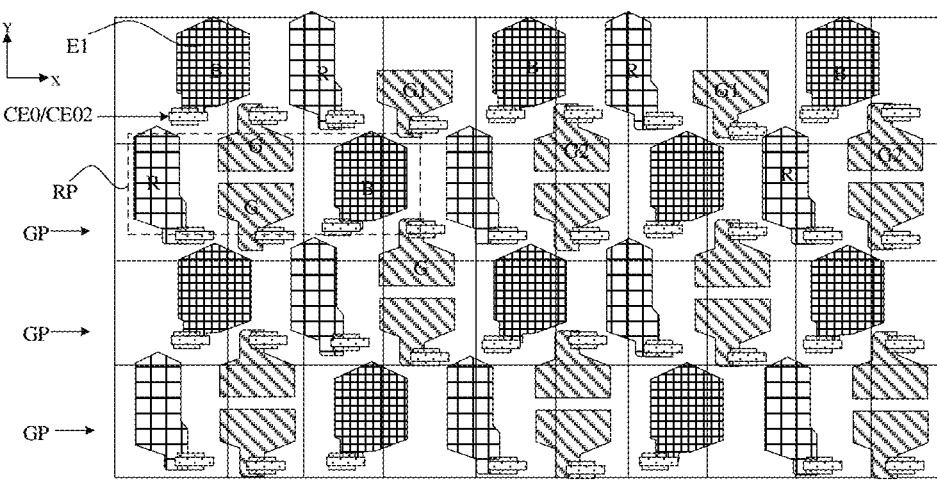

FIG. 5D to FIG. 5F are schematic structural diagrams of display panels provided by some embodiments of the present disclosure. In order to further illustrate that there are a plurality of extra columns of pixel circuits after the pixel circuit is compressed, FIG. 5D illustrates a schematic structural diagram of a first-region light-emitting element of a first display region R1. FIG. 5E illustrates a schematic diagram of a portion of the structure (including only the pixel circuit) in FIG. 5A; and FIG. 5F illustrates a schematic diagram of a portion of the structure (including only the light-emitting element) in FIG. 5A.

Referring to FIG. 5D to FIG. 5F, it may be seen that a width of the pixel circuit is less than a width of the light-emitting element. In this way, pixel circuits in the $2^{nd}$ column and the $9^{th}$ column from right to left are not connected to any first-region light-emitting element, which belong to the extra columns of pixel circuits, and may be used as the second-type pixel circuits 20 for connecting with the second-region light-emitting elements 40 in the second display region R2. For example, as illustrated in FIG. 5F, the first-region light-emitting elements 30 may include first electrodes E1 of 4 types of light-emitting elements RG1BG2; and the first electrode E1 of the light-emitting element is connected to the first-type pixel circuits 10 through a connecting element CE0. R refers to a light-emitting element emitting red light, G1 refers to a light-emitting element emitting green light, B refers to a light-emitting element emitting blue light, and G2 refers to a light-emitting element emitting green light. For example, the connecting element CE0 includes two connecting electrodes, which may be respectively a connecting electrode CE01 (as illustrated in FIG. 5E) and a connecting electrode CE02 (as illustrated in FIG. 5F) mentioned later, but it is not limited thereto. For example, in order to provide sufficient space for arranging the conductive line L1, axes of the connecting electrodes CE01 in the same row of pixel units may be located on a straight line.

FIG. 5F illustrates four rows of connecting elements CE0/connecting electrodes CE02, that is, FIG. 5F illustrates four rows of light-emitting elements. For example, light-emitting elements in each row are sequentially arranged in the first direction X in a manner of RGBG or BGRG. Of course, light-emitting colors of the light-emitting elements are not limited to RGB; arrangement mode of the light-emitting elements is not limited to that illustrated in FIG. 5F; and the embodiment of the present disclosure is described by taking that the light-emitting element includes RGBG as an example. For example, as illustrated in FIG. 5F, G includes G1 or G2. For example, in the pixel arrangement illustrated in FIG. 5F, one repeating unit RP includes two Gs arranged in a second direction Y and R and B respectively arranged on both sides of the two Gs in the first direction X, R and G constitute a pixel, and borrow B from another repeating unit adjacent thereto to constitute a virtual pixel for display; B and G constitute a pixel, and borrow R from another repeating unit adjacent thereto to constitute a virtual pixel for display, but it is not limited thereto.

Referring to FIG. 3, FIG. 4, and FIG. 5A to FIG. 5C, the display panel provided by some embodiments of the present disclosure includes: a base substrate BS, a plurality of light-emitting elements 100b, and a plurality of pixel circuits 100a. The base substrate BS has a first display region R1 and a second display region R2; and the first display region R1 is located on at least one side of the second display region R2. The plurality of light-emitting elements 100b are arranged in a plurality of rows and a plurality of columns.

Referring to FIG. 3, FIG. 4, FIG. 5C and FIG. 5F, the plurality of light-emitting elements 100b include a plurality of groups of light-emitting elements; light-emitting elements in each of the plurality of groups of light-emitting elements are arranged in the first direction X; and the plurality of groups of light-emitting elements are arranged in the second direction Y. FIG. 3 and FIG. 5C both illustrate three groups of light-emitting elements GP; the three groups of light-emitting elements GP are one group of light-emitting elements GPx, one group of light-emitting elements GPy, and one group of light-emitting elements GPz, respectively; the group of light-emitting elements GPx and the group of light-emitting elements GPy pass through the first display region R1 and the second display region R2; and the group of light-emitting elements GPz only passes through the first display region R1. FIG. 4 illustrates at least four groups of light-emitting elements GP arranged in the second direction Y. FIG. 5F illustrates at least four groups of light-emitting elements GP arranged in the second direction Y. In the display panel, the number of groups of light-emitting elements passing through the first display region R1 and the second display region R2, and the number of groups of light-emitting elements only passing through the first display region R1 may be determined as needed.

For example, in some embodiments, one group of light-emitting elements may be one row of light-emitting elements. Of course, one group of light-emitting elements may not completely correspond to one row of light-emitting elements. In other embodiments, one group of light-emitting elements may be one column of light-emitting elements. Of course, one group of light-emitting elements may not completely correspond to one column of light-emitting elements. The embodiments of the present disclosure are described with reference to the case where one group of light-emitting elements is one row of light-emitting elements, by way of example.

For example, referring to FIG. 3 and FIG. 5C, at least one of the plurality of groups of light-emitting elements includes a plurality of first-region light-emitting elements 30 and a plurality of second-region light-emitting elements 40. That is, at least one group of the plurality of groups of light-emitting elements passes through the first display region R1 and the second display region R2.

For example, referring to FIG. 3, FIG. 4 and FIG. 5C, the plurality of light-emitting elements 100*b* include at least one row of light-emitting elements 100*b* passing through two regions that passes through the first display region R1 and the second display region R2; and any row of light-emitting elements 100*b* passing through two regions in the at least one row of light-emitting elements 100*b* passing through two regions includes a plurality of first-region light-emitting elements 30 and a plurality of second-region light-emitting elements 40.

For example, referring to FIG. 3, FIG. 4 and FIG. 5C, the plurality of first-region light-emitting elements 30 are located in the first display region R1; and the plurality of second-region light-emitting elements 40 are located in the second display region R2.

For example, referring to FIG. 3, FIG. 5C and FIG. 5E, the plurality of pixel circuits include a plurality of groups of pixel circuits GR; pixel circuits in each group of the plurality of pixel circuits are arranged in the first direction X; and the plurality of groups of pixel circuits are arranged in the second direction Y. For example, at least one group in the plurality of groups of pixel circuits 100*a* includes a plurality of first-type pixel circuits 10 and a plurality of second-type pixel circuits 20. FIG. 3 and FIG. 5C respectively illustrate three groups of pixel circuits GR. FIG. 5E illustrates four groups of pixel circuits GR. As illustrated in FIG. 3 and FIG. 5C, the pixel circuit is only located in the first display region R1; and no pixel circuit is provided in the second display region R2.

For example, referring to FIG. 3 and FIG. 5C, a plurality of pixel circuits 100*a* are arranged in a plurality of rows and a plurality of columns; and the plurality of pixel circuits 100*a* include a plurality of first-type pixel circuits 10 and a plurality of second-type pixel circuits 20 located in the same row. In other words, at least one group of the plurality of groups of pixel circuits includes a plurality of first-type pixel circuits 10 and a plurality of second-type pixel circuits 20.

For example, referring to FIG. 3 and FIG. 5C, a plurality of first-type pixel circuits 10 and a plurality of second-type pixel circuits 20 are all located in the first display region R1; and the plurality of second-type pixel circuits 20 are distributed at intervals between the plurality of first-type pixel circuits 10. At least one first-type pixel circuit 10 among the plurality of first-type pixel circuits 10 is connected to at least one first-region light-emitting element 30 among the plurality of first-region light-emitting elements 30; an orthographic projection of the at least one first-type pixel circuit 10 on the base substrate BS at least partially overlaps with an orthographic projection of the at least one first-region light-emitting element 30 on the base substrate BS; and at least one second-type pixel circuit 20 among the plurality of second-type pixel circuits 20 is connected to at least one second-region light-emitting element 40 among the plurality of second-region light-emitting elements 40 through at least one conductive line of the plurality of conductive lines.

Figure 6:
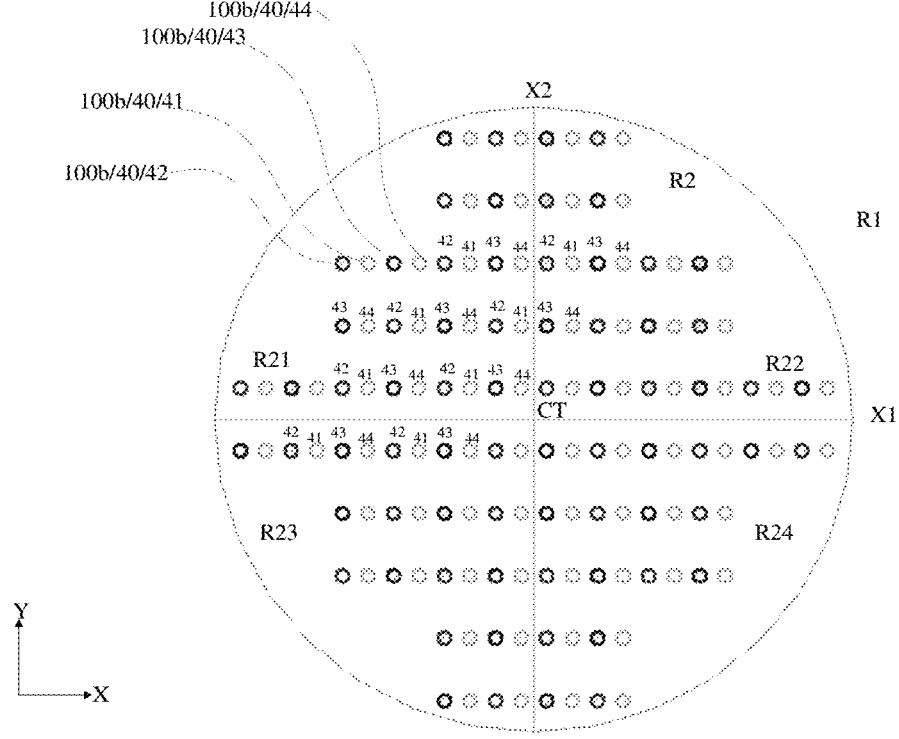
FIG. 6 is a schematic diagram of light-emitting elements located in a second display region in a display panel provided by an embodiment of the present disclosure.
Figure 7:
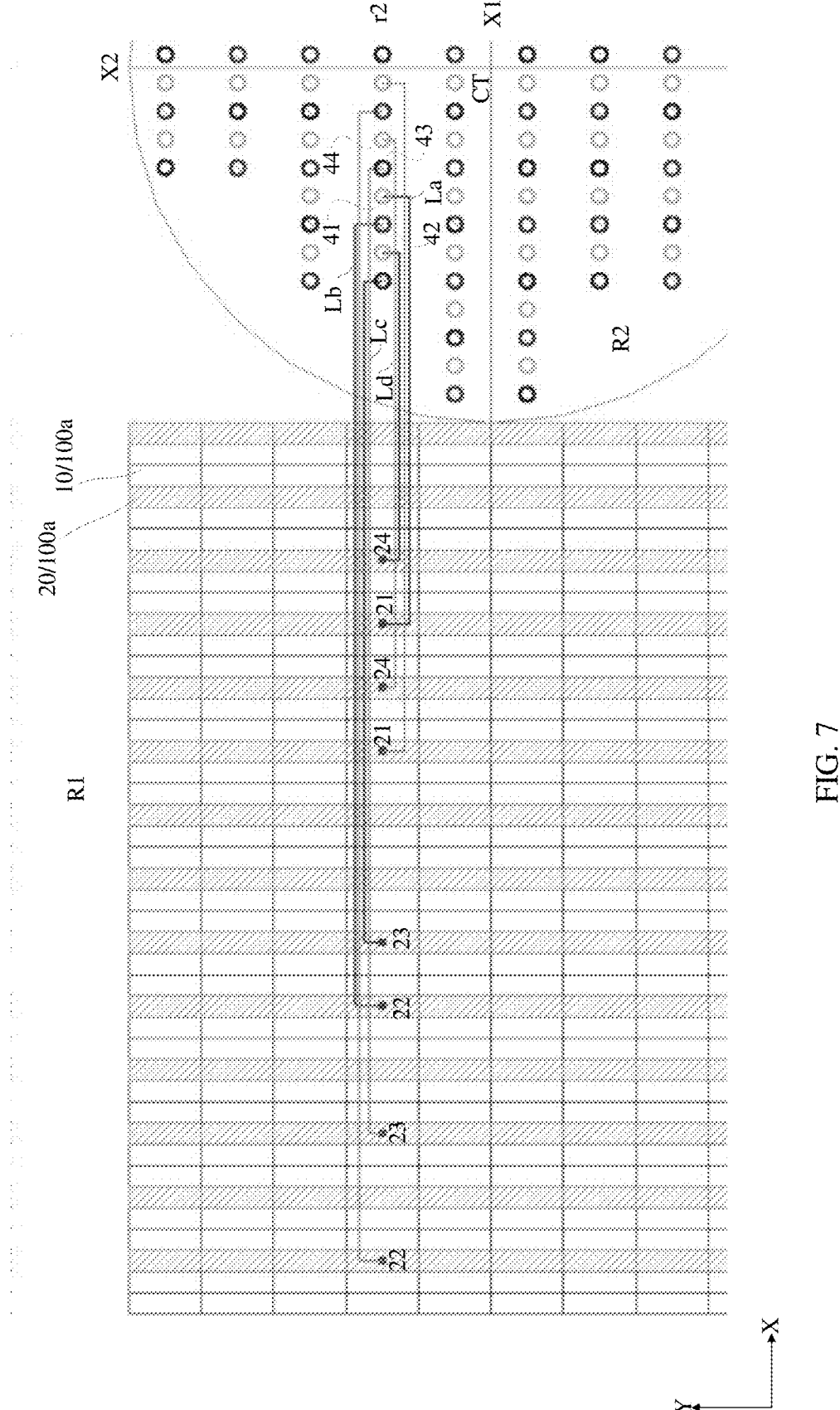
FIG. 7 is a schematic diagram of a row of light-emitting elements located in a second display region and second-type pixel circuits connected thereto in a display panel provided by an embodiment of the present disclosure.
Figure 8:
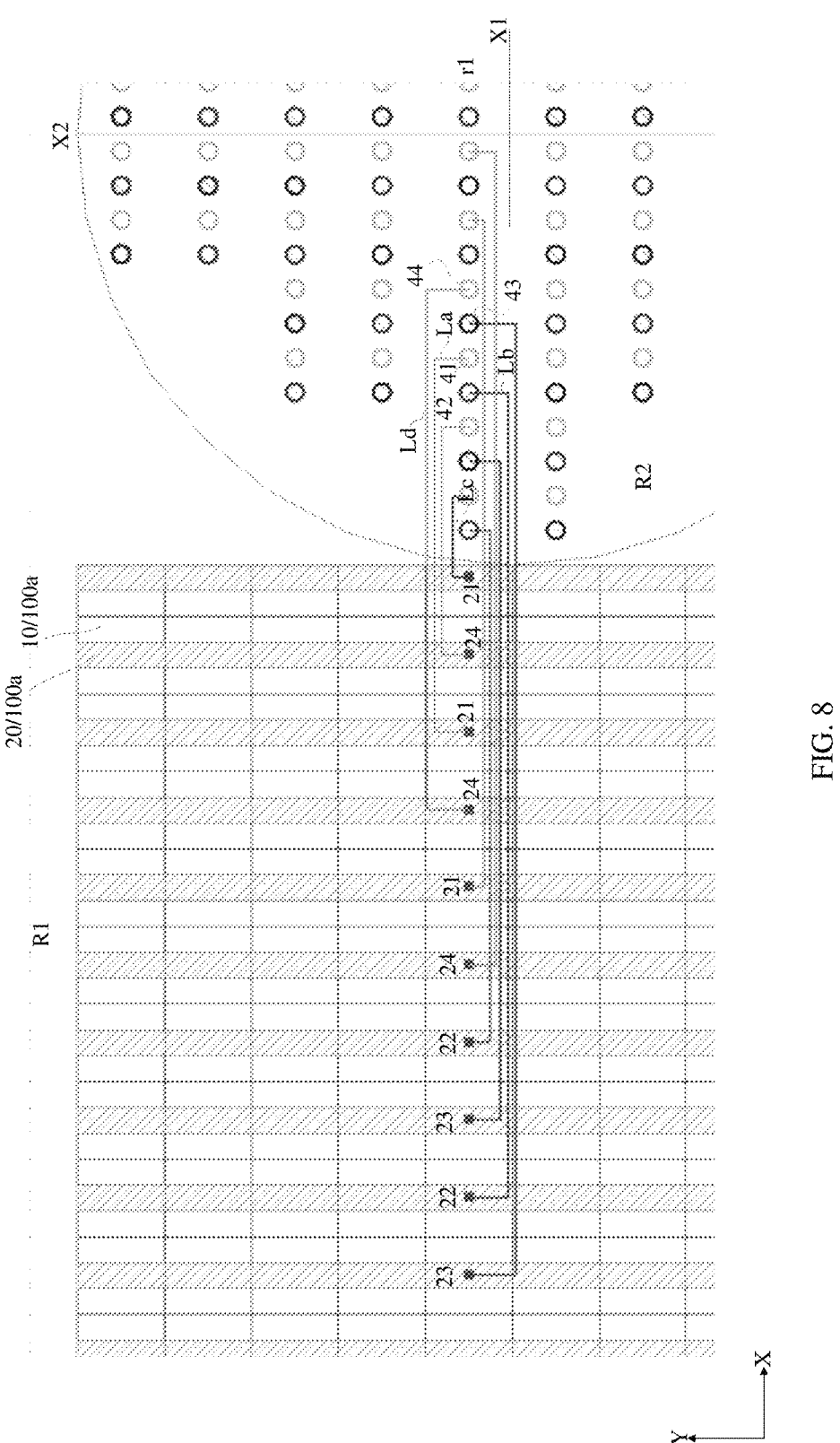
FIG. 8 is a schematic diagram of a row of light-emitting elements located in a second display region and second-type pixel circuits connected thereto in a display panel provided by an embodiment of the present disclosure.
Figure 9:
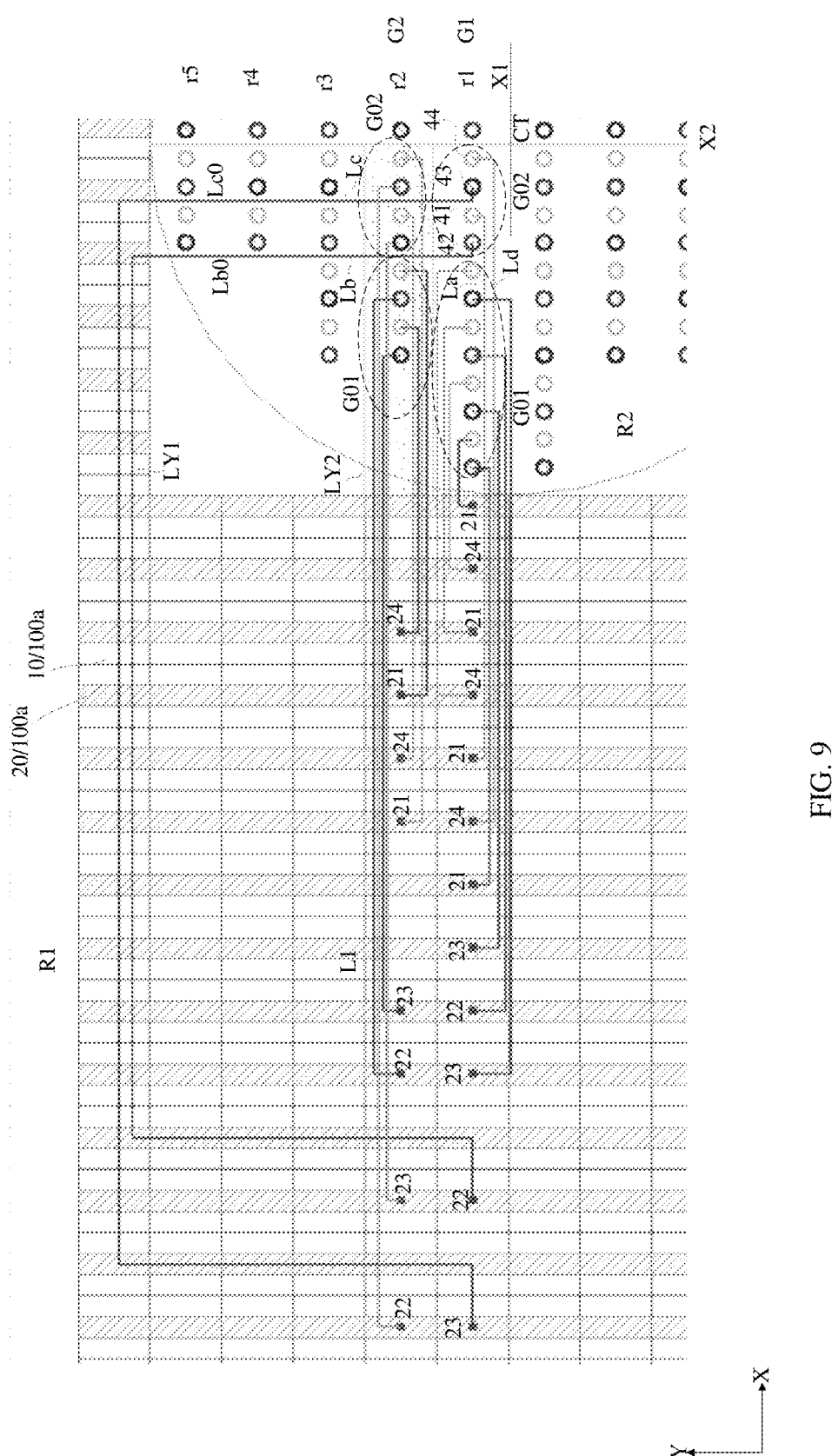
FIG. 9 is a schematic diagram of two rows of light-emitting elements located in a second display region and second-type pixel circuits connected thereto in a display panel provided by an embodiment of the present disclosure.
Figure 10:
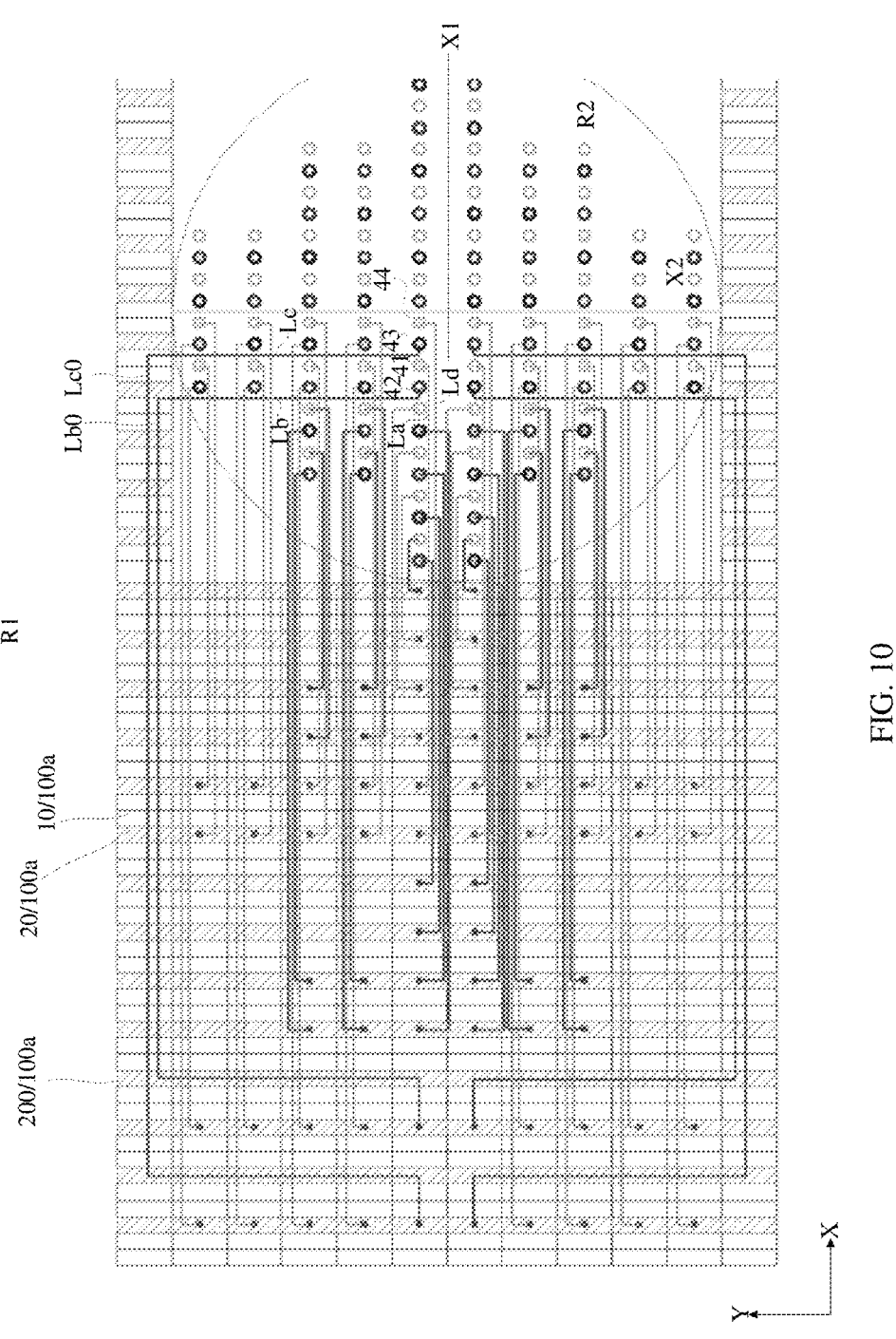
FIG. 10 is a schematic diagram of multiple rows of light-emitting elements located in a second display region and second-type pixel circuits connected thereto in a display panel provided by an embodiment of the present disclosure.
Figure 11:
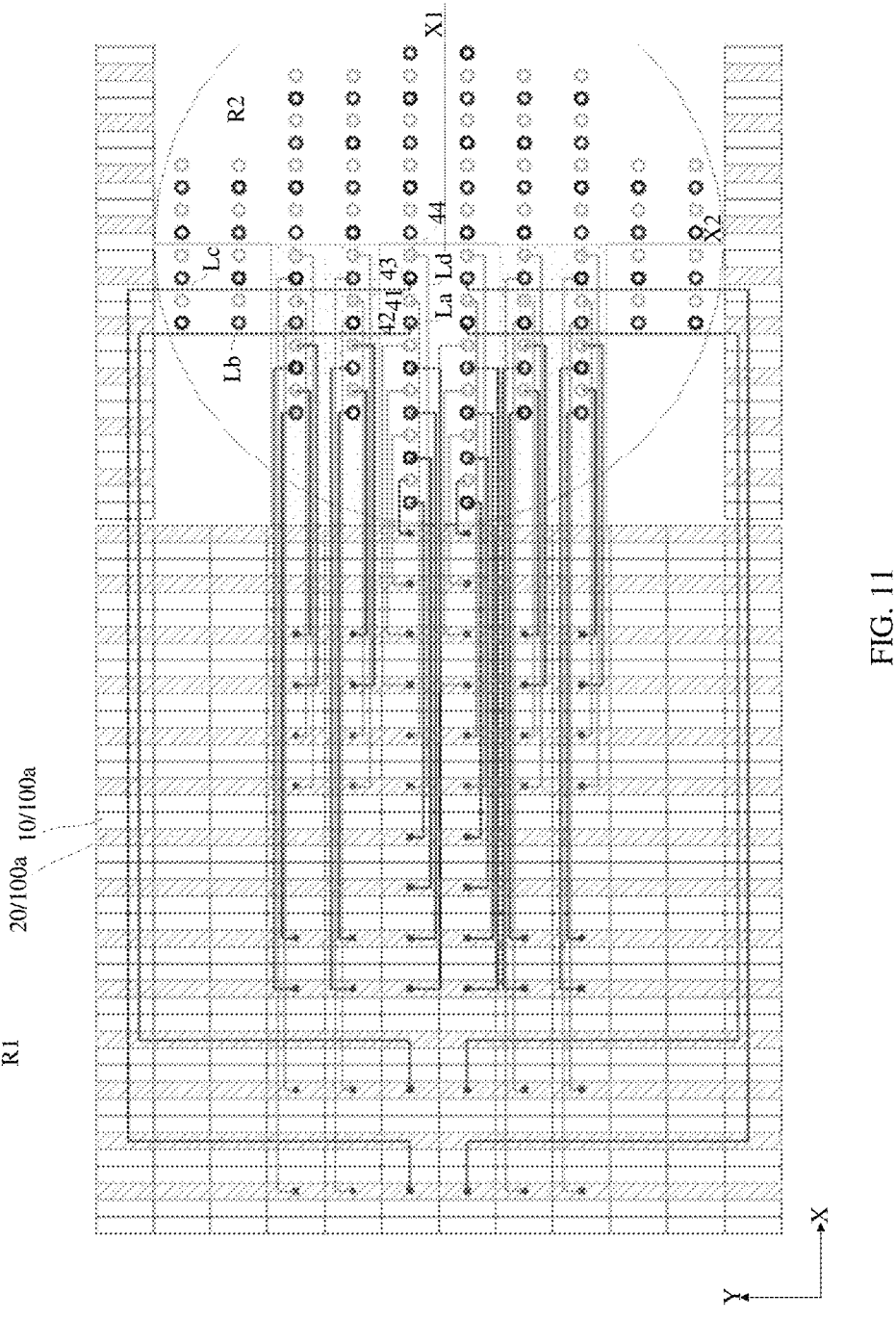
FIG. 11 is a schematic diagram of multiple rows of light-emitting elements located in a second display region and second-type pixel circuits connected thereto in a display panel provided by an embodiment of the present disclosure.
Figure 12:
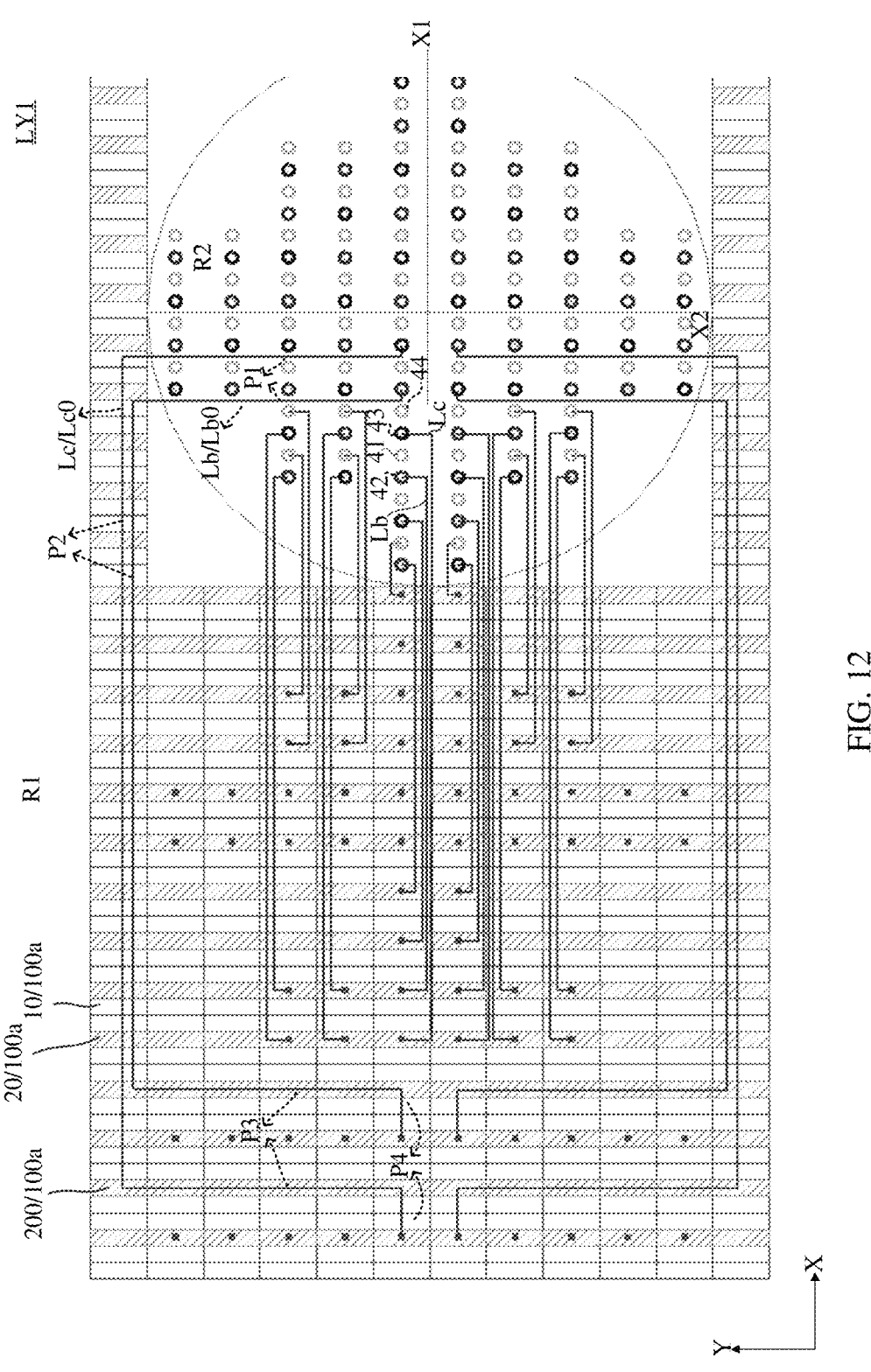
FIG. 12 is a schematic diagram of a first transparent conductive pattern layer, light-emitting elements, and pixel circuits in a display panel provided by an embodiment of the present disclosure.
Figure 13:
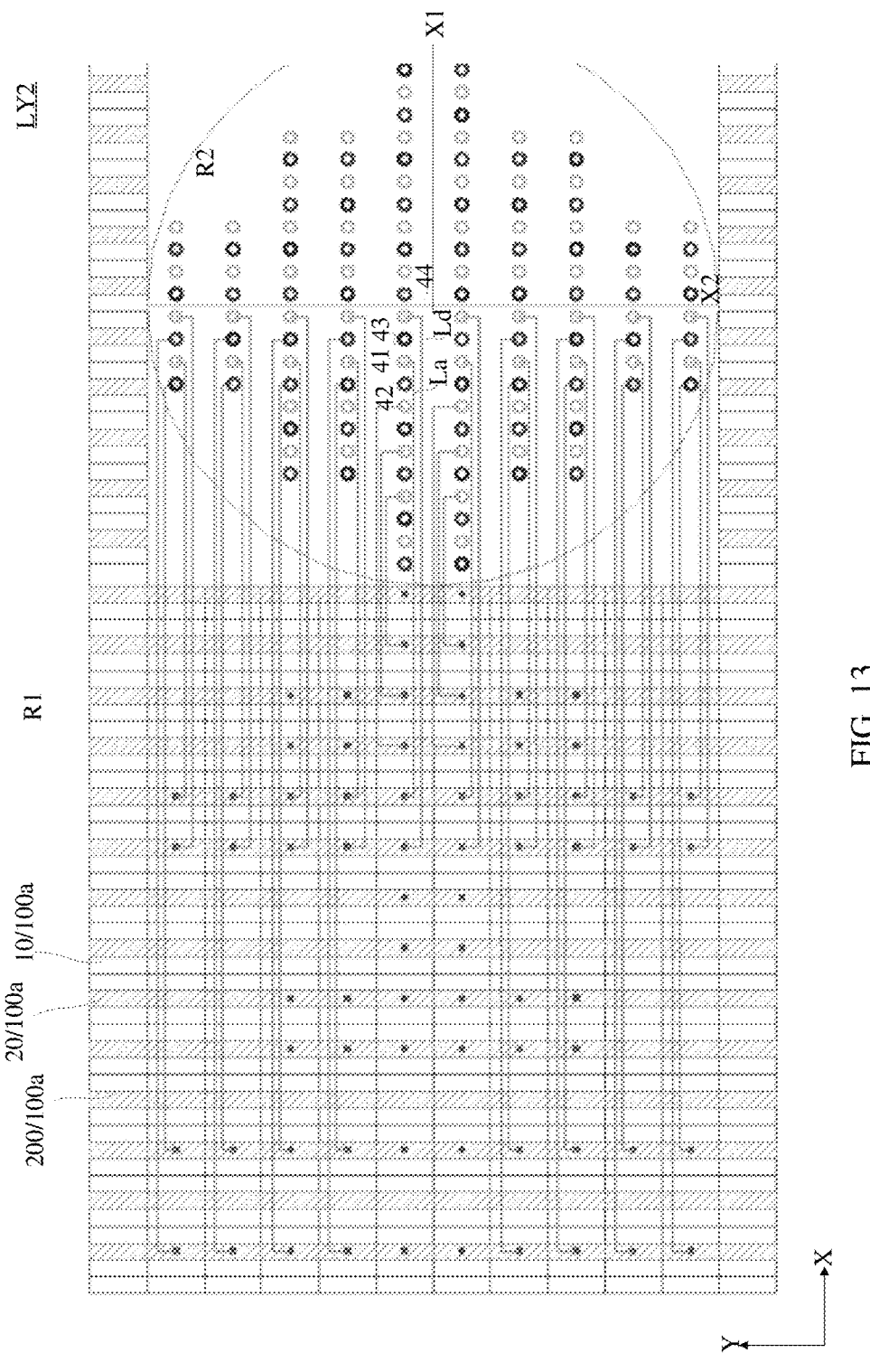
FIG. 13 is a schematic diagram of a second transparent conductive pattern layer, light-emitting elements, and pixel circuits in a display panel provided by an embodiment of the present disclosure.
Figure 14:
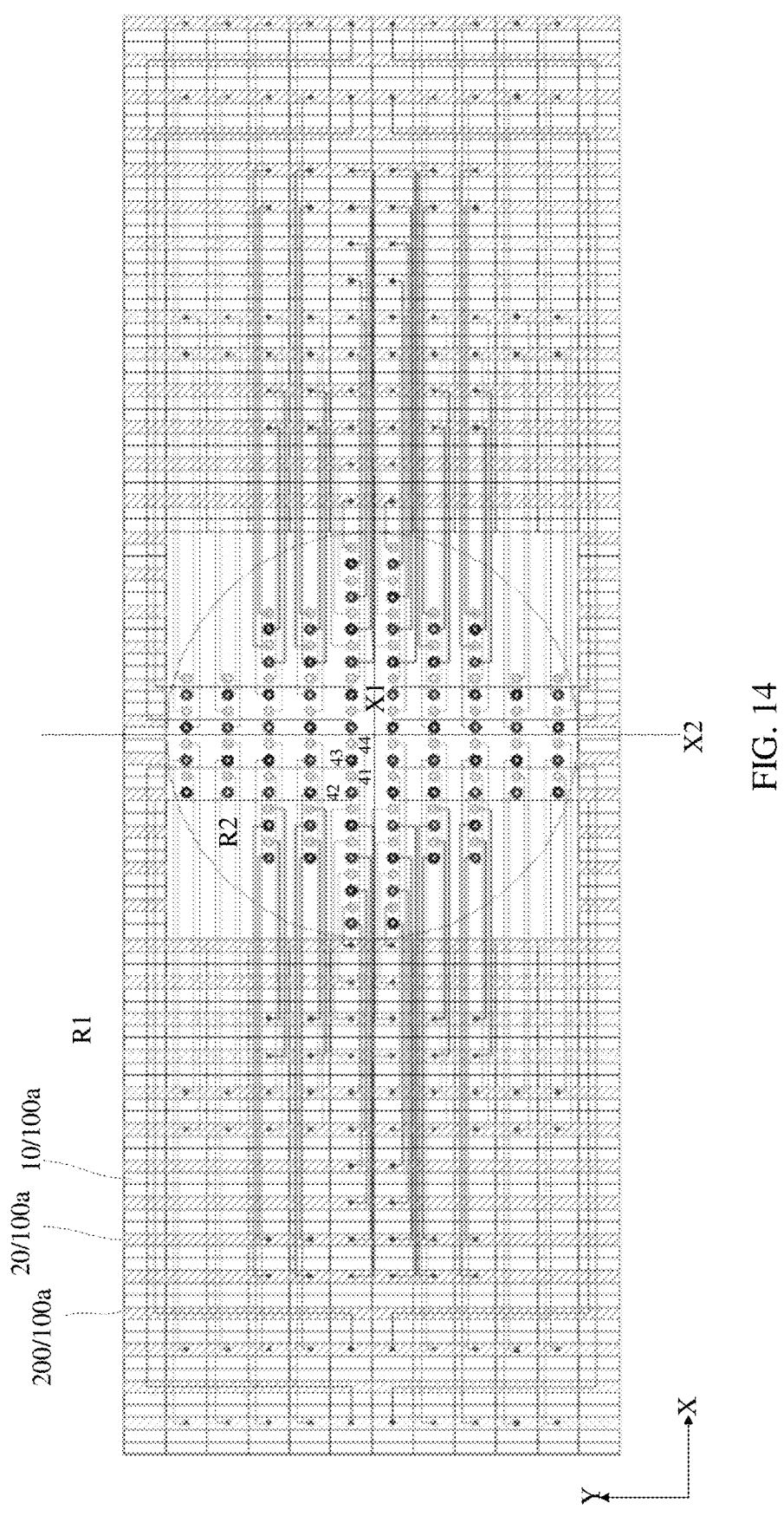
FIG. 14 is a schematic diagram of multiple rows of light-emitting elements located in a second display region and second-type pixel circuits connected thereto in a display panel provided by an embodiment of the present disclosure.
Figure 15:
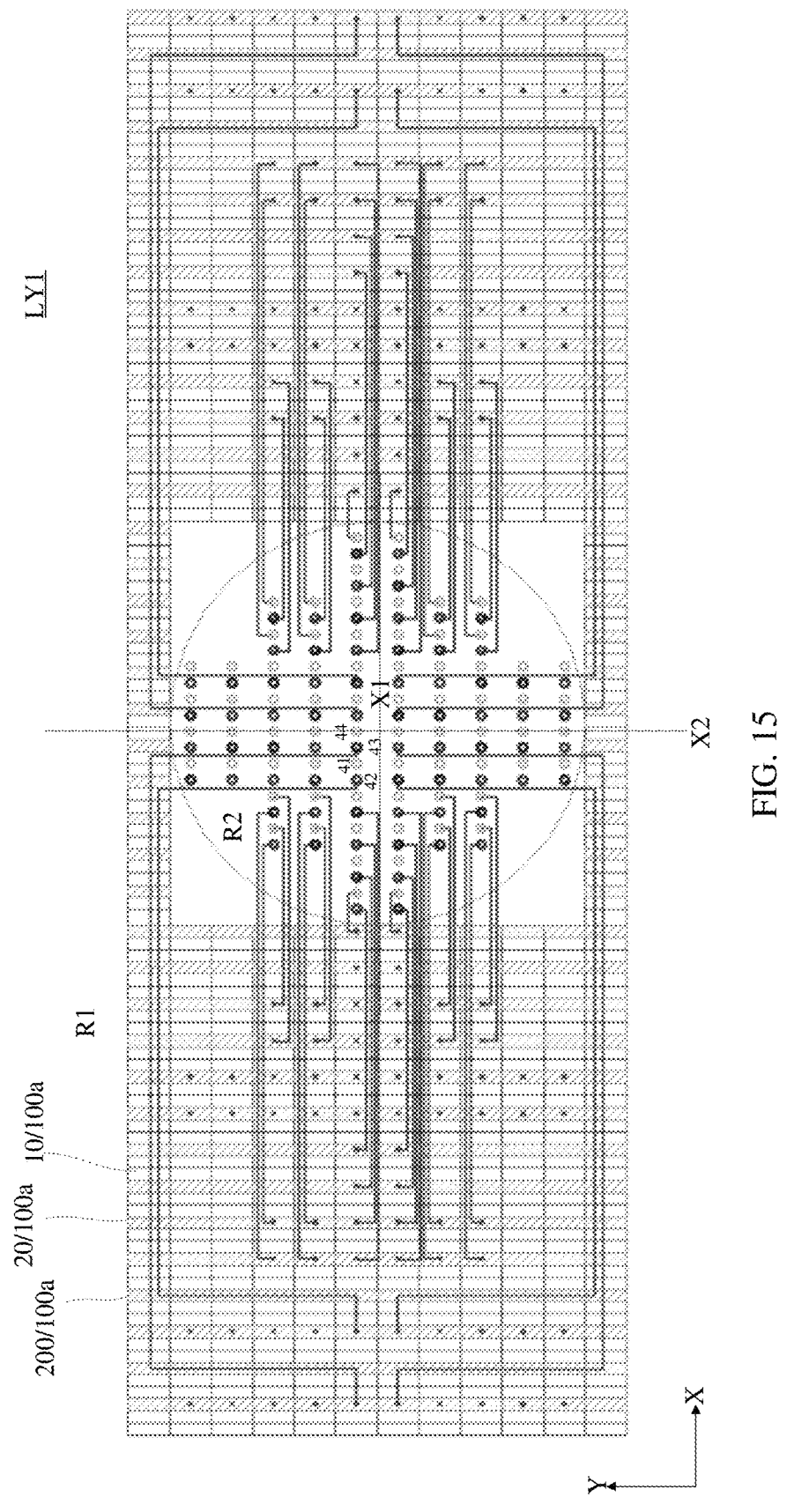
FIG. 15 is a schematic diagram of conductive lines located in the first transparent conductive pattern layer and connected to multiple rows of light-emitting elements in the second display region in a display panel provided by an embodiment of the present disclosure.
Figure 16:
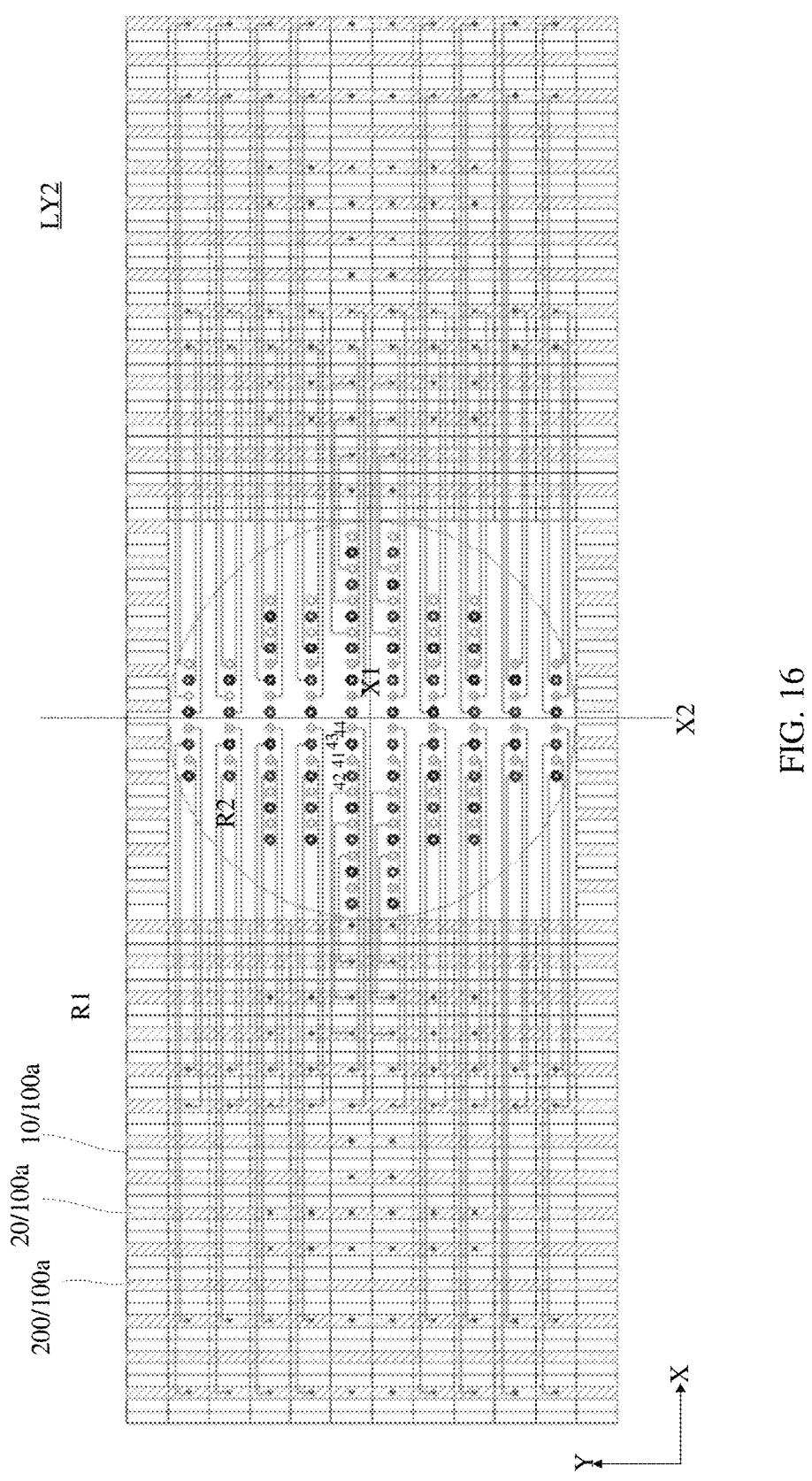
FIG. 16 is a schematic diagram of conductive lines located in the second conductive pattern layer connected to multiple rows of light-emitting elements in the second display region in a display panel provided by an embodiment of the present disclosure.

FIG. 6 is a schematic diagram of light-emitting elements located in a second display region in a display panel provided by an embodiment of the present disclosure. FIG. 7 is a schematic diagram of a row of light-emitting elements located in a second display region and second-type pixel circuits connected thereto in a display panel provided by an embodiment of the present disclosure. FIG. 8 is a schematic diagram of a row of light-emitting elements located in a second display region and second-type pixel circuits connected thereto in a display panel provided by an embodiment of the present disclosure. FIG. 9 is a schematic diagram of two rows of light-emitting elements located in a second display region and second-type pixel circuits connected thereto in a display panel provided by an embodiment of the present disclosure. FIG. 10 is a schematic diagram of a plurality of rows of light-emitting elements located in a second display region and second-type pixel circuits connected thereto in a display panel provided by an embodiment of the present disclosure. FIG. 11 is a schematic diagram of multiple rows of light-emitting elements located in a second display region and second-type pixel circuits connected thereto in a display panel provided by an embodiment of the present disclosure. FIG. 12 is a schematic diagram of a first transparent conductive pattern layer, light-emitting elements, and pixel circuits in a display panel provided by an embodiment of the present disclosure. FIG. 13 is a schematic diagram of a second transparent conductive pattern layer, light-emitting elements, and pixel circuits in a display panel provided by an embodiment of the present disclosure. FIG. 14 is a schematic diagram of a plurality of rows of light-emitting elements located in a second display region and second-type pixel circuits connected thereto in a display panel provided by an embodiment of the present disclosure. FIG. 15 is a schematic diagram of conductive lines in the first transparent conductive pattern layer connected to a plurality of rows of light-emitting elements in the second display region in a display panel provided by an embodiment of the present disclosure. FIG. 16 is a schematic diagram of conductive lines in the second conductive pattern layer connected to a plurality of rows of light-emitting elements in the second display region in a display panel provided by an embodiment of the present disclosure.

For example, in the embodiment of the present disclosure, a row of light-emitting elements may refer to that pixel circuits connected to the row of light-emitting elements are all connected to the same gate line, but it is not limited thereto. For example, in the embodiment of the present disclosure, a row of pixel circuits may refer to that the row of pixel circuits are all connected to the same gate line, but it is not limited thereto. For example, in the embodiment of the present disclosure, a row of pixel units may refer to that the pixel circuits connected to the row of pixel units are all connected to the same gate line, but it is not limited thereto.

For example, as illustrated in FIG. 6 to FIG. 16, in at least one group of light-emitting elements 100*b*, the plurality of second-region light-emitting elements 40 include a plurality of first light-emitting elements 41 and a plurality of second light-emitting elements 42; the first light-emitting element 41 is configured to emit light of a first color; and the second light-emitting element 42 is configured to emit light of a second color. The plurality of second-type pixel circuits 20 include a plurality of first pixel circuits 21 and a plurality of second pixel circuits 22; the plurality of conductive lines L1 include a plurality of first conductive lines La and a plurality of second conductive lines Lb; the plurality of light-emitting elements 41 are connected to the plurality of first pixel circuits 21 through a plurality of first conductive lines La;

and the plurality of second light-emitting elements 42 are connected to the plurality of second pixel circuits 22 through a plurality of second conductive lines Lb. For example, one first light-emitting element 41 is connected to one first pixel circuit 21 through one first conductive line La; and one second light-emitting element 42 is connected to one second pixel circuit 22 through one second conductive line Lb.

For example, as illustrated in FIG. 6 to FIG. 16, the plurality of second-region light-emitting elements 40 further include a plurality of third light-emitting elements 43; the third light-emitting elements 43 are configured to emit light of a third color; the plurality of second-type pixel circuits 20 further include a plurality of third pixel circuits 23; the plurality of conductive lines L1 further include a plurality of third conductive lines Lc; and the plurality of third light-emitting elements 43 are connected to the plurality of third pixel circuits 23 through the plurality of third conductive lines Lc. For example, one third light-emitting element 43 is connected to one third pixel circuit 23 through one third conductive line Lc.

For example, as illustrated in FIG. 6 to FIG. 16, the plurality of second-region light-emitting elements 40 further include a plurality of fourth light-emitting elements 44; the fourth light-emitting elements 44 are configured to emit light of a fourth color; the plurality of second-type pixel circuits 20 further include a plurality of fourth pixel circuits 24; the plurality of conductive lines L1 further include a plurality of fourth conductive lines Ld; and the plurality of fourth light-emitting elements 44 are connected to the plurality of fourth pixel circuits 24 through the plurality of fourth conductive lines Ld. For example, one fourth light-emitting element 44 is connected to one fourth pixel circuit 24 through one fourth conductive line Ld.

For example, the light of a first color and the light of a fourth-color are both green light; one of the light of a second color and the light of a third color is red light; and the other of the light of a second color and the light of a third color is blue light.

For example, the fourth light-emitting element 44 and the first light-emitting element 41 are configured to emit light of the same color. For example, the fourth light-emitting element 44 and the first light-emitting element 41 are configured to emit green light; one of the second light-emitting element 42 and the third light-emitting element 43 is configured to emit red light; and the other of the second light-emitting element 42 and the third light-emitting element 43 is configured to emit blue light. The embodiment of the present disclosure is described by taking that the fourth light-emitting element 44 and the first light-emitting element 41 emit green light, the second light-emitting element 42 emits red light, and the third light-emitting element 43 emits blue light as an example. In other embodiments, the first light-emitting element 41, the second light-emitting element 42, the third light-emitting element 43, and the fourth light-emitting element 44 may also emit light of other colors, which are not limited to the three colors of red, green and blue; and the color of light emitted by the first light-emitting element 41, the second light-emitting element 42, the third light-emitting element 43, and the fourth light-emitting element 44 may be determined as needed.

In the display panel, capacitance difference of the conductive line varies greatly. Due to different lengths of the conductive lines connected to the respective light-emitting elements located in the second display region, capacitance difference of the light-emitting elements emitting light of different colors varies. As compared with capacitance difference of the conductive lines connected to light-emitting elements emitting red light and capacitance difference of the conductive lines connected to light-emitting elements emitting blue light, capacitance difference of the conductive lines connected to light-emitting elements emitting green light is greater. Because the capacitance difference of the conductive lines connected to light-emitting elements emitting green light is greater, light-emitting duration of the light-emitting elements emitting green light is reduced, so that brightness difference of the display panel occurs, resulting in display defect. Stripes appear when the display panel displays. For example, purple stripes appear when the display panel displays. For example, vertical purple stripes appear when the display panel displays. For example, at low gray scales, a defectiveness degree of the light-emitting element emitting green light is greater than a defectiveness degree of the light-emitting element emitting red light; a defectiveness degree of the light-emitting element emitting red light is greater than a defectiveness degree of the light-emitting element emitting blue light. For example, under the same gray scale, a driving current that drives the light-emitting element to emit blue light is greater than a driving current that drives the light-emitting element to emit red light; and a driving current that drives the light-emitting element to emit red light is greater than a driving current that drives the light-emitting element to emit green light.

In the display panel provided by the embodiment of the present disclosure, in order to alleviate display defect, the arrangement order of the second-type pixel circuits connected to light-emitting elements emitting light of different colors is adjusted, to reduce or eliminate display defect caused by large differences in the lengths of the conductive lines. That is, when designing the second-type pixel circuits connected to the first light-emitting element, the lengths of the conductive lines and differences in the lengths of the conductive lines are considered. For example, a G-priority order is adopted. For example, G priority refers to that the second-type pixel circuits connected to the light-emitting element emitting green light is preferentially arranged close to the second display region. Therefore, resistance difference between adjacent pixel units can be optimized, and product competitiveness can be improved.

As illustrated in FIG. 6 to FIG. 16, in the drawings provided by the embodiments of the present disclosure, in the second display region R2, in at least one group of light-emitting elements 100*b*, the second light-emitting element 42, the first light-emitting element 41, the third light-emitting element 43, and the fourth light-emitting element 44 are arranged in order in the first direction X (row direction). For example, as illustrated in FIG. 6 to FIG. 16, the light-emitting element 100*b* includes two types of light-emitting element columns, a first-type light-emitting element column includes first light-emitting elements 41 and fourth light-emitting elements 44, and in the column direction, the first light-emitting elements 41 and the fourth light-emitting elements 44 are alternately arranged, a second-type light-emitting element column includes second light-emitting elements 42 and third light-emitting elements 43, and in the column direction, the second light-emitting elements 42 and the third light-emitting elements 43 are alternately arranged. The arrangement of the light-emitting elements in the first display region R1 may be the same as the arrangement of the light-emitting elements in the second display region R2, which are not limited thereto. Of course, the arrangement of the light-emitting elements provided by the embodiments of the present disclosure is not limited to that illustrated in FIG. 6, and other suitable arrangements can also be adopted as required.

As illustrated in FIG. 6 to FIG. 16, in at least one group of light-emitting elements and at least one group of pixel circuits, the plurality of first pixel circuits 21 connected to the plurality of first light-emitting elements 41 are all closer to the second display region R2 than each of the plurality of second pixel circuits 22 connected to the plurality of second light-emitting elements 42. That is, the arrangement positions of the first pixel circuits 21 connected to the first light-emitting elements 41 are adjusted, which makes that the first pixel circuits 21 connected to the first light-emitting elements 41 are closer to the second display region R2 than other second-type pixel circuits, so that the length difference of the first conductive line La connected to the first light-emitting element 41 is reduced, thereby reducing or avoiding display defect.

For example, in the embodiment of the present disclosure, being in at least one group of light-emitting elements and at least one group of pixel circuits, may refer to being in a row of light-emitting elements 100b passing through two regions, or, may refer to being in a row of pixel units passing through two regions, but it is not limited thereto.

For example, as illustrated in FIG. 6 to FIG. 16, in at least one group of light-emitting elements and at least one group of pixel circuits, no other second-type pixel circuit 20 is provided between two first pixel circuits 21 connected to two adjacent first conductive lines La. Such arrangement is favorable for reducing the lengths of the first conductive lines La, and is also favorable for reducing length difference between the first conductive lines La.

It should be noted that, in the display panel provided by the embodiment of the present disclosure, element A and element B being adjacent to each other, or adjacent element A and element B refers to that between element A and element B, there is no more element A or element B, but there may be other element besides element A and element B. Element A and element B may be the same element or different elements.

For example, as illustrated in FIG. 6 to FIG. 16, in at least one group of light-emitting elements and at least one group of pixel circuits, at least one of the plurality of first-type pixel circuits 10 is arranged between two adjacent second-type pixel circuits 20. For example, in the display panel provided by the embodiments of the present disclosure, in the first direction X, two first-type pixel circuits 10 are arranged between two adjacent second-type pixel circuits 20.

For example, as illustrated in FIG. 6 to FIG. 16, in at least one group of light-emitting elements and at least one group of pixel circuits, the plurality of first pixel circuits 21 connected to the plurality of first conductive lines La are arranged at intervals among the plurality of first-type pixel circuits 10; and the plurality of second pixel circuits 22 connected to the plurality of second conductive lines Lb are arranged at intervals among the plurality of first-type pixel circuits 10.

For example, as illustrated in FIG. 6 to FIG. 16, in at least one group of light-emitting elements and at least one group of pixel circuits, the plurality of first pixel circuits 21 connected to the plurality of first conductive lines La are all closer to the second display region R2 than each of the plurality of third pixel circuits 23 connected to the plurality of third conductive lines Lc.

For example, as illustrated in FIG. 6 to FIG. 16, in order to make the second conductive line Lb have a smaller capacitance difference, and to make the third conductive line Lc have a smaller capacitance difference, in at least one group of light-emitting elements and at least one group of pixel circuits, the plurality of second pixel circuits 22 connected to the plurality of second conductive lines Lb and the plurality of third pixel circuits 23 connected to the plurality of third conductive lines Lc are alternately arranged.

For example, as illustrated in FIG. 6 to FIG. 16, in at least one group of light-emitting elements and at least one group of pixel circuits, the plurality of fourth pixel circuits 24 connected to the plurality of fourth conductive lines Ld are all closer to the second display region R2 than each of the plurality of second pixel circuits 22 connected to the plurality of second conductive lines Lb. In the embodiment of the present disclosure, the fourth light-emitting element 44 and the first light-emitting element 41 emit light of the same color, so the plurality of fourth pixel circuits 24 are also preferentially arranged, that is, the plurality of fourth pixel circuits 24 are arranged closer to the second display region. Of course, in other embodiments, the fourth light-emitting element 44 may not be provided, and thus the fourth pixel circuit 24 does not need to be provided. For example, in this case, the pixels may be in a form of real RGB, but it is not limited thereto.

For example, as illustrated in FIG. 6 to FIG. 16, in order to make the first conductive line La have a smaller capacitance difference and to make the fourth conductive line Ld have a smaller capacitance difference, in at least one group of light-emitting elements and at least one group of pixel circuits, the plurality of fourth pixel circuits 24 connected to the plurality of fourth conductive lines Ld and the plurality of first pixel circuits 21 connected to the plurality of first conductive lines La are alternately arranged.

For example, at least one selected from the group consisting of the first conductive line La, the second conductive line Lb, the third conductive line Lc, and the fourth conductive line Ld is made of a transparent conductive material.

As illustrated in FIG. 6 to FIG. 16, the second display region R2 of the display panel has an axisymmetrical shape, and has a first symmetry axis X1 extending in the first direction X and a second symmetry axis X2 extending in the second direction Y. For example, as illustrated in FIG. 14 to FIG. 16, the plurality of conductive lines L1 are symmetrical with respect to the first symmetry axis X1 and are symmetrical with respect to the second symmetry axis X2. FIG. 6 illustrates that the second display region R2 includes a first sub-region R21, a second sub-region R22, a third sub-region R23, and a fourth sub-region R24. The first sub-region R21 and the second sub-region R22 are symmetrical with respect to the second symmetry axis X2; the third sub-region R23 and the fourth sub-region R24 are symmetrical with respect to the second symmetry axis X2; the first sub-region R21 and the third sub-region R23 are symmetrical with respect to the first symmetry axis X1; and the second sub-region R22 and the fourth sub-region R24 are symmetrical with respect to the first symmetry axis X1. For example, the plurality of second-region light-emitting elements 40 are symmetrical with respect to the first symmetry axis X1 and are symmetrical with respect to the second symmetry axis X2. FIG. 6 illustrates a center CT of the second display region R2.

As illustrated in FIG. 15 and FIG. 16, the display panel includes a first transparent conductive pattern layer LY1 and a second transparent conductive pattern layer LY2, at least one first conductive line La among the plurality of first conductive lines La is located in the second transparent conductive pattern layer LY2, and at least one second conductive line among the plurality of second conductive lines Lb is located in the first transparent conductive pattern layer LY1.

The display panel provided by the embodiments of the present disclosure only includes two transparent conductive pattern layers for forming conductive lines, compared with a display panel including three transparent conductive pattern layers for forming conductive lines, a number of mask plates is reduced, which is beneficial to the production of display panels, is beneficial to reducing the thickness of the display panel, and is beneficial to improving the reliability of the display panel.

FIG. 15 and FIG. 16 are described with reference to the case where a plurality of first conductive lines La are located in the second transparent conductive pattern layer LY2 and a plurality of second conductive lines Lb are located in the first transparent conductive pattern layer LY1, by way of example.

For example, as illustrated in FIG. 7 to FIG. 16, in the display panel provided by the embodiment of the present disclosure, a plurality of first conductive lines La are located between two adjacent groups of light-emitting elements, so as to facilitate the arrangement of the first conductive lines La connected to each row of light-emitting elements. The conductive lines located between two adjacent groups of light-emitting elements may be referred to as horizontal conductive lines. The horizontal conductive line extends from the second display region R2 to the first display region in the first direction X. For example, the plurality of first conductive lines La located between two adjacent groups of light-emitting elements may refer to that the plurality of first conductive lines La are located between center lines of two adjacent groups of light-emitting elements. For example, the center line of each group of light-emitting elements extends in the first direction X. Center lines of adjacent groups of light-emitting elements are arranged in the second direction Y.

For example, as illustrated in FIG. 7 to FIG. 16, the first conductive line La and the fourth conductive line Ld are horizontal conductive lines.

For example, as illustrated in FIG. 9 to FIG. 12 and FIG. 14 to FIG. 15, in the display panel provided by the embodiments of the present disclosure, at least one second conductive line Lb close to the center of the second display region R2 spans at least two groups of light-emitting elements in the second direction Y.

For example, as illustrated in FIG. 9 to FIG. 12 and FIG. 14 to FIG. 15, in the display panel provided by the embodiments of the present disclosure, at least one second conductive line Lb close to the center of the second display region R2 extends from the second display region R2 to the first display region R1 in the second direction Y.

For example, as illustrated in FIG. 9 to FIG. 12 and FIG. 14 to FIG. 15, at least one third conductive line Lc close to the center of the second display region R2 and at least one second conductive line Lb close to the center of the second display region R2 are vertical conductive lines.

For example, in the display panel provided by the embodiments of the present disclosure, the first conductive line La is a conductive line with an integral structure, and the second conductive line Lb is a conductive line with an integral structure.

For example, a part of the third conductive lines Lc among the plurality of third conductive lines Lc is located in the first transparent conductive pattern layer LY1, and the other part of the plurality of third conductive lines Lc is located in the second transparent conductive pattern layer LY2.

For example, as illustrated in FIG. 9 to FIG. 12 and FIG. 14 to FIG. 15, in the display panel provided by the embodiments of the present disclosure, at least one third conductive line Lc close to the center of the second display region R2 spans at least two groups of light-emitting elements in the second direction Y.

For example, as illustrated in FIG. 9 to FIG. 12 and FIG. 14 to FIG. 15, in the display panel provided by the embodiments of the present disclosure, at least one third conductive line Lc close to the center of the second display region R2 extends from the second display region R2 to the first display region R1 in the second direction Y, conductive lines of this form can be referred to as vertical conductive lines. The vertical conductive lines extend from the second display region R2 to the first display region R1 in the second direction Y.

For example, as illustrated in FIG. 7 to FIG. 16, in the display panel provided by the embodiment of the present disclosure, in at least one group of light-emitting elements and at least one group of pixel circuits, the first conductive line La connected to the group of light-emitting elements is located on a first side of the group of light-emitting elements, the second conductive line Lb and the third conductive line Lc that are connected to the group of light-emitting elements are located on a second side of the group of light-emitting elements, and the first side and the second side are opposite sides of the group of light-emitting elements.

For example, as illustrated in FIG. 7 to FIG. 16, in the display panel provided by the embodiment of the present disclosure, in at least one group of light-emitting elements and at least one group of pixel circuits, for example, for several groups of light-emitting elements close to the upper edge of the second display region R2, the first conductive line La and the fourth conductive line Ld that are connected to the group of light-emitting elements are located on the first side of the group of light-emitting elements, the second conductive line Lb and the third conductive line Lc that are connected to the group of light-emitting elements are located on the second side of the group of light-emitting elements, and the first side and the second side are opposite sides of the group of light-emitting elements.

For example, as illustrated in FIG. 7 to FIG. 16, the first side and the second side of a group of light-emitting elements are the upper side and the lower side of the group of light-emitting elements, respectively.

For example, in the display panel provided by the embodiments of the present disclosure, the third conductive line Lc is a conductive line with an integral structure.

For example, in the display panel provided by the embodiments of the present disclosure, the fourth conductive line Ld is a conductive line with an integral structure.

For example, in the embodiment of the present disclosure, the first conductive line La, the second conductive line Lb, the third conductive line Lc, and the fourth conductive line Ld are respectively conductive lines with an integral structure. That is, each conductive line L1 is an integrated conductive line, which is formed of a layer of conductive film, and does not need to be formed in sections.

For example, as illustrated in FIG. 9 to FIG. 12, in the display panel provided by the embodiments of the present disclosure, at least one group of the plurality of groups of pixel circuits includes a dummy pixel circuit 200, the dummy pixel circuit 200 is located between two second-type pixel circuits 20 in the first direction X, an orthographic projection of at least one of the second conductive line Lb close to the center of the second display region R2 and the third conductive line Lc close to the center of the second display region R2 on the base substrate overlaps with an orthographic projection of the dummy pixel circuit on the base substrate.

For example, the dummy pixel circuit 200 is not connected to any light-emitting element. For example, the dummy pixel circuit 200 is not connected to the conductive line L1. For example, the dummy pixel circuit 200 may be a second-type pixel circuit 20, but not connected to the conductive line L1. That is, a part of columns, for example, several columns, may be selected from the second-type pixel circuits as dummy pixel circuit columns.

FIG. 9 to FIG. 12 illustrate vertical conductive lines, the vertical conductive lines include a second conductive line Lb0 close to the center of the second display region and a third conductive line Lc0 close to the center of the second display region. For example, the second conductive line Lb0 and the third conductive line Lc0 are located in the first transparent conductive pattern layer LY1.

For example, as illustrated in FIG. 9 to FIG. 12, in the display panel provided by the embodiments of the present disclosure, the second conductive line Lb close to the center of the second display region R2 and the third conductive line Lc close to the center of the second display region include a first part P1, a second part P2, a third part P3, and a fourth part P4 that are connected in sequence, the second part P2 and the fourth part P4 extend in the first direction X, and the first part P1 and the third part P3 extend in the second direction Y.

For example, as illustrated in FIG. 9 to FIG. 12, in the display panel provided by the embodiments of the present disclosure, an orthographic projection of the third part P3 on the base substrate overlaps with an orthographic projection of the dummy pixel circuit 200 on the base substrate.

For example, as illustrated in FIG. 9 to FIG. 12, in the display panel provided by the embodiments of the present disclosure, the fourth part P4 and the second part P2 are located on two different sides of the third part P3.

For example, as illustrated in FIG. 7 to FIG. 16, in the display panel provided by the embodiment of the present disclosure, the orthographic projection of the part of the first conductive line La extending in the first direction X on the base substrate does not overlap with the orthographic projection of the part of the second conductive line Lb extending in the first direction X on the base substrate, but is not limited to this. Of course, in other embodiments, the orthographic projections of the parts of the conductive lines L1 extending in the first direction X on the base substrate may also overlap with each other.

For example, in the embodiments of the present disclosure, the orthographic projections of the parts of the conductive lines L1 extending in the first direction X on the base substrate do not overlap with each other.

As illustrated in FIG. 9 to FIG. 12, the second conductive line Lb0 and the third conductive line Lc0 are located in the same layer, both located in the first transparent conductive pattern layer LY1, an orthographic projection of the part (first part P1) of the second conductive line Lb0 located in the second display region R2 on the base substrate overlaps with the orthographic projection of the conductive line (horizontal conductive line) located in the second transparent conductive pattern layer LY2 on the base substrate. As a further example, the orthographic projection of the part (first part P1) of the second conductive line Lb0 located in the second display region R2 on the base substrate overlaps with the orthographic projection of the part of the conductive line extending in the direction X and located in the second transparent conductive pattern layer LY2 on the base substrate. The orthographic projection of the part (first part P1) of the second conductive line Lb0 located in the second display region R2 on the base substrate overlaps with the orthographic projection of the horizontal conductive line (conductive line located in the second transparent conductive pattern layer LY2) on the base substrate.

For example, as illustrated in FIG. 9 to FIG. 12, the orthographic projection of the part (the first part P1) of the third conductive line Lc0 located in the second display region R2 on the base substrate overlaps with the orthographic projection of the conductive line (horizontal conductive line) located in the second transparent conductive pattern layer LY2 on the base substrate. As a further example, the orthographic projection of the part (first part P1) of the third conductive line Lc0 located in the second display region R2 on the base substrate overlaps with the orthographic projection of the portion of the conductive line extending in the direction X and located in the second transparent conductive pattern layer LY2 on the base substrate.

For example, in the display panel provided by the embodiments of the present disclosure, the fourth light-emitting element 44 and the first light-emitting element 41 are configured to emit green light, one of the second light-emitting element 42 and the third light-emitting element 43 is configured to emit red light, and the other one of the second light-emitting element 42 and the third light-emitting element 43 is configured to emit blue light.

As illustrated in FIG. 6 to FIG. 16, in the upper left quarter region (first sub-region R21) of the second display region R2, a group of light-emitting elements closest to the first symmetry axis X1 is referred to as the first row of light-emitting elements, and from bottom to top are the second row to the Nth row of light-emitting elements.

Referring to FIG. 7, in at least one group of light-emitting elements (the second row of light-emitting elements illustrated in FIG. 7, the r2 row of light-emitting elements), the light-emitting elements close to the center CT of the second display region R2 are connected to the conductive lines in the second transparent conductive pattern layer LY2, the light-emitting elements close to the edge of the second display region R2 are connected to the conductive lines in the first transparent conductive pattern layer LY1. In at least one group of light-emitting elements, the connection of the group of light-emitting elements can be completed by using horizontal conductive lines. The light-emitting elements close to the center of the second display region R2 include a first light-emitting element 41, a second light-emitting element 42, a third light-emitting element 43, and a fourth light-emitting element 44, that is, the light emitting colors of the light-emitting elements are not distinguished, as long as the light-emitting elements are close to the center of the second display region R2, the light-emitting elements are connected to the conductive lines located in the second transparent conductive pattern layer LY2. Similarly, the light-emitting elements close to the edge of the second display region R2 include a first light-emitting element 41, a second light-emitting element 42, a third light-emitting element 43, and a fourth light-emitting element 44, that is, the light emitting colors of the light-emitting elements are not distinguished, as long as the light-emitting elements are close to the edge of the second display region R2, the light-emitting elements are connected to the conductive lines in the first transparent conductive pattern layer LY1. The light-emitting elements close to the center CT of the second display region R2 can also be regarded as the light-emitting elements close to the second symmetry axis X2 of the second display region R2. Considering that the light-emitting elements close to the center CT of the second display region R2 (the first row of light-emitting elements illustrated in FIG. 9, the r1 row of light-emitting elements) may need to be connected to the vertical conductive lines (conductive line Lb0 and conductive line Lc0), then, in order to provide a location for the vertical conductive lines in the first transparent conductive pattern layer LY1, the light-emitting elements close to the center CT of the second display region R2 are connected to the conductive lines in the second transparent conductive pattern layer LY2. FIG. 9 illustrates light-emitting elements in rows r1 to r5 in the first sub-region R21.

As illustrated in FIG. 9, at least one group of light-emitting elements includes two sub-groups of light-emitting elements, that is, including a first sub-group of light-emitting elements G01 and a second sub-group of light-emitting elements G02, the first sub-group of light-emitting elements G01 is closer to the edge of the second display region R2 than the second sub-group of light-emitting elements G02, or the second sub-group of light-emitting elements G02 is closer to the center of the second display region R2 than the first sub-group of light-emitting elements G01.

As illustrated in FIG. 9, in at least one group of light-emitting elements, for example, the r1 row of light-emitting elements may be referred to as the first group of light-emitting elements G1, the conductive lines L1 connected to the light-emitting elements (including the second light-emitting element 42 and the third light-emitting element 43) in the first sub-group of light-emitting elements G01 are located in the first transparent conductive pattern layer LY1, and the conductive lines L1 connected to the light-emitting elements (including the first light-emitting element 41 and the fourth light-emitting element 44) in the first sub-group of light-emitting elements G01 are located in the second transparent conductive pattern layer LY2; the conductive lines L1 connected to the light-emitting elements (including the second light-emitting element 42 and the third light-emitting element 43) in the second sub-group of light-emitting elements G02 are located in the first transparent conductive pattern layer LY1, and the conductive lines L1 connected to the light-emitting elements (including the first light-emitting element 41 and the fourth light-emitting element 44) in the second sub-group of light-emitting elements G02 are located in the second transparent conductive pattern layer LY2.

As illustrated in FIG. 9, in at least one group of light-emitting elements, for example, the r2 row of light-emitting elements may also be referred to as the second group of light-emitting elements G2, the first group of light-emitting elements G1 is closer to the center CT of the second display region than the second group of light-emitting elements G2, or the first group of light-emitting elements G1 is closer to the first symmetry axis X1 than the second group of light-emitting elements G2. The conductive lines L1 connected to the light-emitting elements in the first sub-group of light-emitting elements G01 (including the first light-emitting element 41, the second light-emitting element 42, the third light-emitting element 43, and the fourth light-emitting element 44) are all located in the first transparent conductive pattern layer LY1, the conductive lines L1 connected to the light-emitting elements (including the first light-emitting element 41, the second light-emitting element 42, the third light-emitting element 43, and the fourth light-emitting element 44) in the second sub-group of light-emitting elements G02 are all located in the second transparent conductive pattern layer LY2.

FIG. 9 is a schematic diagram of the conductive lines in FIG. 8 plus the conductive lines in FIG. 7 plus the vertical conductive lines. There are more light-emitting elements close to the center of the second display region, thus involving vertical conductive lines.

As illustrated in FIG. 8 and FIG. 9, in at least one group of light-emitting elements, for the conductive lines L1 connected to the first light-emitting element 41 and the fourth light-emitting element 44 (G pixel unit), starting from the center of the second display region R2, conductive lines located in the second transparent conductive pattern layer LY2 are used, and the rest are conductive lines located in the first transparent conductive pattern layer LY1. For the conductive lines located in the second transparent conductive pattern layer LY2, the conductive lines are distributed on two sides of the group of light-emitting elements; for the conductive lines L1 connected to the second light-emitting element 42 and the third light-emitting element 43 (B pixel unit and R pixel unit), the connection starts from the edge of the second display region R2, and the conductive lines ITO1 located in the first transparent conductive pattern layer LY1 are adopted until the horizontal conductive lines is used up.

As illustrated in FIG. 8 and FIG. 9, the second-type pixel circuits connected to the first light-emitting element 41 and the fourth light-emitting element 44 (G pixel unit) are closer to the second display region R2 than the second-type pixel circuits connected to the second light-emitting element 42 and the third light-emitting element 43, only the second light-emitting element 42 and the third light-emitting element 43 remain in the center of the second display region R2, and the second light-emitting element 42 and the third light-emitting element 43 close to the center of the second display region are connected to the second-type pixel circuits at the farthest end by vertical conductive lines, which conforms to the law of gradual change.

Figure 17:
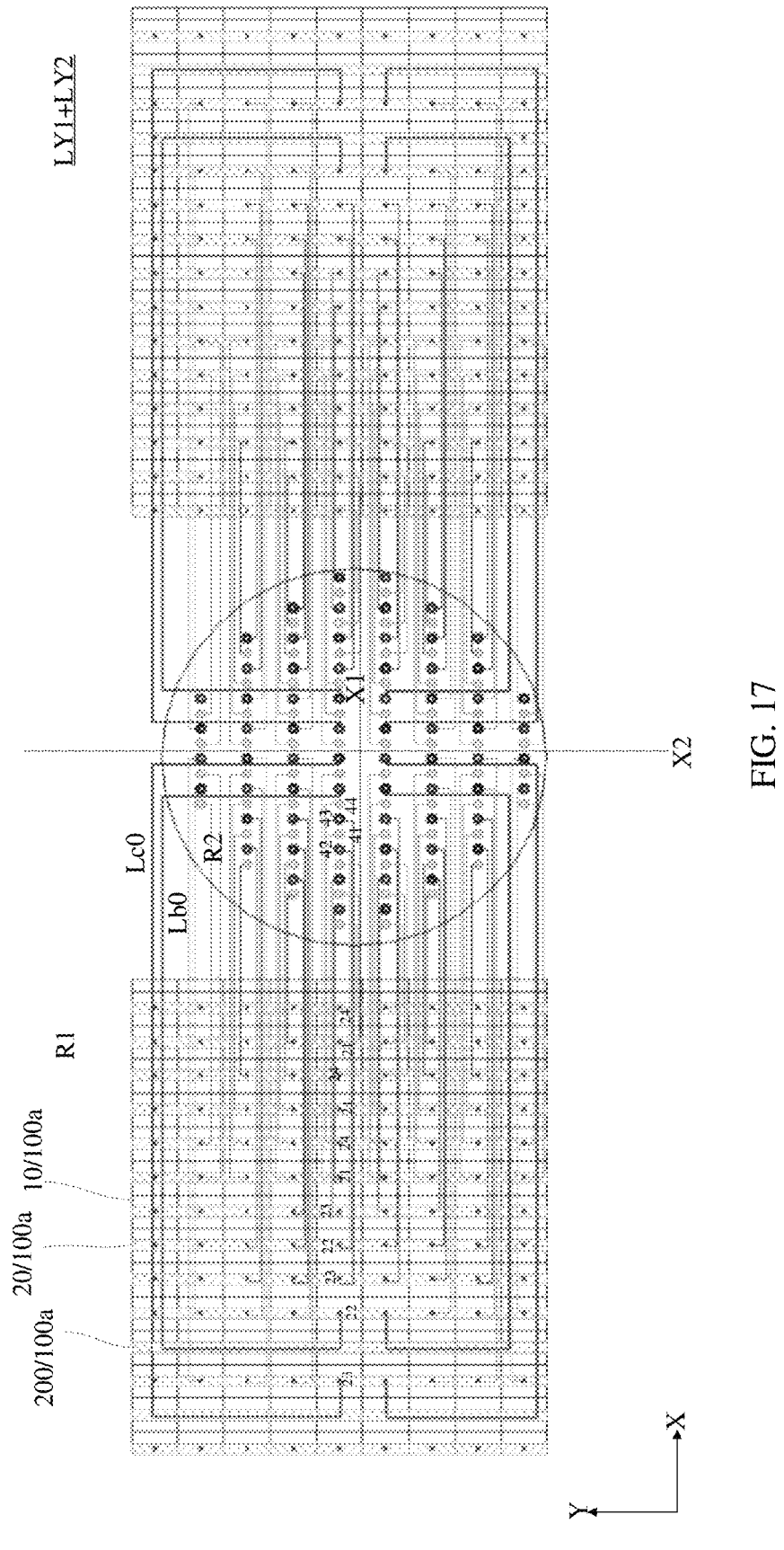
FIG. 17 is a schematic diagram of multiple rows of light-emitting elements located in a second display region and second-type pixel circuits connected thereto in a display panel provided by an embodiment of the present disclosure.
Figure 18:
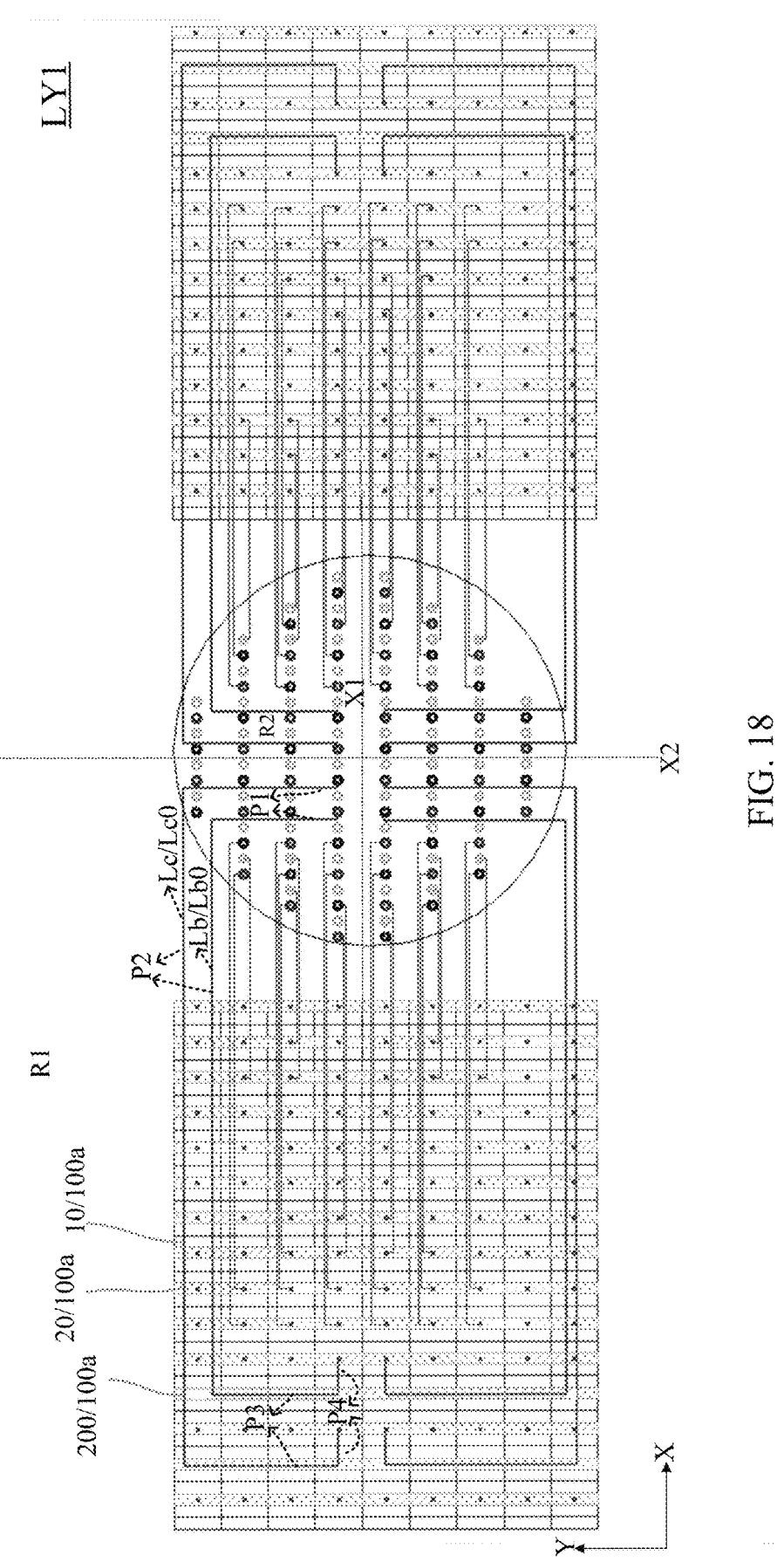
FIG. 18 is a schematic diagram of a first transparent conductive pattern layer in a display panel provided by an embodiment of the present disclosure.
Figure 19:
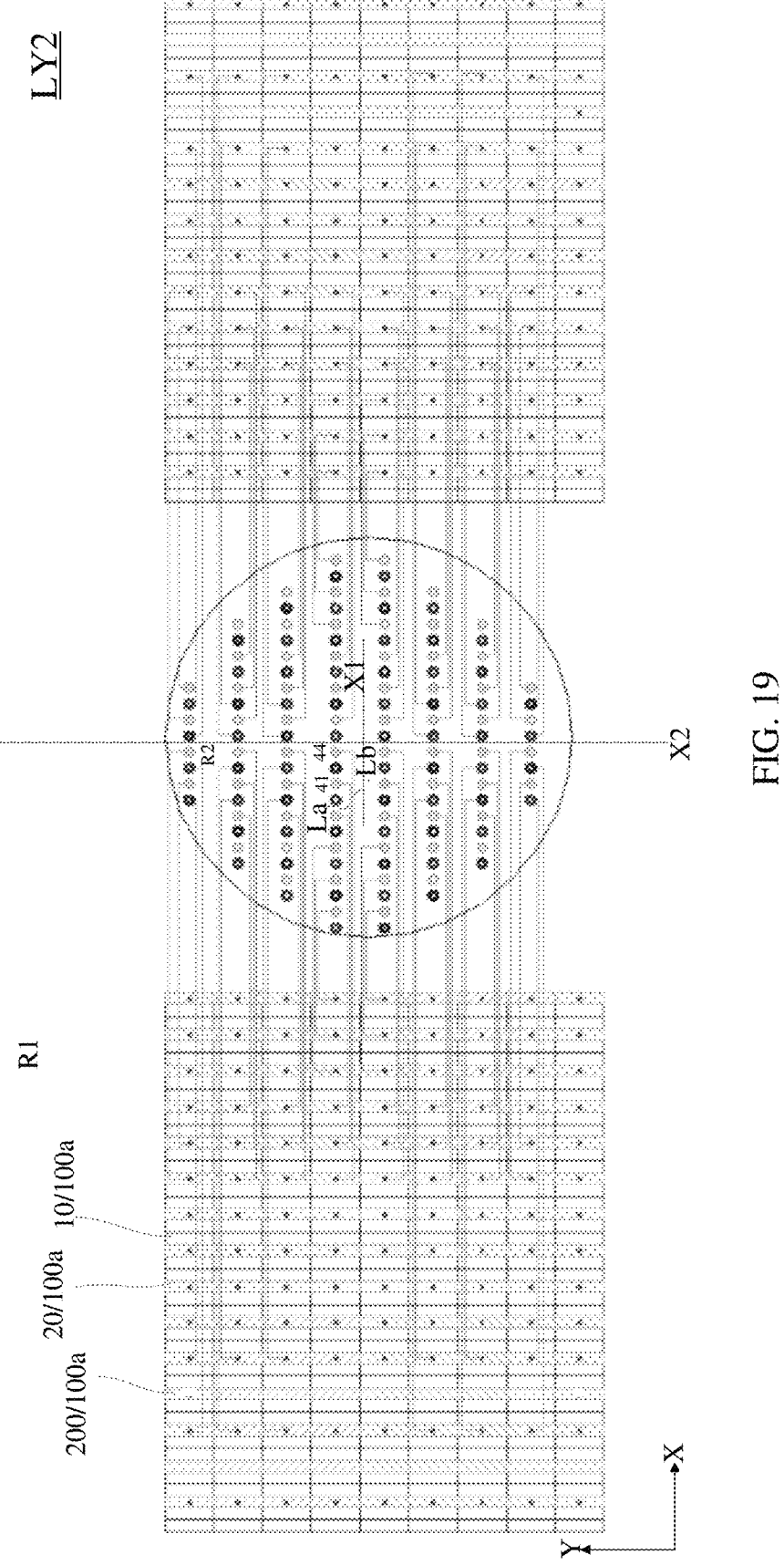
FIG. 19 is a schematic diagram of a second transparent conductive pattern layer in a display panel provided by an embodiment of the present disclosure.
Figure 20:
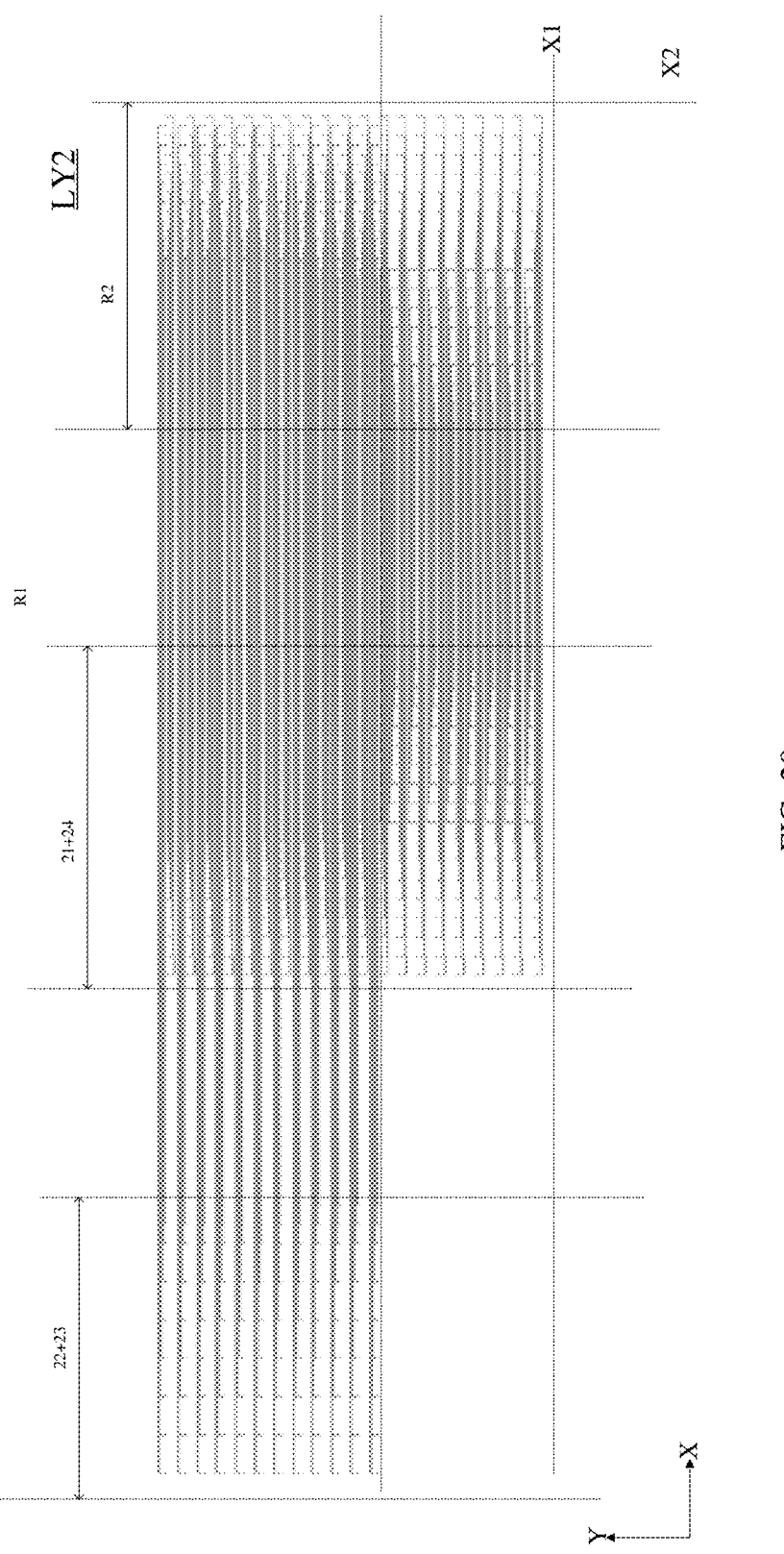
FIG. 20 is a schematic diagram of a second transparent conductive pattern layer in a display panel provided by an embodiment of the present disclosure.
Figure 21:
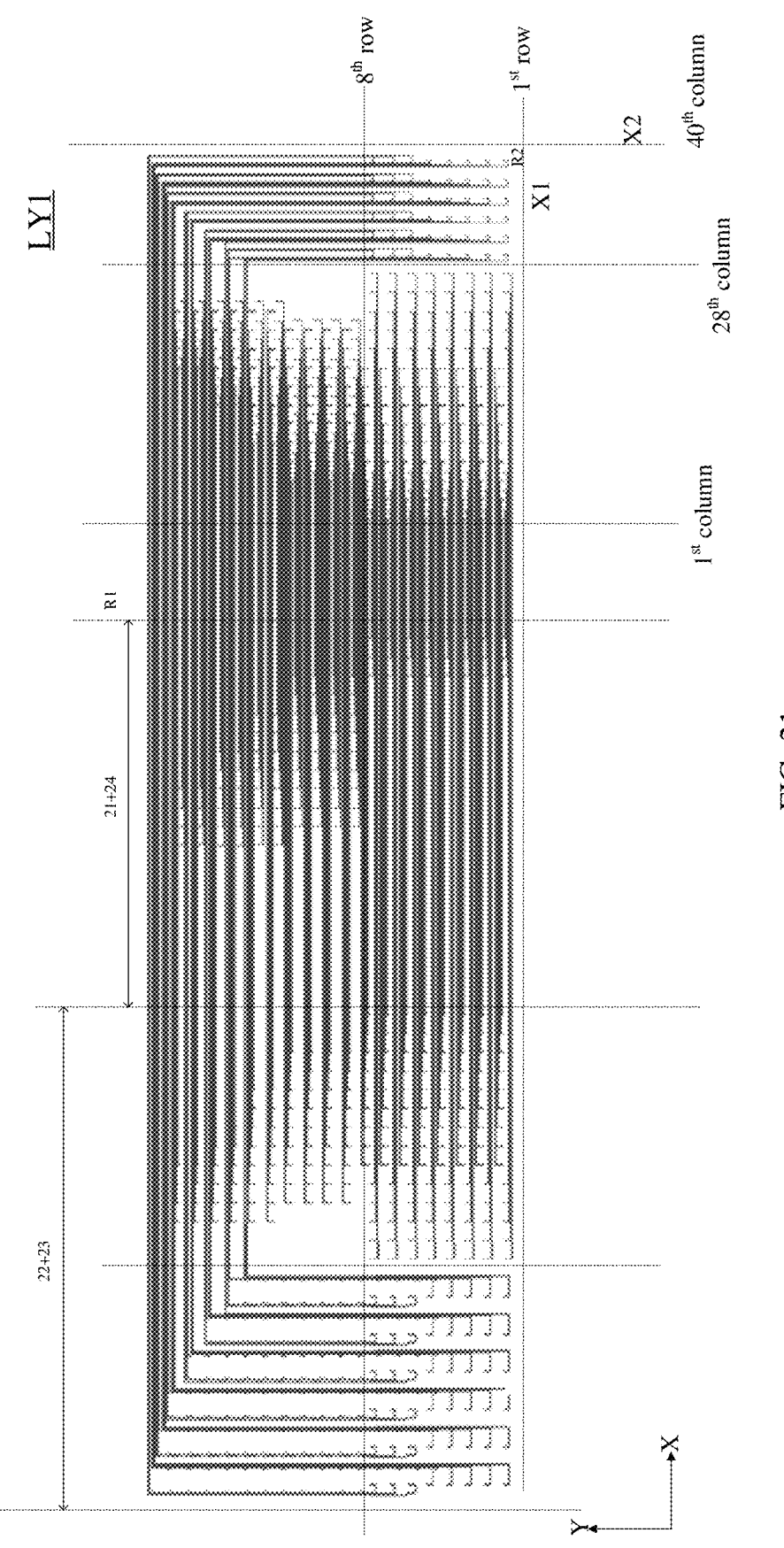
FIG. 21 is a schematic diagram of a first transparent conductive pattern layer in a display panel provided by an embodiment of the present disclosure.

FIG. 17 is a schematic diagram of a plurality of rows of light-emitting elements located in a second display region and second-type pixel circuits connected thereto in a display panel provided by an embodiment of the present disclosure. FIG. 18 is a schematic diagram of a first transparent conductive pattern layer in a display panel provided by an embodiment of the present disclosure. FIG. 19 is a schematic diagram of a second transparent conductive pattern layer in a display panel provided by an embodiment of the present disclosure. FIG. 20 is a schematic diagram of a second transparent conductive pattern layer in a display panel provided by an embodiment of the present disclosure. FIG. 21 is a schematic diagram of a first transparent conductive pattern layer in a display panel provided by an embodiment of the present disclosure.

For example, as illustrated in FIG. 17 to FIG. 19, in the display panel provided by the embodiment of the present disclosure, a part of the first conductive lines La among the plurality of first conductive lines La is located in the second transparent conductive pattern layer LY2, and the other part of the plurality of first conductive lines La is located in the first transparent conductive pattern layer LY1.

For example, as illustrated in FIG. 17 to FIG. 19, in the display panel provided by the embodiment of the present disclosure, a part of the plurality of second conductive lines Lb is located in the second transparent conductive pattern layer LY2, the other part of the plurality of second conductive lines Lb is located in the first transparent conductive pattern layer LY1.

For example, as illustrated in FIG. 17 to FIG. 19, in the display panel provided by the embodiment of the present disclosure, a part of the fourth conductive lines Ld among the plurality of fourth conductive lines Ld is located in the second transparent conductive pattern layer LY2, and the other part of the fourth conductive lines Ld among the plurality of fourth conductive lines Ld is located in the first transparent conductive pattern layer LY1.

As illustrated in FIG. 17, in at least one group of light-emitting elements and at least one group of pixel circuits, some first conductive lines La and fourth conductive lines Ld close to the second symmetry axis X2 are located in the second transparent conductive pattern layer LY2, and some first conductive lines La and fourth conductive lines Ld away from the second symmetry axis X2 are located in the first transparent conductive pattern layer LY1.

For example, as illustrated in FIG. 18, in the display panel provided by the embodiment of the present disclosure, the fourth part P4 and the second part P2 are located on the same side of the third part P3.

FIG. 19 and FIG. 20 illustrate the conductive lines L1 in the first transparent conductive pattern layer LY1 and the conductive lines L1 in the second transparent conductive pattern layer LY2. The second light-emitting element and the third light-emitting element that are close to the center of the second display region are connected to the second-type pixel circuits through conductive lines spanning at least two groups of light-emitting elements in the second direction Y. The conductive lines spanning at least two groups of light-emitting elements in the second direction Y are located in the first transparent conductive pattern layer LY1.

For example, as illustrated in FIG. 17 to FIG. 19, the pixel circuit is designed in a manner of two column plus one column, that is, two first-type pixel circuits are arranged between adjacent second-type pixel circuits, and the extra one column of pixel circuit is the second-type pixel circuit.

The case where first light-emitting element and the fourth light-emitting element emit green light, the second light-emitting element emits red light, and the third light-emitting element emits blue light are taken as an example.

For example, taking the upper left corner of the second display region including 40 columns of pixel units as an example, at the uppermost end of the second display region, the pixel units in the $28^{th}$ to the $40^{th}$ columns all preferentially use the second transparent conductive pattern layer LY2, that is, the $19^{th}$ and the $20^{th}$ rows of light-emitting elements preferentially use the conductive lines located in the second transparent conductive pattern layer LY2, in the $18^{th}$ row and the row less than eighteenth, after the space of the conductive lines of the second transparent conductive pattern layer LY2 is insufficient, the conductive lines located in the first transparent conductive pattern layer LY1 are used to connect the pixel units in the $1^{st}$ column to the $27^{th}$ column; in the $1^{st}$ to $8^{th}$ rows of light-emitting elements, due to influence of the line width and spacing of the conductive lines of the first transparent conductive pattern layer LY1 and the second transparent conductive pattern layer LY2, the connection method of the horizontal conductive lines is no longer sufficient for the connection of the pixel units, in this case, the conductive lines located in the second transparent conductive pattern layer LY2 are preferentially used to connect the G pixel units in the $28^{th}$ to $40^{th}$ columns, for the remaining 6 columns of R/G pixel units, the light-emitting elements in the $1^{st}$ to $27^{th}$ columns are sequentially connected by conductive lines located in the first transparent conductive pattern layer LY1 and the second transparent conductive pattern layer LY2. A total of 6 columns and 8 rows of R/B pixel units are remained, and the R/B pixel units are vertically connected by using conductive lines located in the first transparent conductive pattern layer LY1. For example, in a case that the 6 columns and 8 rows of R/B pixel units are connected to the pixel circuits using conductive lines, a column of dummy pixel circuits is provided between two adjacent second-type pixel circuits, the dummy pixel circuit is not arranged with a via hole VH penetrating the planarization layer, and for the conductive lines of the 6 columns and 8 rows of R/B pixel units, and a routing manner of the conductive lines is illustrated in FIG. 21.

From the simulation data, taking the first row of pixels as an example, the capacitance of the shortest conductive line of the G pixel unit is 49.24fF, and the capacitance of the longest conductive line of the G pixel unit is 320.87fF, a ratio of the maximum value to the minimum value is 6.51; the capacitance of the shortest conductive line of the R pixel unit is 186.56fF, and the capacitance of the longest conductive line of the R pixel unit is 730.65fF, the capacitance of the shortest conductive line of the B pixel unit is 201.56fF, and the capacitance of the longest conductive line of the B pixel unit is 759.08fF, due to the method that G is priority arranged is used, the length of the conductive line of the R/B pixel unit is greater than the length of the conductive line of the G pixel unit, thus the difference between the maximum value and the minimum value of the capacitance of the R pixel unit and the B pixel unit can be reduced. Moreover, the ratios of the maximum and minimum values of the R and B pixel units are 3.9 and 3.7, respectively. If the conductive lines of the R/G/B pixel units are connected sequentially, and the method that G is priority arranged is not used, the ratios of the maximum value and minimum value of the conductive lines are 14.2, 12, 10, respectively, compared with the sequential connection design of the conductive lines of the RGB pixel units, the display panel provided by the embodiments of the present disclosure adopts the G-priority arranging mode, which can reduce the difference between the maximum value and the minimum value of the capacitance of the R/G/B pixel unit, and the arranging mode is more conducive to algorithm compensation and improves the display effect. Moreover, the display panel provided by the embodiment of the present disclosure only uses two transparent conductive pattern layers to form conductive lines, compared with the original mode of forming conductive lines with three transparent conductive pattern layers, the production cost can be further reduced.

In the drawings provided by the embodiments of the present disclosure, the relatively light-colored conductive lines are the conductive lines located in the second transparent conductive pattern layer LY2, and the relatively dark-colored conductive lines are the conductive lines located in the first transparent conductive pattern layer LY1.

Figure 22:
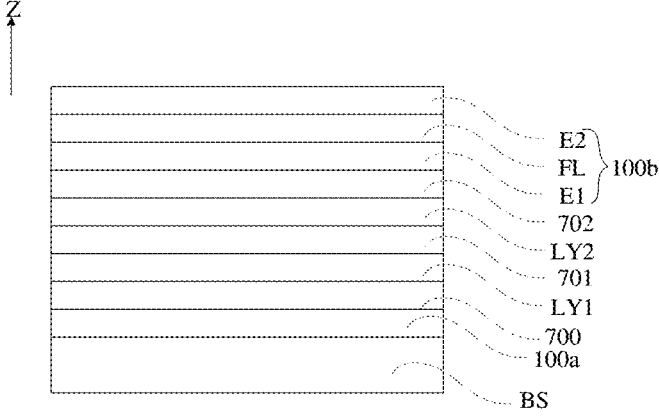
FIG. 22 is a schematic diagram of a layer structure of a display panel provided by an embodiment of the present disclosure.

FIG. 22 is a schematic diagram of a layer structure of a display panel provided by an embodiment of the present disclosure. As illustrated in FIG. 22, the pixel circuit 100a is located on the base substrate BS, the insulating layer 700 is located on the pixel circuit 100a, the first transparent conductive pattern layer LY1 is located on the insulating layer 700, the insulating layer 701 is located on the first transparent conductive pattern layer LY1, the second transparent conductive pattern layer LY2 is located on the insulating layer 701, the insulating layer 702 is located on the second transparent conductive pattern layer LY2, and the light-emitting element 100b is located on the insulating layer 702. The light-emitting element 100b includes a first electrode E1, a second electrode E2, and a light-emitting functional layer FL located between the first electrode E1 and the second electrode E2. The first electrode E1 is closer to the base substrate BS than the second electrode E2.

In the embodiments of the present disclosure, the number of light-emitting elements is not limited to that illustrated in the figure, which can be provided as required.

Figure 23:
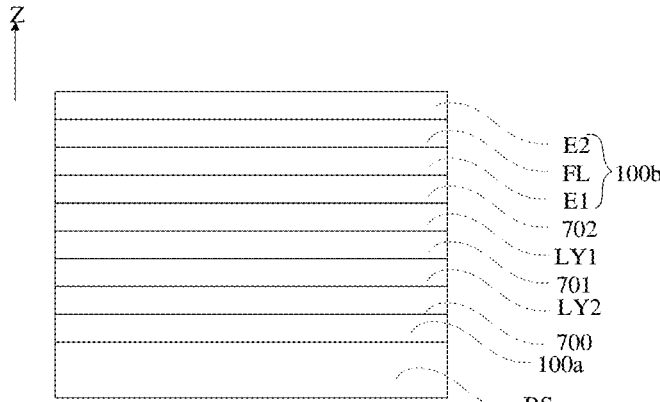
FIG. 23 is a schematic diagram of a layer structure of a display panel provided by an embodiment of the present disclosure.

FIG. 23 is a schematic diagram of a layer structure of a display panel provided by an embodiment of the present disclosure. Compared with the display panel illustrated in FIG. 22, the positions of the second transparent conductive pattern layer LY2 and the first transparent conductive pattern layer LY1 are exchanged.

For example, as illustrated in FIG. 22, in the display panel provided by the embodiment of the present disclosure, the first transparent conductive pattern layer LY1 is closer to the base substrate BS than the second transparent conductive pattern layer LY2.

For example, as illustrated in FIG. 23, in the display panel provided by the embodiment of the present disclosure, the second transparent conductive pattern layer LY2 is closer to the base substrate BS than the first transparent conductive pattern layer LY1.

FIG. 22 and FIG. 23 illustrate the stacking of the film layers, without illustrating the connection relationship between the components of the layer structures.

Figure 24:
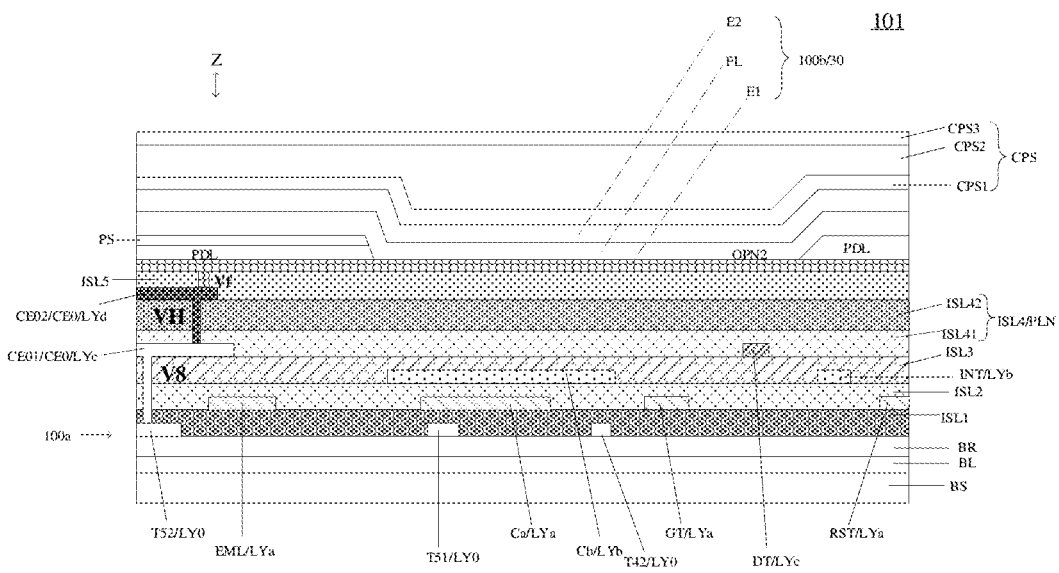
FIG. 24 is a schematic diagram of a first pixel unit in a display panel provided by an embodiment of the present disclosure.
Figure 25:
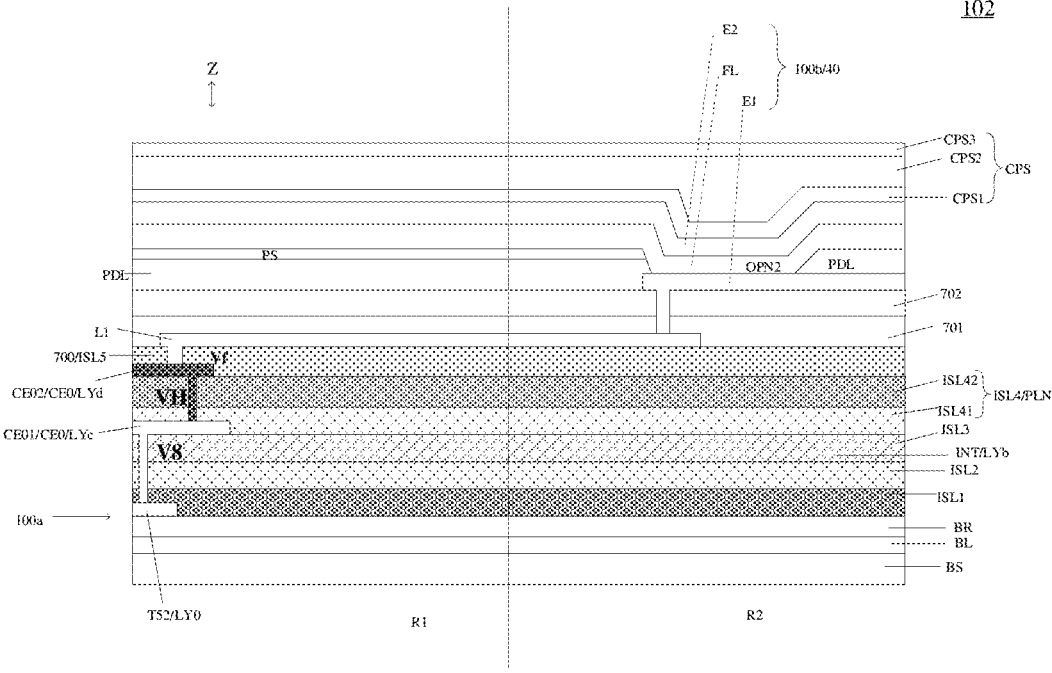
FIG. 25 is a schematic diagram of a second pixel unit in a display panel provided by an embodiment of the present disclosure.

FIG. 24 is a schematic diagram of a first pixel unit in a display panel provided by an embodiment of the present disclosure. FIG. 24 illustrates the first pixel unit 101. FIG. 25 is a schematic diagram of a second pixel unit in a display panel provided by an embodiment of the present disclosure. FIG. 24 illustrates the first pixel unit 101.

As illustrated in FIG. 24, a buffer layer BL is arranged on the base substrate BS, and an isolation layer BR is arranged on the buffer layer BL, an active layer LY0 is arranged on the isolation layer BR, an insulating layer ISL1 is arranged on the active layer LY0, a conductive layer LYa is arranged on the insulating layer ISL1, an insulating layer ISL2 is arranged on the conductive layer LYa, a conductive layer LYb is arranged on the insulating layer ISL2, an insulating layer ISL3 is arranged on the conductive layer LYb, and a conductive layer LYc is arranged on the insulating layer ISL3, the conductive layer LYc includes a connecting electrode CE01, and the connecting electrode CE01 is connected to a second electrode T52 of the light-emitting control transistor T5 through a via hole V8 penetrating the insulating layer ISL1, the insulating layer ISL2, and the insulating layer ISL3, an insulating layer ISL4 and an insulating layer ISL5 are arranged on the conductive layer LYc, and a conductive layer LYd is arranged on the insulating layer ISL4 and the insulating layer ISL5, the conductive layer LYd includes a connecting electrode CE02, and the connecting electrode CE02 is connected to the connecting electrode CE01 through a via hole V32 penetrating the fourth insulating layer ISL4, the fifth insulating layer ISL5 is arranged on the fourth conductive layer LYd, the light-emitting element 100b (first-region light-emitting element 30) is connected to the connecting electrode CE02 through the via hole Vf penetrating the insulating layer ISL5, the connecting electrode CE02 is connected to the connecting electrode CE01 through the via hole VH penetrating the insulating layer ISL4. The light-emitting element 100b includes a first electrode E1, a second electrode E2, and a light-emitting functional layer FL located between the first electrode E1 and the second electrode E2. For example, the connecting element CE0 includes a connecting electrode CE01 and a connecting electrode CE02.

FIG. 24 also illustrates the second electrode T52 of the light-emitting control transistor T5, the light-emitting control line EML, the first electrode T51 of the light-emitting control transistor T5, the first electrode plate Ca of the storage capacitor, the second electrode plate Cb of the storage capacitor, the second electrode T42 of the light-emitting control transistor T4, the gate line GT, the data line DT, the reset control signal line RST, and the initialization signal line INT.

FIG. 24 also illustrates a pixel definition layer PDL and a spacer PS, the pixel definition layer PDL is provided with an opening OPN2, and the opening OPN2 is configured to define a light-emitting area (light-emitting region, that is, effective light-emitting area) of a pixel unit. The spacer PS is configured to support a fine metal mask in a process for forming the light-emitting functional layer FL.

For example, as illustrated in FIG. 24, the opening OPN2 is a light-emitting region of the pixel unit. The light-emitting functional layer FL is located on the first electrode E1 of the light-emitting element 100b, the second electrode E2 of the light-emitting element 100b is located on the light-emitting functional layer FL, as illustrated in FIG. 24, an encapsulation layer CPS is arranged on the light-emitting element 100b. The encapsulation layer CPS includes a first encapsulation layer CPS1, a second encapsulation layer CPS2, and a third encapsulation layer CPS3. For example, the first encapsulation layer CPS1 and the third encapsulation layer CPS3 are inorganic material layers, the second encapsulation layer CPS2 is an organic material layer. For example, the first electrode E1 is the anode of the light-emitting element 100b, and the second electrode E2 is the cathode of the light-emitting element 100b, but is not limited thereto.

FIG. 25 illustrates a conductive line L1, one end of the conductive line L1 is connected to the second-region light-emitting element 40 in the second display region R2, and the other end of the conductive line L1 is connected to the pixel circuit.

For example, as illustrated in FIG. 25, FIG. 7 to FIG. 21, the plurality of conductive lines L1 are located between the plurality of light-emitting elements 100b and the plurality of pixel circuits 100a in a direction perpendicular to a main surface of the base substrate BS. FIG. 24 and FIG. 25 do not illustrate all the structure of the pixel circuit 100a.

FIG. 24 and FIG. 25 are illustrated with reference to the case that the insulating layer ISL4 includes the insulating sub-layer ISL41 and the insulating sub-layer ISL42 as an example.

Figure 26:
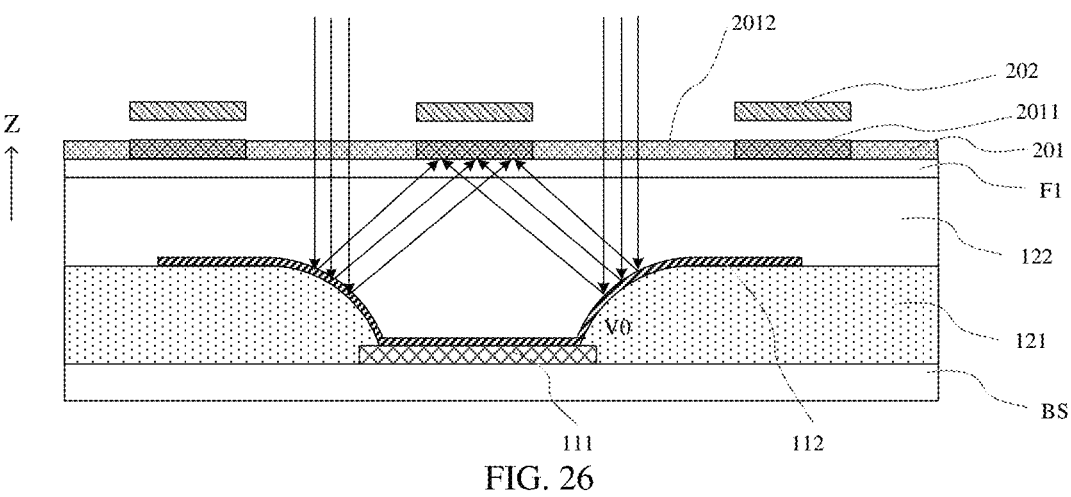
FIG. 26 is a cross-sectional view of a display panel.
Figure 27:
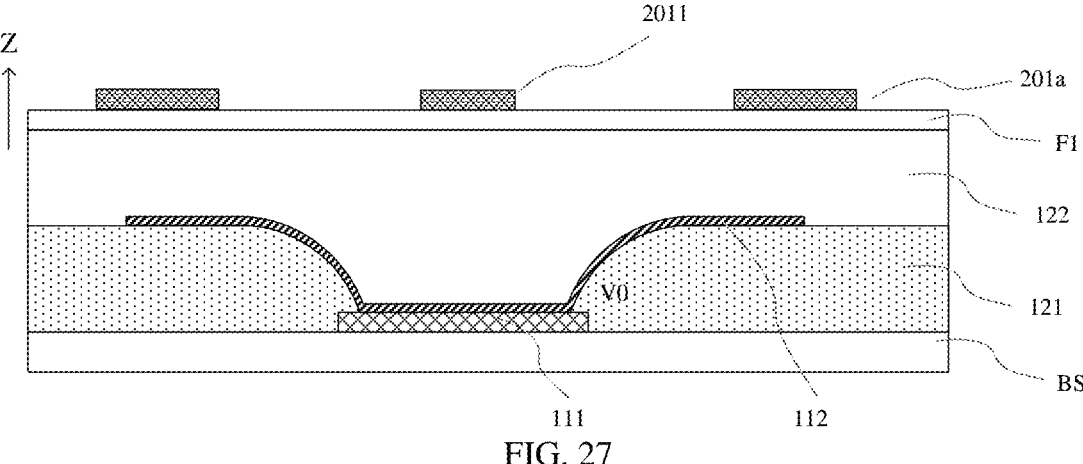
FIG. 27 is a schematic diagram of forming a photoresist pattern.
Figure 28:
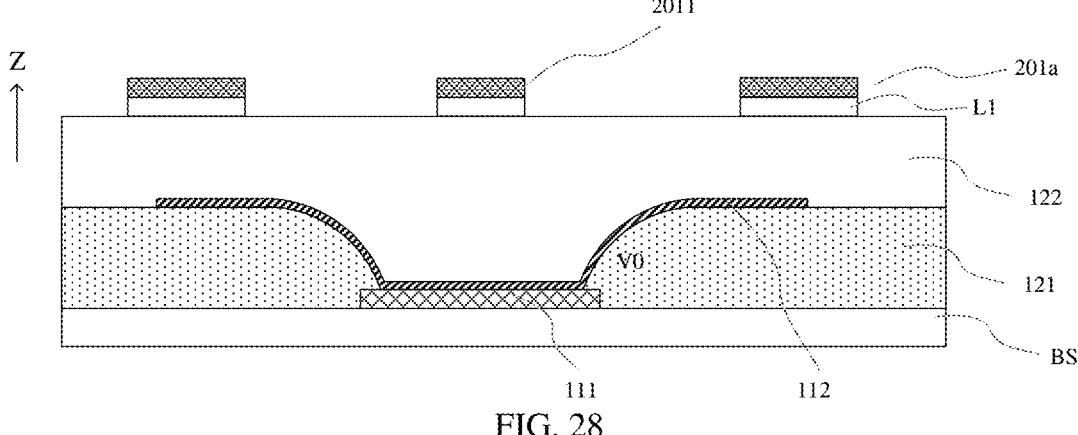
FIG. 28 is a schematic diagram of forming conductive lines.

FIG. 26 is a cross-sectional view of a display panel. FIG. 26 is a schematic diagram of an exposure process in a case that the transparent conductive film is patterned in the process of forming the conductive line L1. FIG. 27 is a schematic diagram of forming a photoresist pattern. FIG. 28 is a schematic diagram of forming conductive line. As illustrated in FIG. 26, the first conductive element 111 is located on the base substrate BS; the first planarization layer 121 is located on the first conductive element 111; the second conductive element 112 is located on the first planarization layer 121, and is connected to the first conductive element 111 through the via hole V0 penetrating the first planarization layer 121; and the second planarization layer 122 is located on the second conductive element 112. As illustrated in FIG. 26, forming the conductive line L1 includes forming a transparent conductive film F1 on the second planarization layer 122, forming a photoresist film 201 on the transparent conductive film F1, and using the mask plate 202 as a mask to expose the photoresist film 201, thus the photoresist film 201 forms a photoresist retained part 2011 and a photoresist to-be-removed part 2012. As illustrated in FIG. 27, a developing process is performed after the exposure process, in the development process, the photoresist to-be-removed part 2012 is removed to form a photoresist pattern 201*a*. As illustrated in FIG. 28, the transparent conductive film F1 is etched by using the photoresist pattern 201*a* as a mask to form a conductive line L1. For example, the conductive line L1 includes a plurality of conductive lines. An insulating layer is arranged between adjacent transparent conductive layers.

After the exposure process, the photoresist of the transparent conductive film may be over-exposed to be broken and thinned, which leads to the breakage or thinning of the conductive line after development and etching, thus causing the display to have a defect of dark spot. The optical microscope has confirmed that the broken and thinned position of the conductive line is the position where the conductive line spans the via hole V0 of the first planarization layer 121. Further, through a Focused Ion Beam (FIB) analysis on the cross-section of the via hole V0 of the first planarization layer 121, it has been found that, there is a bowl-shaped portion of the second conductive element 112 under the broken or thinned position where the conductive line spans the via hole V0. Therefore, as illustrated in FIG. 26, the reason why the conductive line is broken and thinned is that: in the exposure process, the second conductive element 112 reflects light and condenses it to the photoresist retained portion 2011 of the photoresist located above the bowl-shaped portion of the second conductive element 112 (corresponding to the position of the via hole V0), so that this portion of the photoresist is exposed or partially exposed, and washed away after development, and further, the conductive line formed by etching the transparent conductive film with the photoresist pattern 201*a* as a mask is broken or thinned. As illustrated in FIG. 26-FIG. 28, the photoresist retained portion 2011 of the photoresist located in the middle position is irradiated by partially reflected light, which makes the conductive line under it thinner.

The first conductive element 111 in FIG. 26 to FIG. 28 may be the connecting electrodes CE01 in FIG. 24 and FIG. 25, the second conductive element 112 may be the connecting electrodes CE02 in FIG. 24 and FIG. 25.

Figure 29:
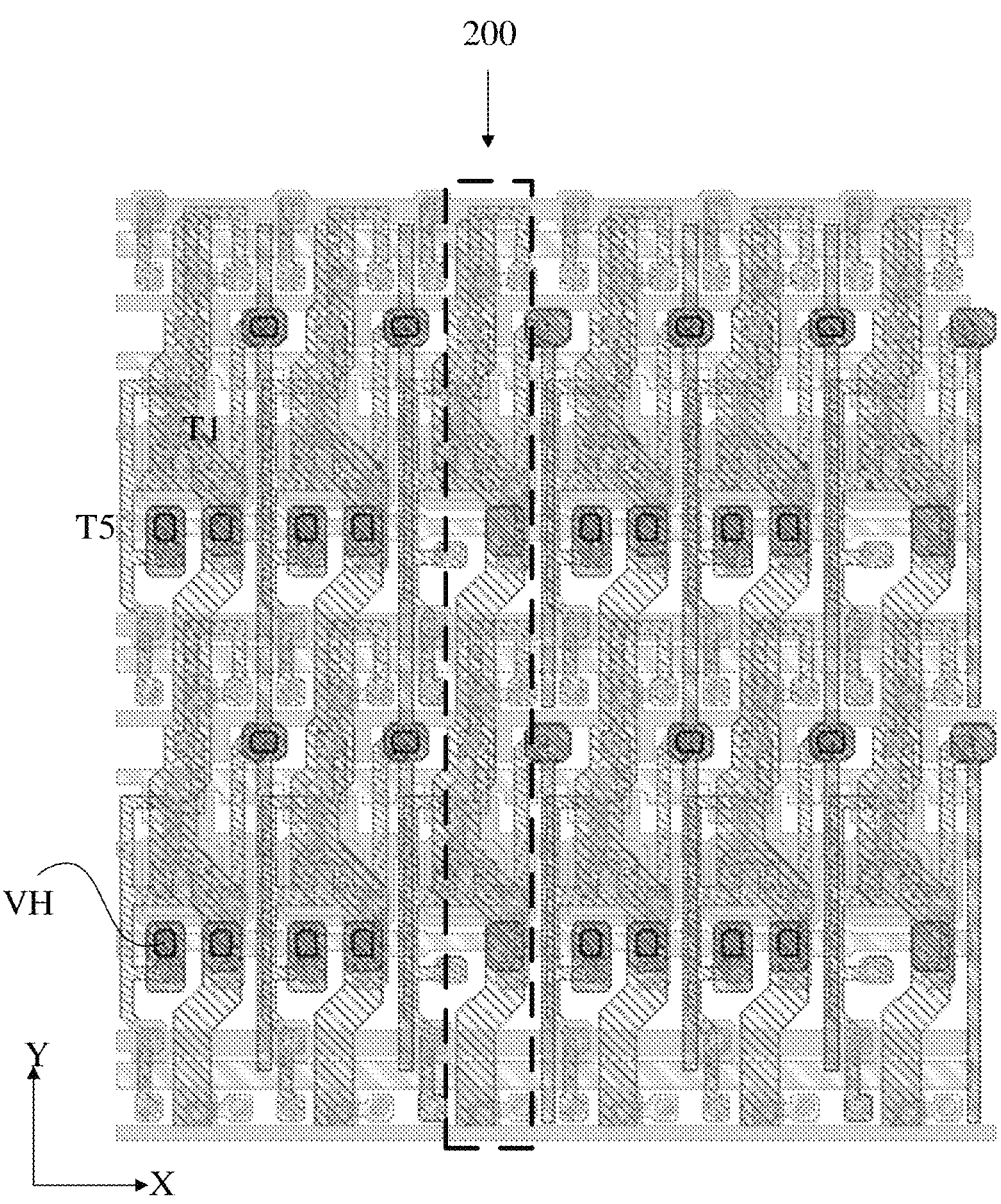
FIG. 29 is a schematic diagram of first-type pixel circuits in a first display region of a display panel provided by an embodiment of the present disclosure.
Figure 30:
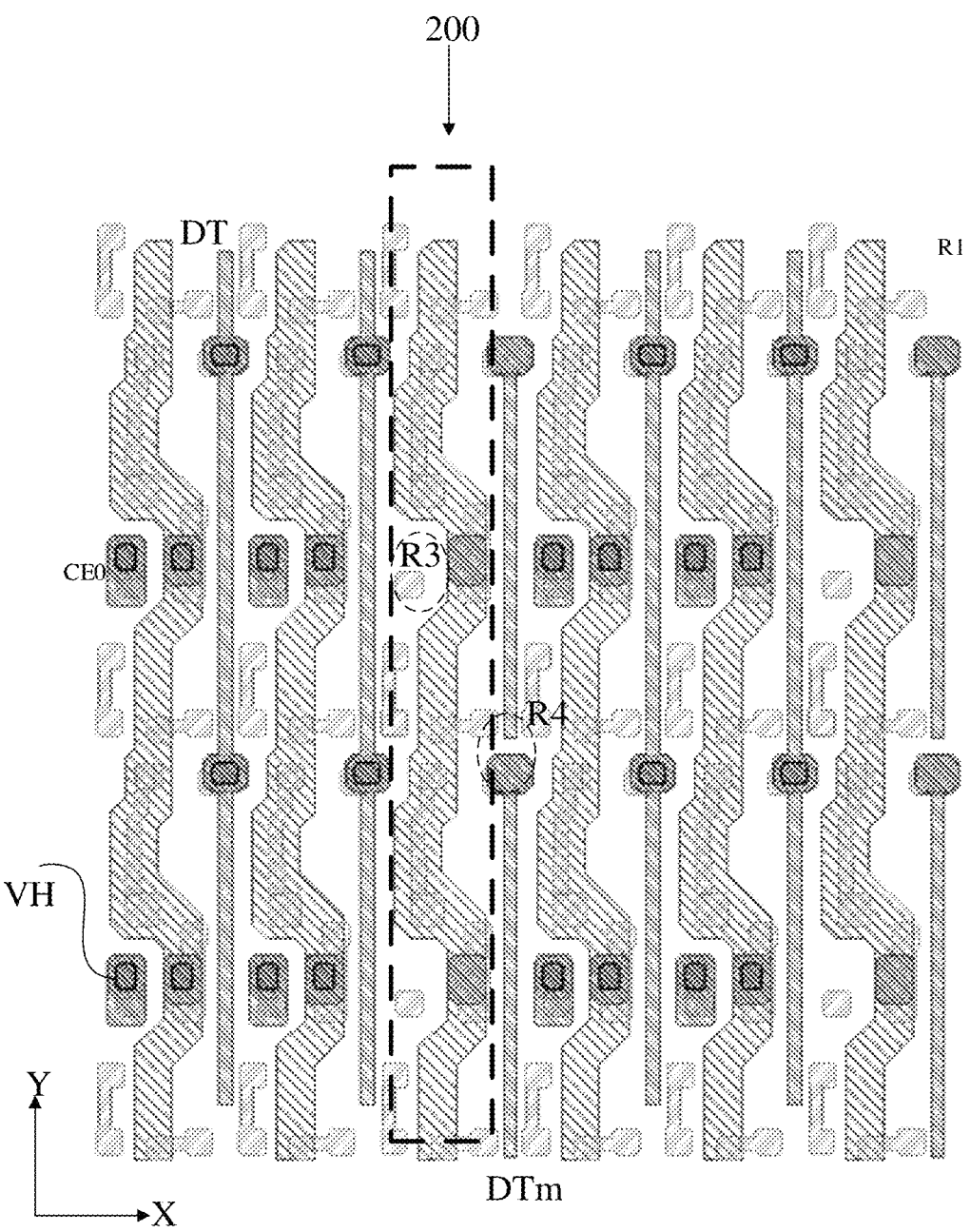
FIG. 30 is a schematic diagram of some film layers in FIG. 29.
Figure 31:
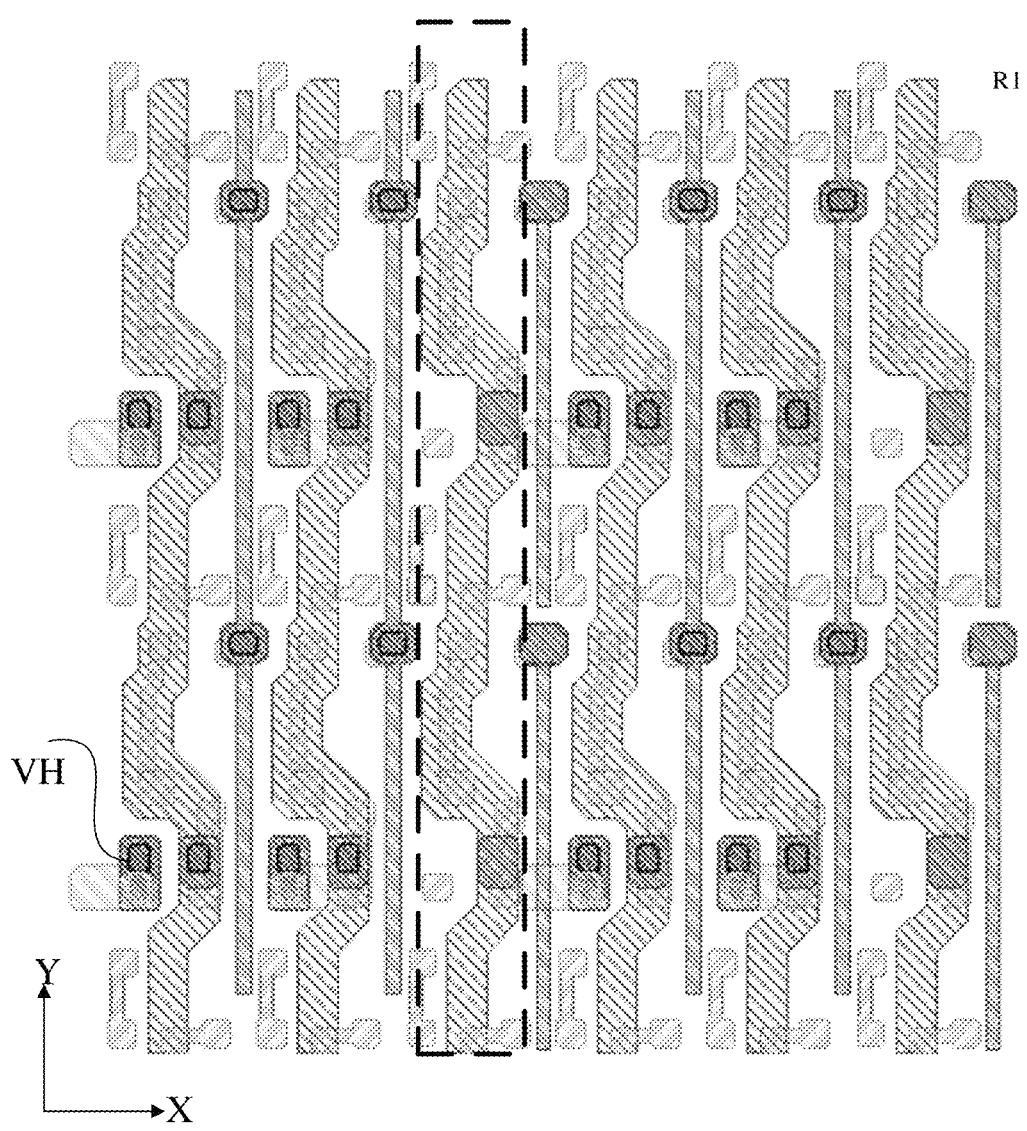
FIG. 31 is a schematic diagram of some film layers in first-type pixel circuits in the first display region of the display panel provided by an embodiment of the present disclosure.

FIG. 29 is a schematic diagram of first-type pixel circuits in a first display region of a display panel provided by an embodiment of the present disclosure. FIG. 30 is a schematic diagram of some film layers in FIG. 29. FIG. 31 is a schematic diagram of some film layers in first-type pixel circuits in the first display region of the display panel provided by an embodiment of the present disclosure.

Figure 32:
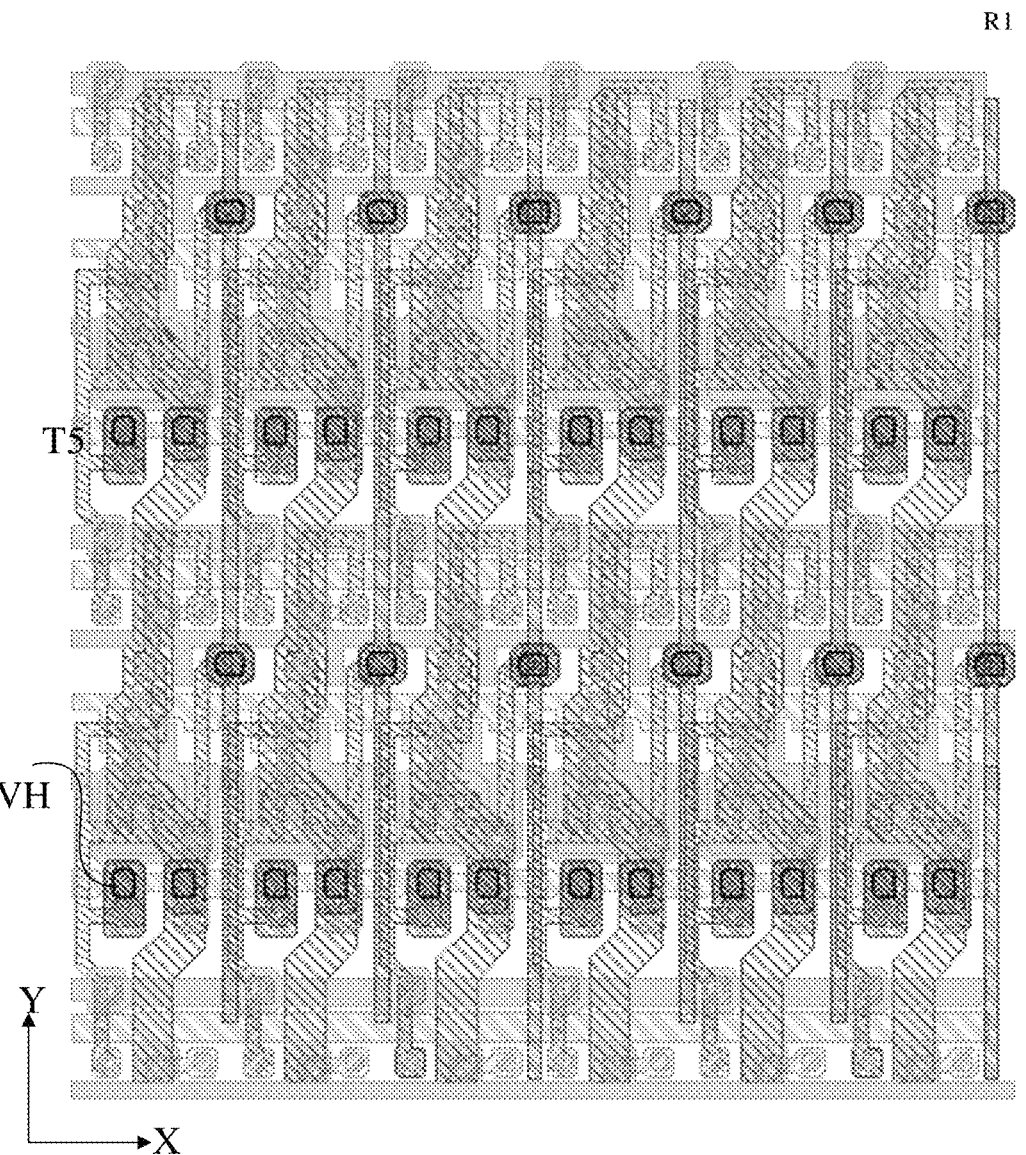
FIG. 32 is a schematic diagram of the second-type pixel circuits in the first display region of the display panel provided by an embodiment of the present disclosure.
Figure 33:
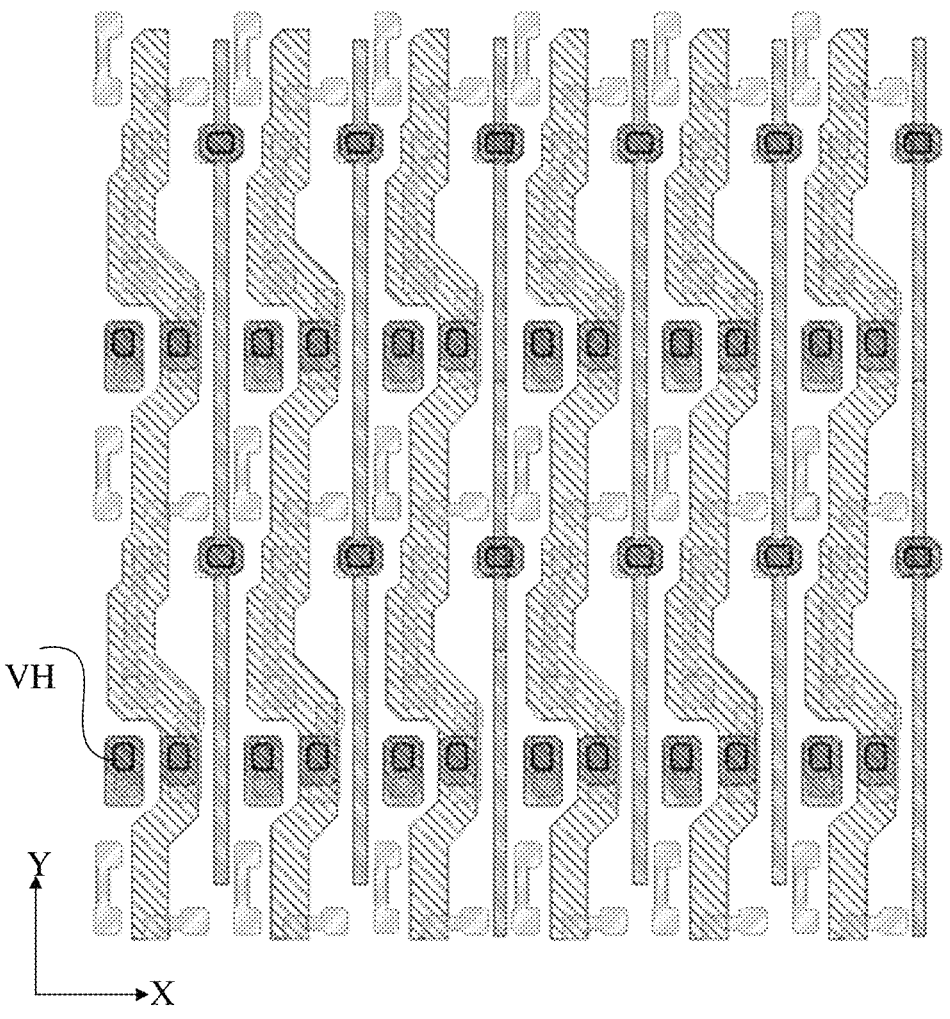
FIG. 33 is a schematic diagram of some film layers in FIG. 32.
Figure 34:
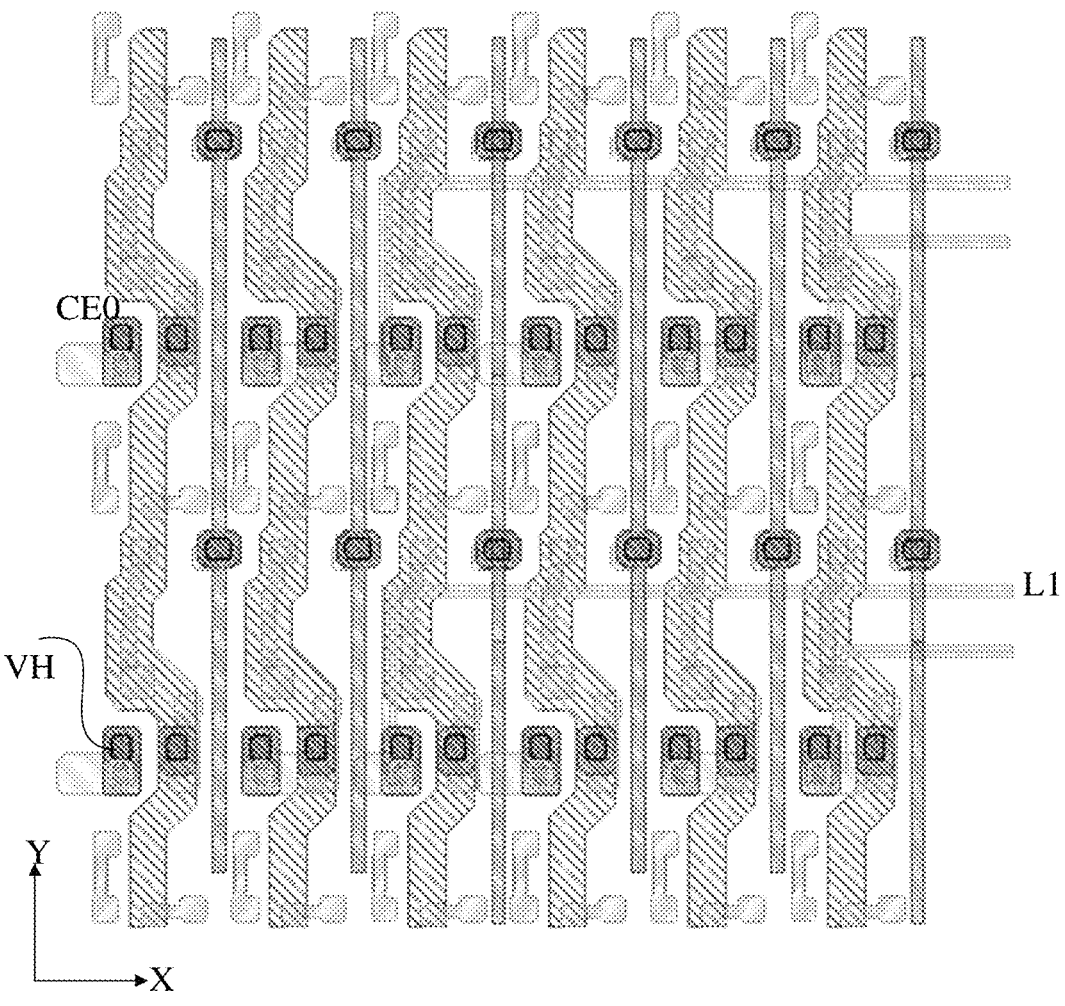
FIG. 34 is a schematic diagram of some film layers in the second-type pixel circuits in the first display region of the display panel provided by an embodiment of the present disclosure.

FIG. 32 is a schematic diagram of the second-type pixel circuits in the first display region of the display panel provided by an embodiment of the present disclosure. FIG. 33 is a schematic diagram of some film layers in FIG. 32. FIG. 34 is a schematic diagram of some film layers in the second-type pixel circuits in the first display region of the display panel provided by an embodiment of the present disclosure.

Figure 35:
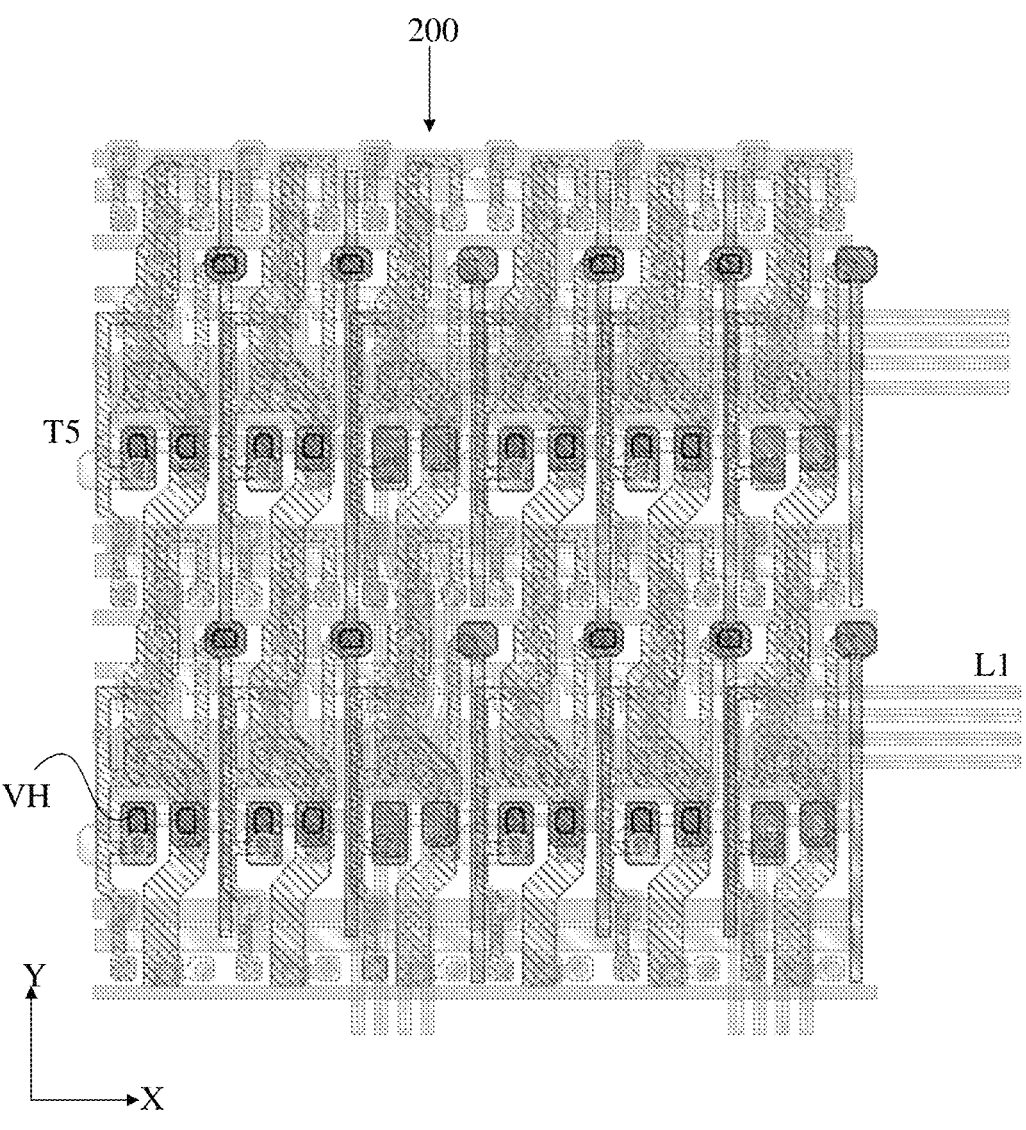
FIG. 35 is a schematic diagram of a pixel circuit in a region with vertical conductive lines in the first display region of the display panel provided by an embodiment of the present disclosure.
Figure 36:
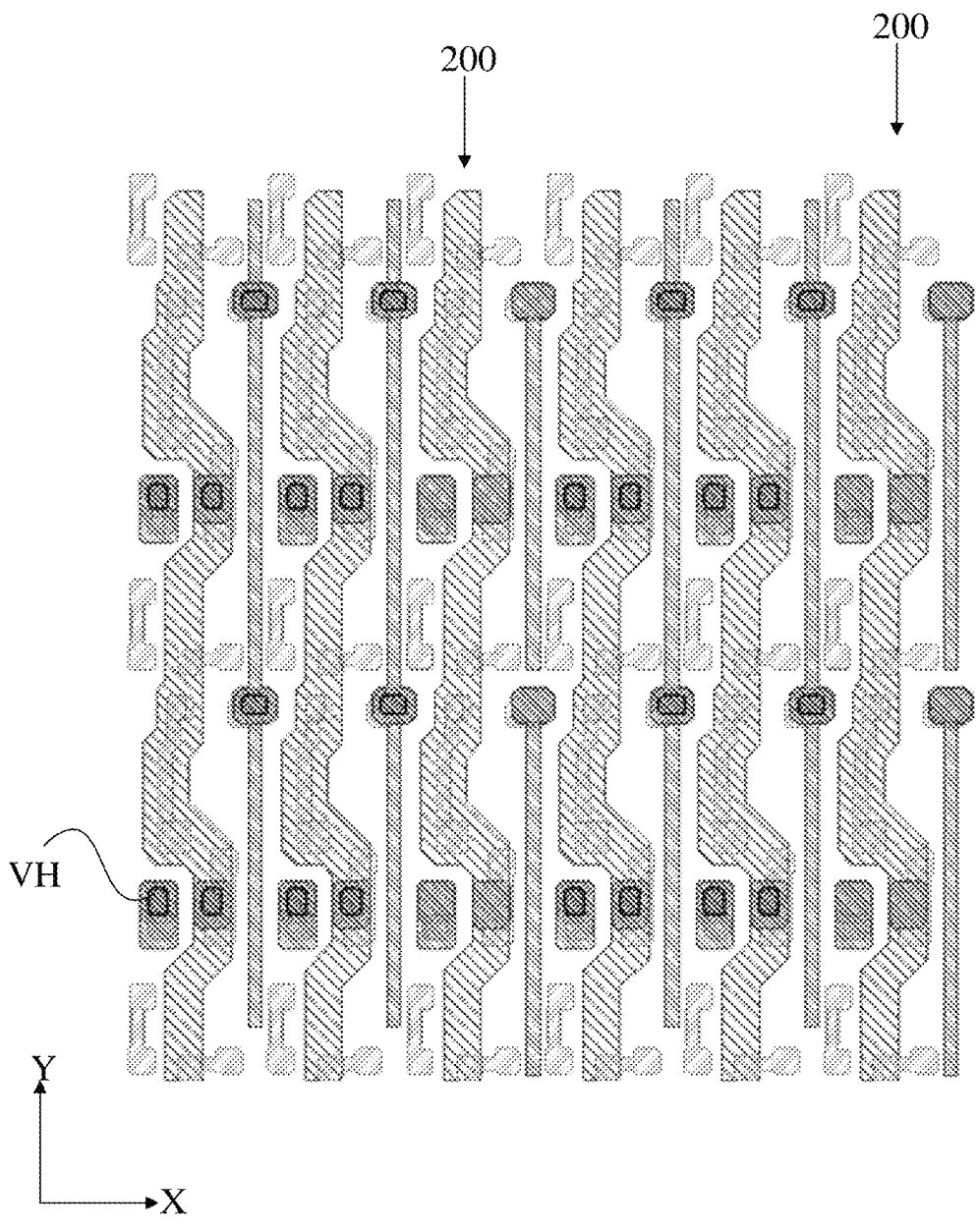
FIG. 36 is a schematic diagram of some film layers in FIG. 35.
Figure 37:
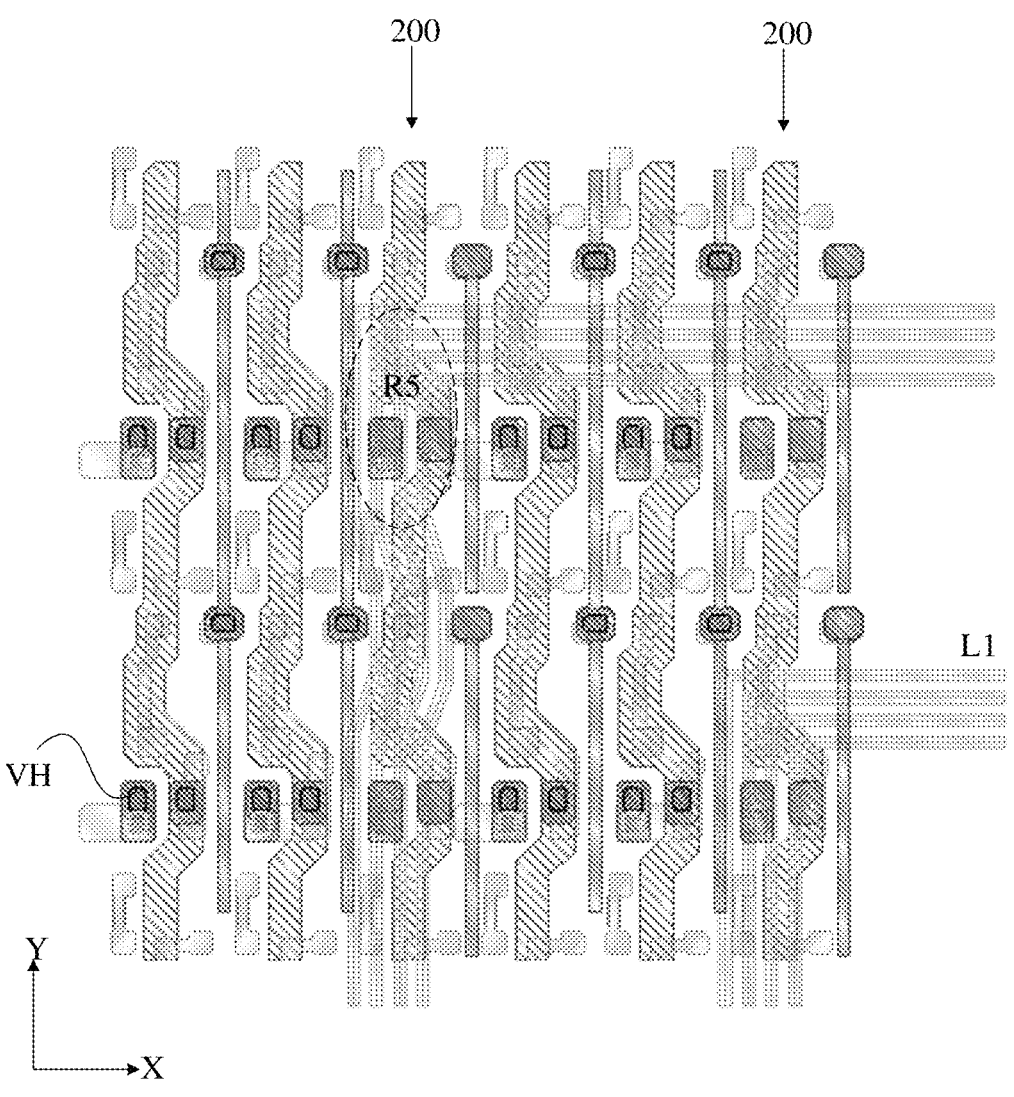
FIG. 37 is a schematic diagram of some film layers in the region with vertical conductive lines in the first display region of the display panel provided by an embodiment of the present disclosure.

FIG. 35 is a schematic diagram of a pixel circuit in a region with vertical conductive line in the first display region of the display panel provided by an embodiment of the present disclosure. FIG. 36 is a schematic diagram of some film layers in FIG. 35. FIG. 37 is a schematic diagram of some film layers in the region with vertical conductive line in the first display region of the display panel provided by an embodiment of the present disclosure.

In order to reduce the breakage or thinning of the conductive line L1, in the dummy pixel circuit 200, the connecting electrode CE02 is not provided, thus the dummy pixel circuit 200 does not have the via hole VH penetrating the insulating layer ISL4. In some embodiments, the dummy pixel circuit 200 does not have the connecting electrode CE02, but is not limited thereto. In other embodiments, the dummy pixel circuit 200 has a connecting electrode CE02, the connecting electrode CE02 is not connected to the connecting electrode CE01 through a via hole. That is, in the dummy pixel circuit 200, the connecting electrode CE02 and the connecting electrode CE01 are insulated from each other, and no via hole is arranged between the connecting electrode CE02 and the connecting electrode CE01.

For example, as illustrated in FIG. 24 and FIG. 25, in the display panel provided by the embodiments of the present disclosure, the display panel further includes a planarization layer PLN, the insulating layer ISL4 in FIG. 24 and FIG. 25 may be a planarization layer PLN, and the planarization layer PLN is located between the first electrode E1 of the light-emitting element and the pixel circuit 100*a*.

As illustrated in FIG. 29 to FIG. 31 and FIG. 25 to FIG. 27, the orthographic projection of the via hole VH in the planarization layer PLN on the base substrate does not overlap with the orthographic projection of the dummy pixel circuit 200 on the base substrate. Therefore, the situation that the part of the conductive line L1 located in the dummy pixel circuit 200 is thinned or broken can be avoided.

As illustrated in FIG. 30, no via hole VH is arranged at the position of the dashed box R3, and no connecting electrode CE02 is arranged at the position of the dashed frame R3.

As illustrated in FIG. 30, the data line DTm of the dummy pixel circuit 200 is broken. The data line DTm is broken at the position of the dashed frame R4 to form multiple parts that are disconnected. The data line DTm is not connected to the pixel circuit.

As illustrated in FIG. 37, no via hole VH is provided at the position of the dashed frame R5, and no connecting electrode CE02 is provided at the position of the dashed frame R5.

The display panel provided by some embodiments of the present disclosure includes a fourth light-emitting element; in other embodiments, the display panel may not include a fourth light-emitting element. In a case where the display panel does not include the fourth light-emitting element, the fourth light-emitting element in the figure and the pixel circuit connected to the fourth light-emitting element may be removed, and the positions of other components may be adjusted accordingly.

For example, the transistors in the pixel circuits of the embodiments of the present disclosure are thin film transistors. For example, the conductive layer LYa, the conductive layer LYb, the conductive layer LYc, and the conductive layer LYd are all made of metal materials. For example, the conductive layer LYa and the conductive layer LYb are made of metal materials such as nickel and/or aluminum, but not limited thereto. For example, the conductive layer LYc and the conductive layer LYd are made of materials such as titanium and/or aluminum, but not limited thereto. For example, the conductive layer LYc and the conductive layer LYd are respectively a structure formed by three sub-layers of Ti/AL/Ti, but not limited thereto. For example, the base substrate may be a glass substrate or a polyimide substrate, but not limited thereto, and may be selected according to needs. For example, the buffer layer BL, the isolation layer BR, the insulating layer ISL1, the insulating layer ISL2, the insulating layer ISL3, the insulating layer ISL4, and the insulating layer ISL5 are all made of insulating materials. For example, the material of the insulating layer ISL4 and the material of the insulating layer ISL5 include an organic insulating material including resin, but not limited thereto. The materials of the first electrode E1 and the second electrode E2 of the light-emitting element can be selected according to requirements. In some embodiments, the first electrode E1 may be made of at least one of transparent conductive metal oxide and silver, but is not limited thereto. For example, the first electrode E1 may adopt a structure in which three sub-layers of ITO-Ag-ITO are stacked. In some embodiments, the second electrode E2 can be metal with low work function, at least one of magnesium and silver can be used, but not limited thereto.

For example, both the first transparent conductive pattern layer LY1 and the second transparent conductive pattern layer LY2 are made of transparent conductive metal oxides, and the transparent conductive metal oxides include, but are not limited to, indium tin oxide (ITO).

At least one embodiment of the present disclosure provides a display device including any one of the above-mentioned display panels.

Figure 38:
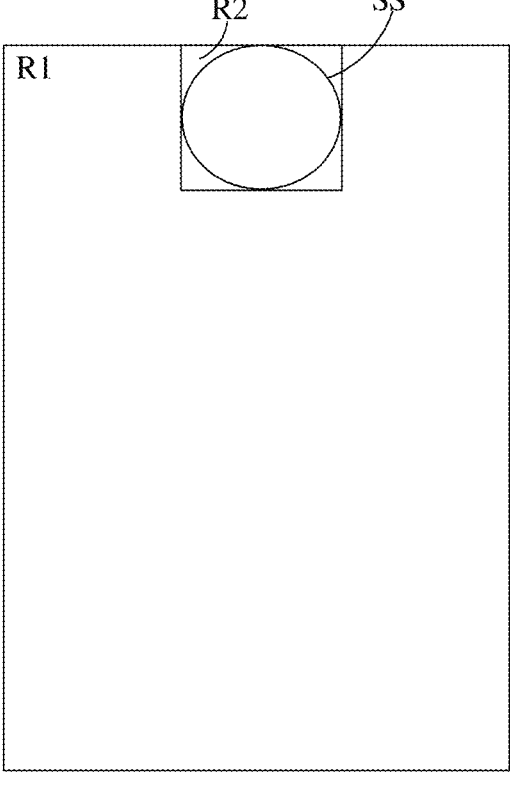
FIG. 38 and FIG. 39 are schematic diagrams of a display device provided by an embodiment of the present disclosure.
Figure 39:
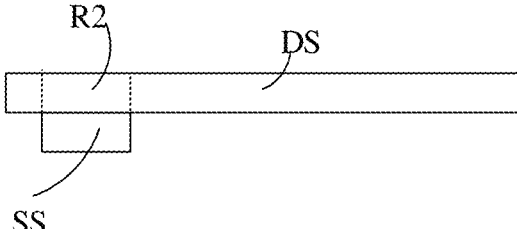

FIG. 38 and FIG. 39 are schematic diagrams of a display device provided by an embodiment of the present disclosure. As illustrated in FIG. 38 and FIG. 39, the sensor SS is located on a side of the display panel DS and is located in the second display region R2. The ambient light can be sensed by the sensor SS through the second display region R2. As illustrated in FIG. 39, a side of the display panel where the sensor SS is not provided is a display side, which can display images. For example, the sensor includes a photosensitive sensor; and the photosensitive sensor is located on a side of the display panel.

For example, the second display region R2 may be rectangular, and an area of an orthographic projection of the sensor SS on the base substrate BS may be less than or equal to an area of an inscribed circle of the second display region R2. That is, a size of a region where the sensor SS is located may be less than or equal to a size of the inscribed circle of the second display region R2. For example, the size of the region where the sensor SS is located is equal to the size of the inscribed circle of the second display region R2, that is, a shape of the region where the sensor SS is located may be circular, and correspondingly, the region where the sensor SS is located may also be referred to as a light-transmitting hole. Of course, in some embodiments, the second display region R2 may also have a shape other than a rectangle, for example, a circle or an ellipse.

For example, the display device is a full-screen display device with an under-screen camera. For example, the display device includes products or components with display function that including the above-mentioned display panel, such as a TV, a digital camera, a mobile phone, a watch, a tablet computer, a laptop computer, a navigator, and the like.

In the related art, the pixel circuit (including the first-type pixel circuit 10 and the second-type pixel circuit 20) has the same pitch as that of the first-region light-emitting element 30, for example, generally, a width is about 30 microns (µm) to 32 µm, and a length is about 60 µm to 65 µm. In the embodiment of the present disclosure, in order to provide sufficient space for arrangement of the second-type pixel circuit 20 without reducing the number of pixels in the first display region R1, the respective pixel circuits may be compressed in the first direction X (e.g., a gate line extension direction, which may also be referred to as a horizontal direction), so that a width of the pixel circuit in the first direction is less than a width of the first-region light-emitting element 30; or the first-region light-emitting element 30 is stretched in the first direction X, so that a width of the first-region light-emitting element 30 is greater than the width of the pixel circuit. In this way, under the premise that the base substrates BS have the same size, there may be more extra regions in the first display region R1, and accordingly, the second-type pixel circuit 20 for driving the second light-emitting element 40 located in the second display region R2 may be provided in the extra regions.

Figure 40:
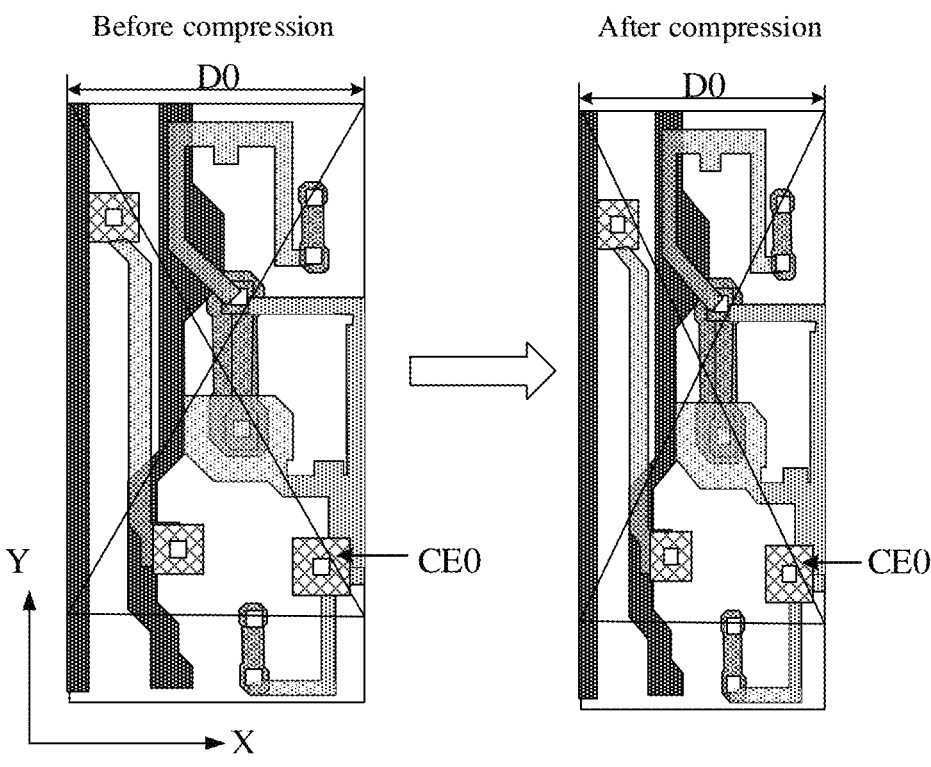
FIG. 40 illustrates a structural layout of the pixel circuit before and after compression.

For example, a width of each pixel circuit may be different from the width of the first-region light-emitting element 30 by about 4 µm. Taking compressed pixel circuits with a width difference of 4 µm as an example, FIG. 40 illustrates a structural layout of the pixel circuit before and after compression. Referring to FIG. 40, it may be seen that the pixel circuit may include a driving structure and a connecting element CE0 configured to be coupled to a first electrode (anode) of the light-emitting element; and a pitch of the connecting element CE0 may refer to the pitch of the pixel circuit. The pitches of the pixel circuit and the light-emitting element before compression are both 1 µm to 100 µm in width and 2 µm to 100 µm in height. The pitch of the light-emitting element after compression may remain unchanged as compared with that before compression. For example, the pitch of the second-region light-emitting element 40 may be equal to or less than the pitch of the first-region light-emitting element 20. The compressed pixel circuit has the height unchanged, but the width reduced by 1 µm to 20 µm. In this way, there may be one or more extra columns of compressed pixel circuits every few columns of compressed pixel circuits; and the entire screen adopts such design to achieve full-screen compression. Among them, these extra columns may be selected to be connected to the second-region light-emitting element 40 in the second display region R2 to control the second-region light-emitting element 40 to emit light. In some embodiments, extra columns of pixel circuits close to the periphery of the second display region R2 are selected as the second-type pixel circuit 20 to be connected to the second-region light-emitting element 40. In this way, normal display may be implemented without changing resolution of the display panel. That is, the existing space of the display panel is fully utilized to implement normal display. The effect achieved by compressing the pitch of the pixel circuit is that: the number of light-emitting elements (including the first-region light-emitting elements 30 and the second light-emitting elements 40) remains unchanged, and further, there is no significant difference in display effect as compared with that before compression; and the display panel has a better display effect.

Figure 41:
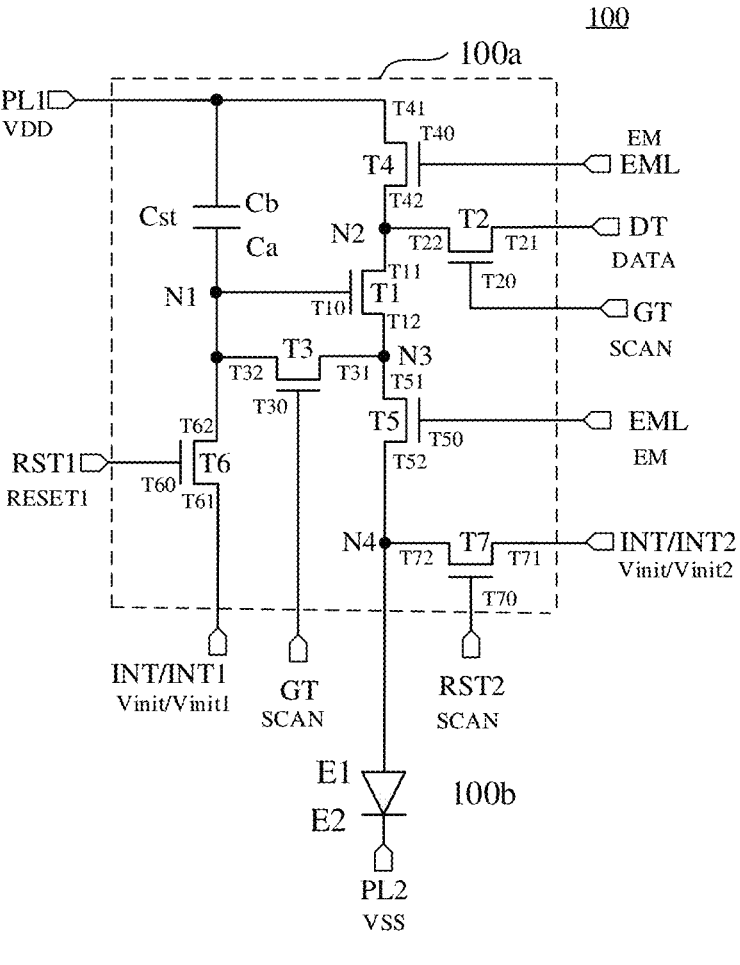
FIG. 41 is a schematic diagram of a pixel unit in a display panel.

FIG. 41 is a schematic diagram of a pixel unit in a display panel. FIG. 40 illustrates a pixel circuit of one pixel unit of the display panel. As illustrated in FIG. 40, the pixel unit 100 includes the pixel circuit 100a and the light-emitting element 100b. The pixel circuit 100a includes six switching transistors (T2-T7), one driving transistor T1, and one storage capacitor Cst. The six switching transistors are a data writing transistor T2, a threshold compensation transistor T3, a first light-emitting control transistor T4, a second light-emitting control transistor T5, a first reset transistor T6, and a second reset transistor T7, respectively. The light-emitting element 100b includes a first electrode E1, a second electrode E2, and a light-emitting functional layer located between the first electrode E1 and the second electrode E2. For example, the first electrode E1 is an anode, and the second electrode E2 is a cathode. Generally, the threshold compensation transistor T3 and the first reset transistor T6 adopt double-gate thin film transistors (TFT) to reduce leakage current.

As illustrated in FIG. 40, the display panel includes a gate line GT, a data line DT, a first power supply line PL1, a second power supply line PL2, a light-emitting control signal line EML, an initialization signal line INT, a reset control signal line RST, and the like. For example, the reset control signal line RST includes a first reset control signal line RST1 and a second reset control signal line RST2. The first power supply line PL1 is configured to provide a constant first voltage signal VDD to the pixel unit 100, the second power supply line PL2 is configured to provide a constant second voltage signal VSS to the pixel unit 100, and the first voltage signal VDD is greater than the second voltage signal VSS. The gate line GT is configured to provide a scan signal SCAN to the pixel unit 100, the data line DT is configured to provide a data signal DATA (data voltage VDATA) to the pixel unit 100, the light-emitting control signal line EML is configured to provide a light-emitting control signal EM to the pixel unit 100, the first reset control signal line RST1 is configured to provide a first reset control signal RESET1 to the pixel unit 100, and the second reset control signal line RST2 is configured to provide the scan signal SCAN to the pixel unit 100. For example, in a row of pixel units, the second reset control signal line RST2 can be connected to the gate line GT, so as to be supplied with the scan signal SCAN. Of course, the second reset control signal line RST2 can be supplied with the second reset control signal RESET2. The first initialization signal line INT1 is configured to provide a first initialization signal Vinit1 to the pixel unit 100. The second initialization signal line INT2 is configured to provide a second initialization signal Vinit2 to the pixel unit 100. For example, the first initialization signal Vinit1 and the second initialization signal Vinit2 are constant voltage signals, and their magnitudes may be between the first voltage signal VDD and the second voltage signal VSS, but are not limited thereto. For example, the first initialization signal Vinit1 and the second initialization signal Vinit2 may both be less than or equal to the second voltage signal VSS. For example, in some embodiments, the first initialization signal line INT1 and the second initialization signal line INT1 are connected to each other, and are both configured to provide an initialization signal Vinit to the pixel unit 100, that is, the first initialization signal line INT1 and the second initialization signal line INT2 are both referred to as an initialization signal line INT, and the first initialization signal Vinit1 and the second initialization signal Vinit2 are equal, and both are initialization signal Vinit.

As illustrated in FIG. 40, the driving transistor T1 is electrically connected to the light-emitting element 100*b*, and outputs a driving current to drive the light-emitting element 100*b* to emit light under the control of the scan signal SCAN, the data signal DATA, the first voltage signal VDD, and the second voltage signal VSS.

For example, the light-emitting element 100*b* includes an organic light-emitting diode (OLED), and the light-emitting element 100*b* emits red light, green light, blue light, or white light under the driving of its corresponding pixel circuit 100*a*. For example, one pixel includes a plurality of pixel units. One pixel may include a plurality of pixel units that emit light of different colors. For example, one pixel includes a pixel unit that emits red light, a pixel unit that emits green light, and a pixel unit that emits blue light, but it is not limited to this. The number of pixel units included in a pixel and the light output of each pixel unit can be determined according to needs.

For example, as illustrated in FIG. 40, a gate electrode T20 of the data writing transistor T2 is connected to the gate line GT, a first electrode T21 of the data writing transistor T2 is connected to the data line DT, and a second electrode T22 of the data writing transistor T2 is connected to a first electrode T11 of the driving transistor T1.

For example, as illustrated in FIG. 40, the pixel circuit 100*a* further includes the threshold compensation transistor T3, a gate electrode T30 of the threshold compensation transistor T3 is connected to the gate line GT, a first electrode T31 of the threshold compensation transistor T3 is connected to a second electrode T12 of the driving transistor T1, and a second electrode T32 of the threshold compensation transistor T3 is connected to a gate electrode T10 of the driving transistor T1.

For example, as illustrated in FIG. 40, the display panel further includes the light-emitting control signal line EML, and the pixel circuit 100*a* further includes the first light-emitting control transistor T4 and the second light-emitting control transistor T5. A gate electrode T40 of the first light-emitting control transistor T4 is connected to the light-emitting control signal line EML, a first electrode T41 of the first light-emitting control transistor T4 is connected to the first power supply line PL1, and a second electrode T42 of the first light-emitting control transistor T4 is connected to the first electrode T11 of the driving transistor T1. A gate electrode T50 of the second light-emitting control transistor T5 is connected to the light-emitting control signal line EML, a first electrode T51 of the second light-emitting control transistor T5 is connected to the second electrode T12 of the driving transistor T1, and a second electrode T52 of the second light-emitting control transistors T5 is connected to a first electrode E1 of the light-emitting element 100*b*.

As illustrated in FIG. 40, the first reset transistor T6 is connected to the gate electrode T10 of the driving transistor T1 and is configured to reset the gate electrode of the driving transistor T1, and the second reset transistor T7 is connected to the first electrode E1 of the light-emitting element 100*b* and is configured to reset the first electrode E1 of the light-emitting element 100*b*. The first initialization signal line INT1 is connected to the gate electrode of the driving transistor T1 through the first reset transistor T6. The second initialization signal line INT2 is connected to the first electrode E1 of the light-emitting element 100*b* through the second reset transistor T7. For example, the first initialization signal line INT1 and the second initialization signal line INT2 are connected to each other and are input with the same initialization signal, but not limited to this. In some embodiments, the first initialization signal line INT1 and the second initialization signal line INT2 may also be insulated from each other and configured to input signals, respectively.

For example, as illustrated in FIG. 40, a first electrode T61 of the first reset transistor T6 is connected to the first initialization signal line INT1, a second electrode T62 of the first reset transistor T6 is connected to the gate electrode T10 of the driving transistor T1, a first electrode T71 of the second reset transistor T7 is connected to the second initialization signal line INT2, and a second electrode T72 of the second reset transistor T7 is connected to the first electrode E1 of the light-emitting element 100*b*. For example, as illustrated in FIG. 40, a gate electrode T60 of the first reset transistor T6 is connected to the first reset control signal line RST1, and a gate electrode T70 of the second reset transistor T7 is connected to the second reset control signal line RST2.

As illustrated in FIG. 40, the first power supply line PL1 is configured to provide the first voltage signal VDD to the pixel circuit 100*a*. The pixel circuit further includes the storage capacitor Cst, a first electrode plate Ca of the storage capacitor Cst is connected to the gate electrode T10 of the driving transistor T1, and a second electrode plate Cb of the storage capacitor Cst is connected to the first power supply line PL1.

For example, as illustrated in FIG. 40, the display panel further includes the second power supply line PL2, and the second power supply line PL2 is connected to a second electrode E2 of the light-emitting element 100b.

FIG. 40 illustrates a first node N1, a second node N2, a third node N3, and a fourth node N4.

The above description takes the 7T1C pixel circuit as an example, and the embodiments of the present disclosure include but are not limited to this. It should be noted that the embodiments of the present disclosure do not limit the number of thin film transistors and the number of capacitors included in the pixel circuit. For example, in some other embodiments, the pixel circuit of the display panel may also be a structure including other numbers of transistors, such as a 7T2C structure, a 6T1C structure, a 6T2C structure, or a 9T2C structure, which is not limited in the embodiments of the present disclosure. Of course, the display panel may also include pixel circuits with less than 7 transistors.

In the embodiments of the present disclosure, the elements located in the same layer can be formed by the same film layer through the same patterning process. For example, the elements located in the same layer may be located on the surface of the same element away from the base substrate.

It should be noted that, for the sake of clarity, in the drawings used to describe the embodiments of the present disclosure, the thickness of a layer or region is exaggerated. It can be understood that when an element such as a layer, film, region, or substrate is referred to as being "on" or "under" another element, the element can be "directly" "on" or "under" the other element, or there may be intermediate elements.

In the embodiments of the present disclosure, the patterning or patterning process may only include a photolithography process, or include a photolithography process and an etching step, or may include other processes for forming predetermined patterns such as printing and ink-jetting. The photolithography process refers to the process including film formation, exposure, development, etc., by using photoresist, mask plate, exposure machine, etc. to form patterns. The corresponding patterning process can be selected according to the structure formed in the embodiment of the present disclosure.

In the case of no conflict, the features in the same embodiment and different embodiments of the present disclosure can be combined with each other.

The above are only specific embodiments of the present disclosure, but the protection scope of the present disclosure is not limited thereto. Any person skilled in the art can easily conceive of changes or substitutions within the technical scope disclosed in the present disclosure, and these changes or substitutions should be covered within the protection scope of the present disclosure. Therefore, the protection scope of the present disclosure should be subject to the protection scope of the claims.

What is claimed is:

1. A display panel, comprising: a base substrate, a plurality of light-emitting elements, a plurality of pixel circuits, and a plurality of conductive lines, wherein the base substrate has a first display region and a second display region, the first display region is located on at least one side of the second display region;

the plurality of light-emitting elements are located in the first display region and the second display region, the plurality of light-emitting elements comprise a plurality of groups of light-emitting elements, light-emitting elements in each group of the plurality of groups of light-emitting elements are arranged in a first direction, the plurality of groups of light-emitting elements are arranged in a second direction, at least one group of the plurality of groups of light-emitting elements comprises a plurality of first-region light-emitting elements and a plurality of second-region light-emitting elements, the plurality of first-region light-emitting elements are located in the first display region, and the plurality of second-region light-emitting elements are located in the second display region;

the plurality of pixel circuits are located in the first display region, the plurality of pixel circuits comprise a plurality of groups of pixel circuits, pixel circuits in each group of the plurality of groups of pixel circuits are arranged in the first direction, the plurality of groups of pixel circuits are arranged in the second direction, at least one group of the plurality of groups of pixel circuits comprises a plurality of first-type pixel circuits and a plurality of second-type pixel circuits, and the plurality of second-type pixel circuits are distributed at intervals among the plurality of first-type pixel circuits;

at least one first-type pixel circuit among the plurality of first-type pixel circuits is connected to at least one first-region light-emitting element among the plurality of first-region light-emitting elements, an orthographic projection of the at least one first-type pixel circuit on the base substrate at least partially overlaps with an orthographic projection of the at least one first-region light-emitting element on the base substrate, and at least one second-type pixel circuit among the plurality of second-type pixel circuits is connected to at least one second-region light-emitting element among the plurality of second-region light-emitting elements through at least one conductive line of the plurality of conductive lines;

the plurality of second-region light-emitting elements comprise a plurality of first light-emitting elements and a plurality of second light-emitting elements, each of the plurality of first light-emitting elements is configured to emit light of a first color, and each of the plurality of second light-emitting elements is configured to emit light of a second color, the plurality of second-type pixel circuits comprise a plurality of first pixel circuits and a plurality of second pixel circuits, the plurality of conductive lines comprise a plurality of first conductive lines and a plurality of second conductive lines, the plurality of first light-emitting elements are connected to the plurality of first pixel circuits through the plurality of first conductive lines, and the plurality of second light-emitting elements are connected to the plurality of second pixel circuits through the plurality of second conductive lines, in the at least one group of light-emitting elements and the at least one group of pixel circuits, the plurality of first pixel circuits connected to the plurality of first light-emitting elements are closer to the second display region than every second pixel circuit among the plurality of second pixel circuits connected to the plurality of second light-emitting elements, the display panel comprises a first transparent conductive pattern layer and a second transparent conductive pattern layer, at least one first conductive line among the plurality of first conductive lines is located in the second transparent conductive pattern layer, and at least one second conductive line among the plurality of second conductive lines is located in the first transparent conductive pattern layer.

2. The display panel according to claim 1, wherein the plurality of conductive lines are located between the plurality of light-emitting elements and the plurality of pixel circuits in a direction perpendicular to a main surface of the base substrate.

3. The display panel according to claim 1, wherein at least one second conductive line close to a center of the second display region spans at least two groups of light-emitting elements in the second direction, wherein the at least one second conductive line close to the center of the second display region comprises portions both in the first and second directions while extending from the second display region to the first display region.

4. The display panel according to claim 1,
wherein the plurality of second-region light-emitting elements further comprise a plurality of third light-emitting elements, each of the plurality of third light-emitting elements is configured to emit light of a third color,
the plurality of second-type pixel circuits further comprise a plurality of third pixel circuits, the plurality of conductive lines further comprise a plurality of third conductive lines, and the plurality of third light-emitting elements are connected to the plurality of third pixel circuits through the plurality of third conductive lines,
in the at least one group of light-emitting elements and the at least one group of pixel circuits, the plurality of first pixel circuits connected to the plurality of first conductive lines are closer to the second display region than every third pixel circuit among the plurality of third pixel circuits connected to the plurality of third conductive lines,
a part of the plurality of third conductive lines is located in the first transparent conductive pattern layer, and the other part of the plurality of third conductive lines is located in the second transparent conductive pattern layer.

5. The display panel according to claim 4, wherein at least one third conductive line close to a center of the second display region spans at least two groups of light-emitting elements in the second direction.

6. The display panel according to claim 5, wherein the at least one third conductive line close to the center of the second display region comprises portions both in the first and second directions while extending from the second display region to the first display region.

7. The display panel according to claim 4, wherein in the at least one group of light-emitting elements and the at least one group of pixel circuits, the plurality of first conductive lines connected to the at least one group of light-emitting elements are located on a first side of the at least one group of light-emitting elements, the plurality of second conductive lines and the plurality of third conductive lines connected to the at least one group of light-emitting elements are located on a second side of the at least one group of light-emitting elements, and the first side and the second side are opposite sides of the at least one group of light-emitting elements.

8. The display panel according to claim 4, wherein at least one group of the plurality of groups of pixel circuits comprises a dummy pixel circuit, the dummy pixel circuit is located between two second-type pixel circuits in the first direction, an orthographic projection of at least one of one second conductive line among the plurality of second conductive lines connected to a plurality of second light-emitting elements close to the center of the second display region and one third conductive line among the plurality of third conductive lines connected to a plurality of third light-emitting elements close to the center of the second display region on the base substrate overlaps with an orthographic projection of the dummy pixel circuit on the base substrate.

9. The display panel according to claim 8, further comprises a planarization layer, wherein each of the plurality of light-emitting elements comprises a first electrode, a second electrode, and a light-emitting functional layer between the first electrode and the second electrode, the first electrode is closer to the base substrate than the second electrode, the planarization layer is located between first electrodes of the plurality of light-emitting elements and the plurality of pixel circuits, and an orthographic projection of a via hole in the planarization layer on the base substrate does not overlap with the orthographic projection of the dummy pixel circuit on the base substrate.

10. The display panel according to claim 8, wherein each of the second conductive line connected to a second light-emitting element close to the center of the second display region and the third conductive line connected to a third light-emitting element close to the center of the second display region comprises a first part, a second part, a third part, and a fourth part that are connected in sequence, the second part and the fourth part extend in the first direction, and the first part and the third part extend in the second direction, wherein an orthographic projection of the third part on the base substrate overlaps with an orthographic projection of the dummy pixel circuit on the base substrate.

11. The display panel according to claim 10, wherein the fourth part and the second part are located on a same side of the third part, or the fourth part and the second part are located on two sides of the third part, respectively.

12. The display panel according to claim 4,
wherein the plurality of second-region light-emitting elements further comprise a plurality of fourth light-emitting elements, each of the plurality of fourth light-emitting elements is configured to emit light of a fourth color,
the plurality of second-type pixel circuits further comprise a plurality of fourth pixel circuits, the plurality of conductive lines further comprise a plurality of fourth conductive lines, and the plurality of fourth light-emitting elements are connected to the plurality of fourth pixel circuits through the plurality of fourth conductive lines,
in the at least one group of light-emitting elements and the at least one group of pixel circuits, the plurality of fourth pixel circuits connected to the plurality of fourth conductive lines are closer to the second display region than every second pixel circuit among the plurality of second pixel circuits connected to the plurality of second conductive lines.

13. The display panel according to claim 12,
wherein at least one group of the plurality of groups of light-emitting elements comprises a first sub-group of light-emitting elements in the second display region and a second sub-group of light-emitting elements in the second display region, the first sub-group of light-emitting elements in the second display region is closer to an edge of the second display region than the second sub-group of light-emitting elements in the second display region, or the second sub-group of light-emitting elements in the second display region is closer to a center of the second display region than the first sub-group of light-emitting elements in the second display region;

the at least one group of light-emitting elements comprises a first group of light-emitting elements, in the first group of light-emitting elements, the conductive lines connected to the second light-emitting element and the third light-emitting element in the first sub-group of light-emitting elements in the second display region are located in the first transparent conductive pattern layer, the conductive lines connected to the first light-emitting element and the fourth light-emitting element in the first sub-group of light-emitting elements in the second display region are all located in the second transparent conductive pattern layer; the conductive lines connected to the second light-emitting element and the third light-emitting element in the second sub-group of light-emitting elements in the second display region are all located in the first transparent conductive pattern layer, and the conductive lines connected to the first light-emitting element and the fourth light-emitting element in the second sub-group of light-emitting elements in the second display region are all located in the second transparent conductive pattern layer.

14. The display panel according to claim 10, wherein the at least one group of light-emitting elements comprises a second group of light-emitting elements, the second group of light-emitting elements is closer to the center of the second display region than the first group of light-emitting elements, in the second group of light-emitting elements, the conductive lines connected to the light-emitting elements in the first sub-group of light-emitting elements in the second display region are located in the first transparent conductive pattern layer, the conductive lines connected to the light-emitting elements in the second sub-group of light-emitting elements in the second display region are located in the second transparent conductive pattern layer.

15. The display panel according to claim 12, wherein each of the plurality of first conductive lines is a conductive line with an integral structure, and each of the plurality of second conductive lines is a conductive line with an integral structure, each of the plurality of third conductive lines is a conductive line with an integral structure, each of the plurality of fourth conductive lines is a conductive line with an integral structure.

16. The display panel according to claim 1, wherein the first transparent conductive pattern layer is closer to the base substrate than the second transparent conductive pattern layer, or the second transparent conductive pattern layer is closer to the base substrate than the first transparent conductive pattern layer.

17. The display panel according to claim 1, wherein an orthographic projection of a part of each of the plurality of first conductive lines extending in the first direction on the base substrate does not overlap with an orthographic projection of a part of each of the plurality of second conductive lines extending in the first direction on the base substrate.

18. The display panel according to claim 1, wherein a part of the plurality of first conductive lines is located in the second transparent conductive pattern layer, the other part of the plurality of first conductive lines is located in the first transparent conductive pattern layer;

a part of the plurality of second conductive lines is located in the second transparent conductive pattern layer, and the other part of the plurality of second conductive lines is located in the first transparent conductive pattern layer.

19. The display panel according to claim 1, wherein the display panel only comprises the first transparent conductive pattern layer and the second transparent conductive pattern layer for forming the plurality of conductive lines.

20. A display device, comprising the display panel according to claim 1.

* * * * *